United States Patent
Kato et al.

(10) Patent No.: US 8,992,685 B2
(45) Date of Patent: Mar. 31, 2015

(54) SUBSTRATE PROCESSING APPARATUS, SUBSTRATE PROCESSING METHOD, AND COMPUTER-READABLE STORAGE MEDIUM

(75) Inventors: Hitoshi Kato, Iwate (JP); Manabu Honma, Iwate (JP); Hiroyuki Kikuchi, Iwate (JP); Yu Wamura, Iwate (JP); Jun Ogawa, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 865 days.

(21) Appl. No.: 12/753,978

(22) Filed: Apr. 5, 2010

(65) Prior Publication Data

US 2010/0260936 A1 Oct. 14, 2010

(30) Foreign Application Priority Data

Apr. 9, 2009 (JP) ................................. 2009-095213

(51) Int. Cl.
*C23C 16/00* (2006.01)
*H01L 21/67* (2006.01)
*H01L 21/687* (2006.01)
*C23C 16/54* (2006.01)
*C23C 16/52* (2006.01)

(52) U.S. Cl.
CPC .......... *H01L 21/67207* (2013.01); *C23C 16/54* (2013.01); *C23C 16/52* (2013.01); *H01L 21/67109* (2013.01); *H01L 21/6719* (2013.01); *H01L 21/68764* (2013.01); *H01L 21/68771* (2013.01)
USPC ...................................................... 118/719

(58) Field of Classification Search
USPC ....................................................... 118/719
See application file for complete search history.

(56) References Cited

U.S. PATENT DOCUMENTS

| | | | |
|---|---|---|---|
| 5,314,724 A | 5/1994 | Tsukune et al. | |
| 6,395,094 B1 * | 5/2002 | Tanaka et al. | 118/719 |
| 6,634,314 B2 | 10/2003 | Hwang et al. | |
| 7,128,803 B2 * | 10/2006 | Owczarz et al. | 156/345.13 |
| 7,153,542 B2 | 12/2006 | Nguyen et al. | |
| 2006/0073276 A1 * | 4/2006 | Antonissen | 427/248.1 |
| 2007/0218701 A1 | 9/2007 | Shimizu et al. | |
| 2007/0218702 A1 | 9/2007 | Shimizu et al. | |
| 2007/0289534 A1 | 12/2007 | Lubomirsky et al. | |

FOREIGN PATENT DOCUMENTS

| | | |
|---|---|---|
| JP | 04-287912 | 10/1992 |
| JP | 05-152238 | 6/1993 |
| JP | 3144664 | 3/2001 |
| JP | 2001-254181 | 9/2001 |
| JP | 2006-269621 | 10/2006 |
| JP | 2007-247066 | 9/2007 |
| TW | 200809927 | 2/2008 |

\* cited by examiner

*Primary Examiner* — Karla Moore
(74) *Attorney, Agent, or Firm* — IPUSA, PLLC

(57) ABSTRACT

In a substrate processing apparatus, a film deposition device and a heat processing device to perform an anneal processing are airtightly connected to a vacuum conveying chamber, and a substrate rotating unit to cause a substrate to rotate around a vertical axis is provided in the vacuum conveying chamber. A control unit is arranged to stop a relative rotation of a plurality of reactive gas supplying units, a separating gas supplying unit and a table by a rotation device in the middle of a film deposition process of the substrate, cause a conveying unit to take out the substrate from a vacuum chamber, and output a control signal that causes a substrate rotating unit to change a direction of the substrate.

15 Claims, 33 Drawing Sheets

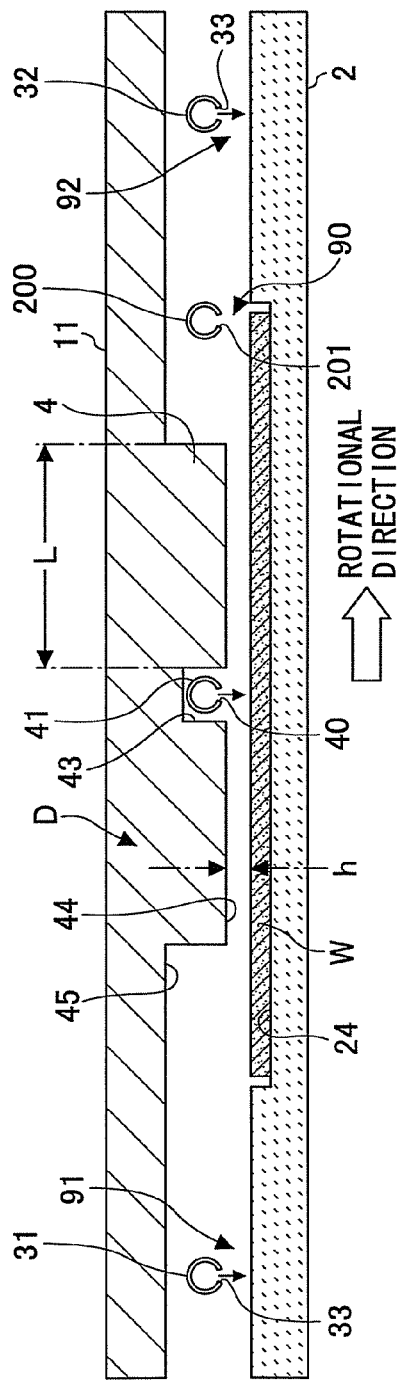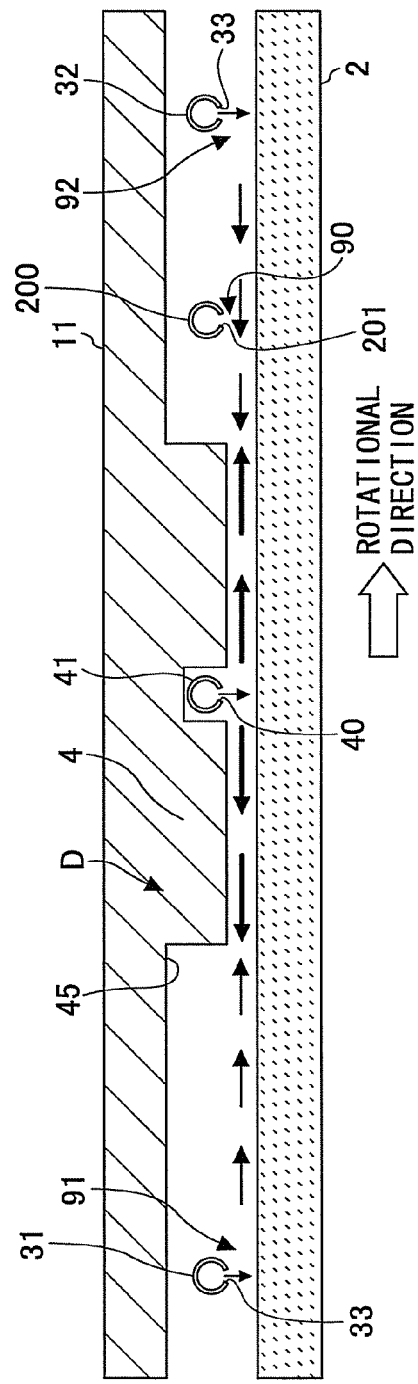

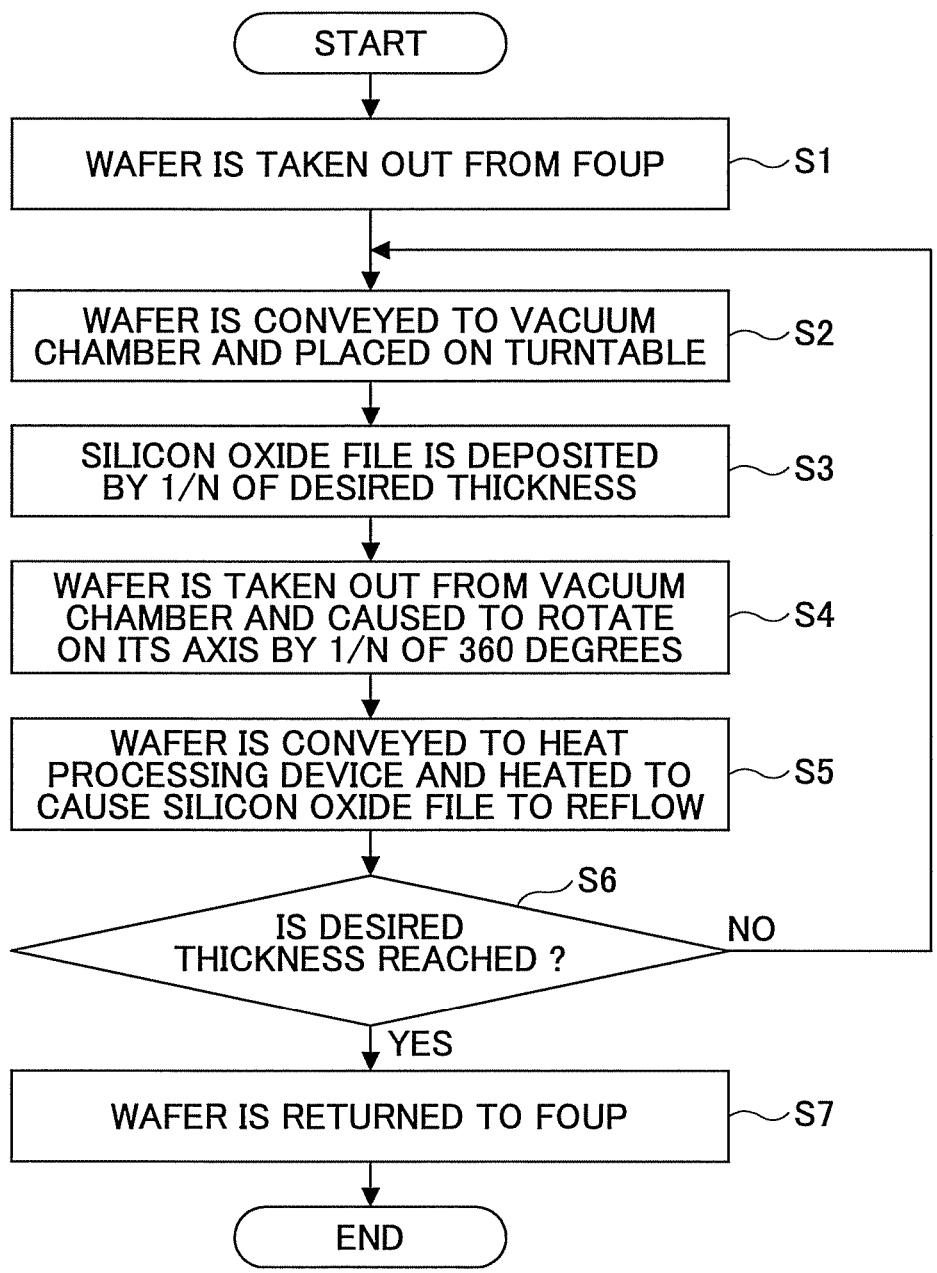

SUBSTRATE PROCESSING APPARATUS, SUBSTRATE PROCESSING METHOD, AND COMPUTER-READABLE STORAGE MEDIUM

CROSS-REFERENCE TO RELATED APPLICATION

This application is based upon and claims the benefit of priority of Japanese patent application No. 2009-095213, filed on Apr. 9, 2009, the entire contents of which are incorporated by reference in their entirety.

BACKGROUND OF THE INVENTION

1. Field of the Invention

This invention relates to a substrate processing apparatus, a substrate processing method, and a computer-readable storage medium which are adapted to laminate layers of resultants of mutually reactive gases to form a thin film on a substrate by performing a gas supply cycle which supplies the reactive gases sequentially to a surface of the substrate in a vacuum chamber.

2. Description of the Related Art

As a film deposition technique in a semiconductor fabrication process, a technique of forming a thin film is known which sequentially supplies at least two kinds of mutually reactive gas in a vacuum pressure atmosphere to a semiconductor wafer (also called a wafer) which is a substrate. Specifically, in this film deposition technique, a first reactive gas is supplied to and adsorbed by the surface of a wafer and subsequently a second reactive gas is supplied thereto, so that one or more atomic or molecular layers are formed on the wafer surface through the reaction of the two reactive gases. This gas supplying cycle is repeated multiple times (for example, several hundreds times). Such layers are laminated together to form a multi-layered thin layer on the surface of the wafer. This process is known as an atomic layer deposition (ALD) or a molecular layer deposition (MLD).

The above-described film deposition technique is advantageous over the conventional CVD (chemical vapor deposition) technique in that the film thickness can be controlled at a higher level of accuracy by the number of times of the gas supplying cycle and an excellent uniformity of the film within the surface can be attained, which is useful for the fabrication of semiconductor devices with a smaller film thickness.

Several devices which are arranged to perform the above-described film deposition process have been proposed as in Patent Documents 1 to 8 listed below. A description will now be given of a film deposition device of a typical type.

In a vacuum chamber of the film deposition device of the typical type, a turntable on which two or more wafers are mounted in a circumferential direction (a rotational direction) is arranged, and two or more gas supplying units to supply the first and second reactive gases to the wafers are arranged in the upper portions of the vacuum chamber to face the turntable.

The wafers are placed on the turntable, an internal pressure of the vacuum chamber is reduced to a predetermined processing pressure, and the wafers are heated and simultaneously the turntable and the gas supplying units are rotated relative to each other around a vertical axis. Moreover, the first reactive gas and the second reactive gas from the gas supplying units are supplied to the surface of each wafer respectively.

By arranging the separating walls between the gas supplying units or by blowing inert gas to provide an air curtain, the vacuum chamber is divided into a processing area formed with the first reactive gas and a processing area formed with the second reactive gas.

In this manner, the two or more reactive gases are simultaneously supplied to the vacuum chamber, and the processing areas are separated from each other to prevent the mixing of the first and second reactive gases on the wafers. The first reactive gas and the second reactive gas are sequentially supplied through the separating walls or the air curtain to each wafer on the turntable. Therefore, it is not necessary to replace the atmosphere in the vacuum chamber each time the kind of the reactive gas supplied to the vacuum chamber is changed. One of the reactive gases supplied to the wafer can be switched to the other quickly. The film deposition process can be performed by the above-described film deposition device speedily.

In the above-described film deposition device, a gas flow takes place on the wafer surface by a gas flow produced when the turntable and the gas supplying unit are rotated relative to each other in combination with a gas flow determined by the positional relationship between the gas supplying unit and the exhaust opening. In addition, the circumferential speed of the gas flow during the relative rotation of the turntable and the gas supplying unit varies depending on the position in the radial direction of the turntable. The uniformity of the gas flow in the surface of the wafer is lower than that in the normal vacuum processing unit of the single wafer type. Hence, although the ALD can inherently provide excellent uniformity of the film thickness in the surface, the above-described film deposition device may not be able to demonstrate the advantageous feature thereof sufficiently.

Moreover, with the use of minute patterns of semiconductor devices, good characteristics of the film for the embedding in the recesses as the patterns are demanded. For this reason, the approach to making the thin film flow is known which is arranged to perform, when the aspect ratio of a recess is high, an anneal processing after the thin film is formed by the CVD (Chemical Vapor Deposition) method and the recess is embedded therein, in order to fill the cavity internally formed therein.

However, in this approach, the anneal processing is performed after the thin film is formed and the recess is filled. In order to fill the cavity internally formed in the recess, a high heating temperature and a long processing time are needed. This process may result in a lowering of the throughput, and there may be a probability that a severe thermal history be given to the device structure which is already formed.

When the ALD method is performed, good embedding characteristics are provided inherently, but because the thin film is precise, it is difficult to obtain the fluidity of the thin film by the anneal processing. When the aspect ratio of the recess is high, or when the cross-section of the recess is in a reverse-tapered shape, the performance of the ALD method may produce a cavity in the embedded portion. In such cases, even if the anneal processing is performed, it is difficult to make the thin film flow. As a result, there is a probability that good embedding characteristics cannot be provided.

In addition, when performing the ALD method, it is necessary to efficiently reduce the impurities (such as organic substances) included in the thin film.

Patent Document 9 listed below discloses a method in which plural wafers are arranged in the circumferential direction on a disc, a rotary arm which supports the disc is rotated around its axis, and an ion beam is injected to each wafer on the disc during the rotation of the rotary arm in order to form a source area and a drain area on the surface of each wafer.

One fourth of the total amount of the ion beam injected is given to each wafer, and the wafer is rotated in the circumferential direction by 90 degrees. Subsequently, one fourth of the total amount of the ion beam injected is given again, and the wafer is further rotated in the circumferential direction by 90 degrees. While the wafer is rotated by 360 degrees, the total amount of the ion beam injected is given.

According to this method, ions can be uniformly injected to the transistors which are arrayed in various directions relative to the direction of the reciprocating linear movement of the disc. However, Patent Document 9 does not take into consideration the above-described problems of the film deposition device which is arranged to perform the ALD method.

Patent Document 10 listed below discloses a method in which, when forming a SiO2 insulation film by performing the ALD method, a Si source gas is supplied, then an ozone gas is supplied, and further a steam gas is supplied. However, Patent Document 10 does not take into consideration the above-described problems of the film deposition device which is arranged to perform the ALD method.

Patent Document 1: U.S. Pat. No. 6,634,314
Patent Document 2: Japanese Laid-Open Patent Publication No. 2001-254181
Patent Document 3: Japanese Patent No. 3144664
Patent Document 4: Japanese Laid-Open Patent Publication No. 04-287912
Patent Document 5: U.S. Pat. No. 7,153,542
Patent Document 6: Japanese Laid-Open Patent Publication No. 2007-247066
Patent Document 7: United States Patent Application Publication No. 2007/0218701
Patent Document 8: United States Patent Application Publication No. 2007/0218702
Patent Document 9: Japanese Laid-Open Patent Publication No. 05-152238
Patent Document 10: Japanese Laid-Open Patent Publication No. 2006-269621

SUMMARY OF THE INVENTION

In one aspect of the invention, the present disclosure provides a substrate processing apparatus and a substrate processing method which are adapted to rotate a substrate around the axis of a turntable relative to the gas supplying units, and attain, when depositing a thin film on a surface of the substrate by sequentially supplying two or more mutually reactive gases to the substrate, excellent unifoimity of the film thickness in the surface and good quality of the film.

In another aspect of the invention, the present disclosure provides a film deposition device which laminates layers of resultants of at least two kinds of mutually reactive gases and forms a thin film on a surface of a substrate by performing a gas supply cycle to supply sequentially the reactive gases to the surface of the substrate in a vacuum chamber, the substrate processing apparatus including: a film deposition device to perform a film deposition process of the substrate; a vacuum conveying chamber airtightly connected to the film deposition device; a conveying unit disposed in the vacuum conveying chamber to convey the substrate between the film deposition device and the vacuum conveying chamber; a heat processing device including a processing container airtightly connected to the vacuum conveying chamber and including a substrate mounting base provided therein and a unit to perform heat processing of the substrate on the mounting base; a substrate rotating unit arranged in the vacuum conveying chamber or the heat processing device to cause the substrate on the conveying unit to rotate around a vertical axis of the substrate; and a control unit to output a control signal so that a film deposition process of the substrate is carried out, the film deposition device including: a table arranged in the vacuum chamber; a plurality of reactive gas supplying units arranged to face an upper surface of the table and mutually separated in a circumferential direction of the table to supply the reactive gases to the surface of the substrate respectively; a separating gas supplying unit to supply a separating gas; an isolation area disposed between a plurality of processing areas to which the reactive gases are respectively supplied from the plurality of reactive gas supplying units, the separating gas being supplied from the separating gas supplying unit to the isolation area so that atmospheres of the plurality of processing areas are divided by the separating gas in the isolation area; a rotation device to rotate the plurality of reactive gas supplying units, the separating gas supplying unit and the table relative to each other around a vertical axis of the table; a substrate mounting area arranged in the table along a direction of rotation of the rotation device so that the substrate located in the substrate mounting area is moved sequentially to the plurality of processing areas and the isolation area by the rotation of the rotation device; and an evacuation unit to perform evacuation of the inside of the vacuum chamber, wherein the control unit is arranged to stop the relative rotation of the plurality of reactive gas supplying units, the separating gas supplying unit and the table by the rotation device in the middle of the film deposition process, cause the conveying unit to take out the substrate from the vacuum chamber, and output a control signal that causes the substrate rotating unit to change a direction of the substrate.

In another aspect of the invention, the present disclosure provides a substrate processing method which laminates layers of resultants of at least two kinds of mutually reactive gases and forms a thin film on a surface of a substrate by performing a gas supply cycle to supply sequentially the reactive gases to the surface of the substrate in a vacuum chamber of a film deposition device by using a substrate processing apparatus, the substrate processing method including: placing the substrate in a substrate mounting area of a table arranged in the vacuum chamber; supplying, by a plurality of reactive gas supplying units of the film deposition device, the reactive gases respectively to a surface of the substrate in the substrate mounting area of the table, the plurality of reactive gas supplying units being arranged to face an upper surface of the table and mutually separated in a circumferential direction of the table; supplying, by a separating gas supplying unit of the film deposition device, a separating gas to an isolation area to divide atmospheres of a plurality of processing areas to which the reactive gases are respectively supplied from the plurality of reactive gas supplying units and prevent the reactive gases from entering the isolation area, the isolation area being disposed between the plurality of processing areas; rotating, by a rotation device of the film deposition device, the plurality of reactive gas supplying units, the separating gas supplying unit and the table relative to each other around a vertical axis of the table; performing, by the film deposition device, a film deposition process of the substrate so that the substrate located in the substrate mounting area is moved sequentially to the plurality of processing areas and the isolation area by the rotation of the rotation device; stopping, by a control unit of the substrate processing apparatus, the relative rotation of the plurality of reactive gas supplying units, the separating gas supplying unit and the table by the rotation device in the middle of the film deposition process; taking out, by a conveying unit of the substrate processing apparatus, the substrate from the film deposition device; causing, by a substrate rotating unit of the substrate processing apparatus, the substrate to rotate around a vertical axis of the substrate so that a direction of the substrate is changed; and conveying, by a conveying unit of the substrate processing apparatus, the substrate, taken out from the film deposition device after the direction of the substrate is changed, to a heat processing device of the substrate processing apparatus so that heat processing of the substrate is performed by the heat processing device.

The aspects and advantages of the invention will be realized and attained by means of the elements and combinations particularly pointed out in the claims. It is to be understood that both the foregoing general description and the following detailed description are exemplary and explanatory and are not restrictive of the invention as claimed.

BRIEF DESCRIPTION OF THE DRAWINGS

FIG. 7A and FIG. 7B are diagrams illustrating processing areas and isolation areas in the film deposition device.

FIG. 14 is a flowchart for explaining the film deposition process performed by the substrate processing apparatus.

DETAILED DESCRIPTION OF PREFERRED EMBODIMENTS

A description will be given of embodiments of the invention with reference to the accompanying drawings.

Figure 1:
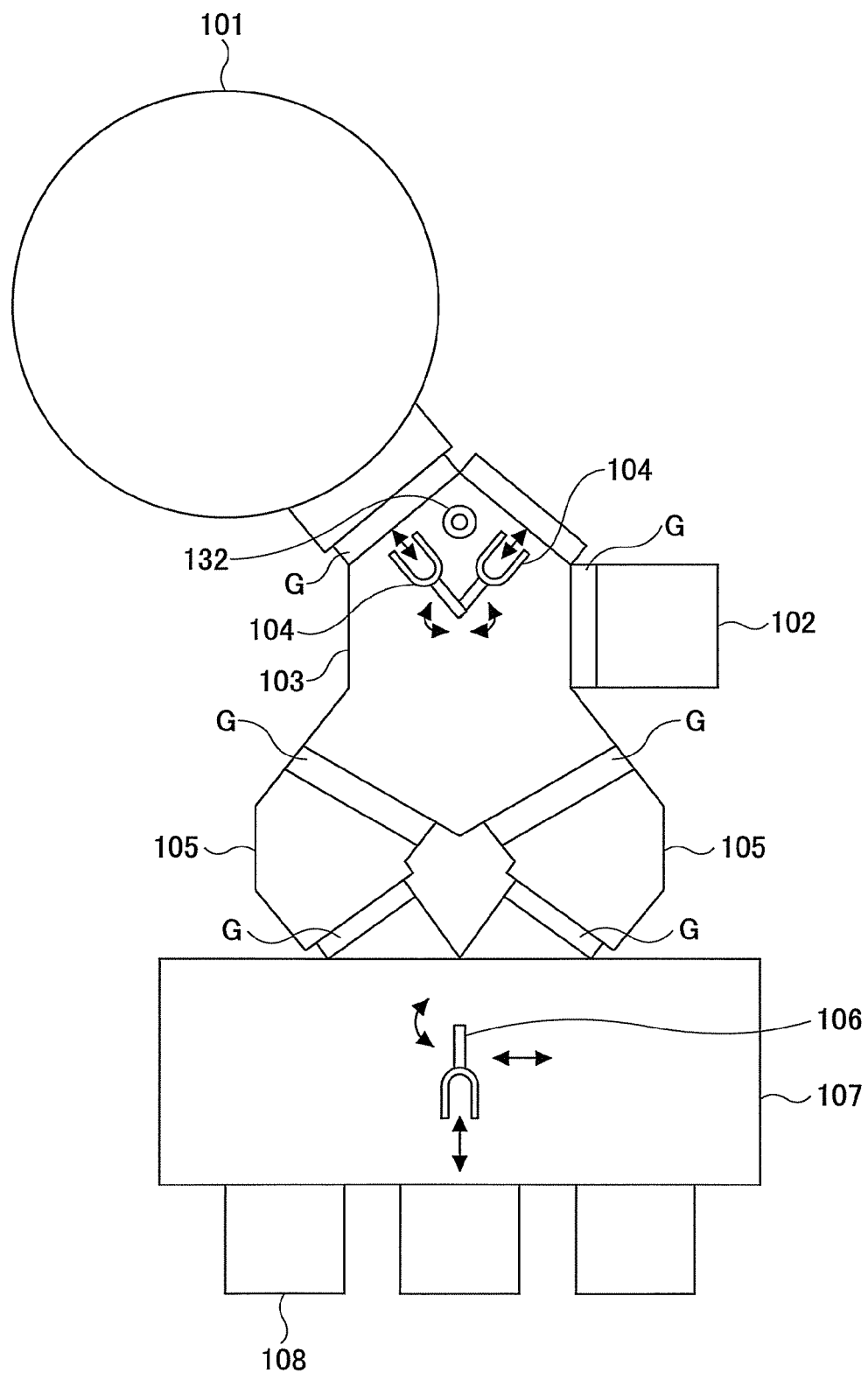
FIG. 1 is a plan view illustrating the composition of a substrate processing apparatus of an embodiment of the invention.

FIG. 1 illustrates the composition of a substrate processing apparatus of a first embodiment of the invention. The substrate processing apparatus of this embodiment includes a film deposition device 101 for performing a film deposition process of a substrate W (which is, for example, a semiconductor wafer, also called a wafer W) to form thereon a thin film which is made of at least a silicon oxide, a heat processing device 102 for performing an anneal processing (or heat processing) to the wafer W, and a vacuum conveying chamber 103 which is airtightly connected between the film deposition device 101 and the heat processing device 102.

A conveyance opening 15 for delivering the wafer W is formed in the surface of a wall between the film deposition device 101 and the heat processing device 102, which will be described later. Through an exhaust passage in which a pressure regulation part which is constituted by, for example, a butterfly valve is arranged, the inside of the vacuum conveying chamber 103 is maintained to a predetermined vacuum pressure by using a vacuum pump (not illustrated).

In the vacuum conveying chamber 103, two vacuum conveyance arms 104, each of which constitutes a conveying unit to deliver the wafer W, are arranged. Each vacuum conveyance arm 104 is arranged so that the vacuum conveyance arm 104 is rotatable around a vertical axis to hold the wafer W horizontally and can deliver the wafer W in a forward or backward direction relative to each of the film deposition device 101, the heat processing device 102, and a load lock chamber 105 (which will be described later).

Figure 2:
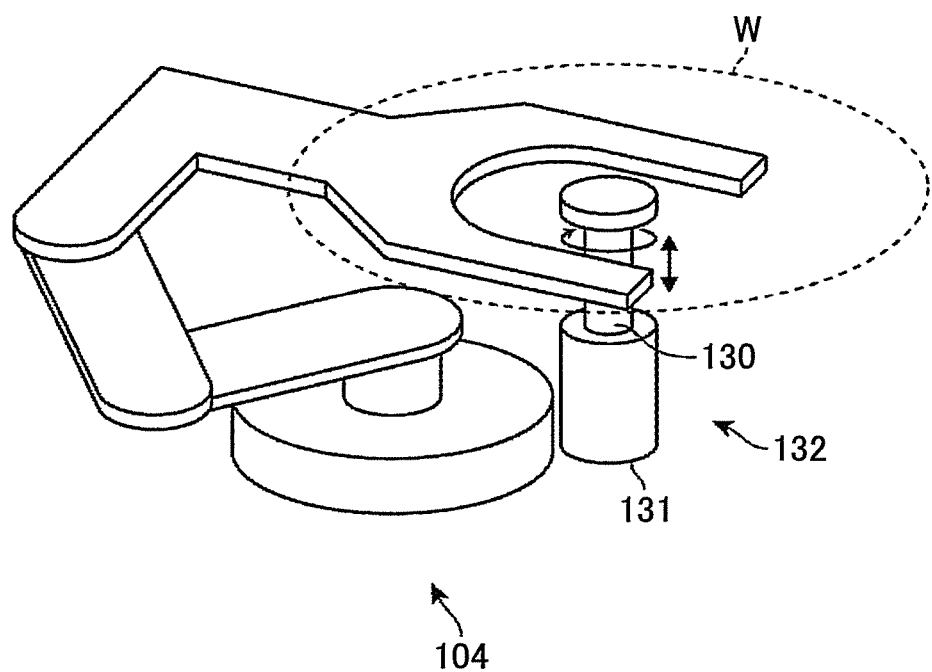
FIG. 2 is an enlarged perspective view of a portion of the substrate processing apparatus of the present embodiment.

As illustrated in FIG. 2, a substrate rotating unit 132 including a lifting shaft 130 and an actuator 131 is arranged at a position in the vacuum conveying chamber 103 adjacent to the film deposition device 101, which the two vacuum conveyance arms 104 can access (for example, at an intermediate position between the two vacuum conveyance arms 104). The lifting shaft 130 is to lift the wafer W, held by the vacuum conveyance arm 104, from the back surface of the wafer and to rotate the wafer around a vertical axis. The actuator 131 is to rotate the bottom of the lifting shaft 130 around a vertical axis and lift the bottom of the lifting shaft 130 vertically. The substrate rotating unit 132 is arranged to change the direction of the wafer W in the middle of a film deposition process by the film deposition device 101 and allow the film deposition process to be continued subsequently, which will be described later.

The vacuum conveyance arms 104 are illustrated in a simplified manner in FIG. 1. For the sake of convenience, only one vacuum conveyance arm 104 is illustrated in FIG. 2.

An air conveying chamber 107 is connected to the sidewalls of the vacuum conveying chamber 103 through the two load lock chambers (reserve vacuum chambers) 105 the atmosphere of which can be changed to one of the air atmosphere and the vacuum pressure atmosphere. In the air conveying chamber 107, an air conveyance aim 106 is arranged. The air conveyance aim 106 is arranged so that the air conveyance aim 106 is rotatable around a vertical axis, movable up and down, and movable horizontally along the line in which the two load lock chambers 105 are arrayed. In FIG. 1, reference numeral 108 indicates the conveying container (FOUP) in which, for example, 25 wafers W may be accommodated. The wafer W is taken out from the conveying container 108 by the air conveyance arm 106 and delivered to the air conveying chamber 107, and the wafer W is conveyed via the load lock chamber 105 and the vacuum conveying chamber 103 to the film deposition device 101 and the heat processing device 102 by the vacuum conveyance arm 104. In FIG. 1, reference character G indicates a gate valve.

Next, the composition of the heat processing device 102 will be described.

Figure 3:
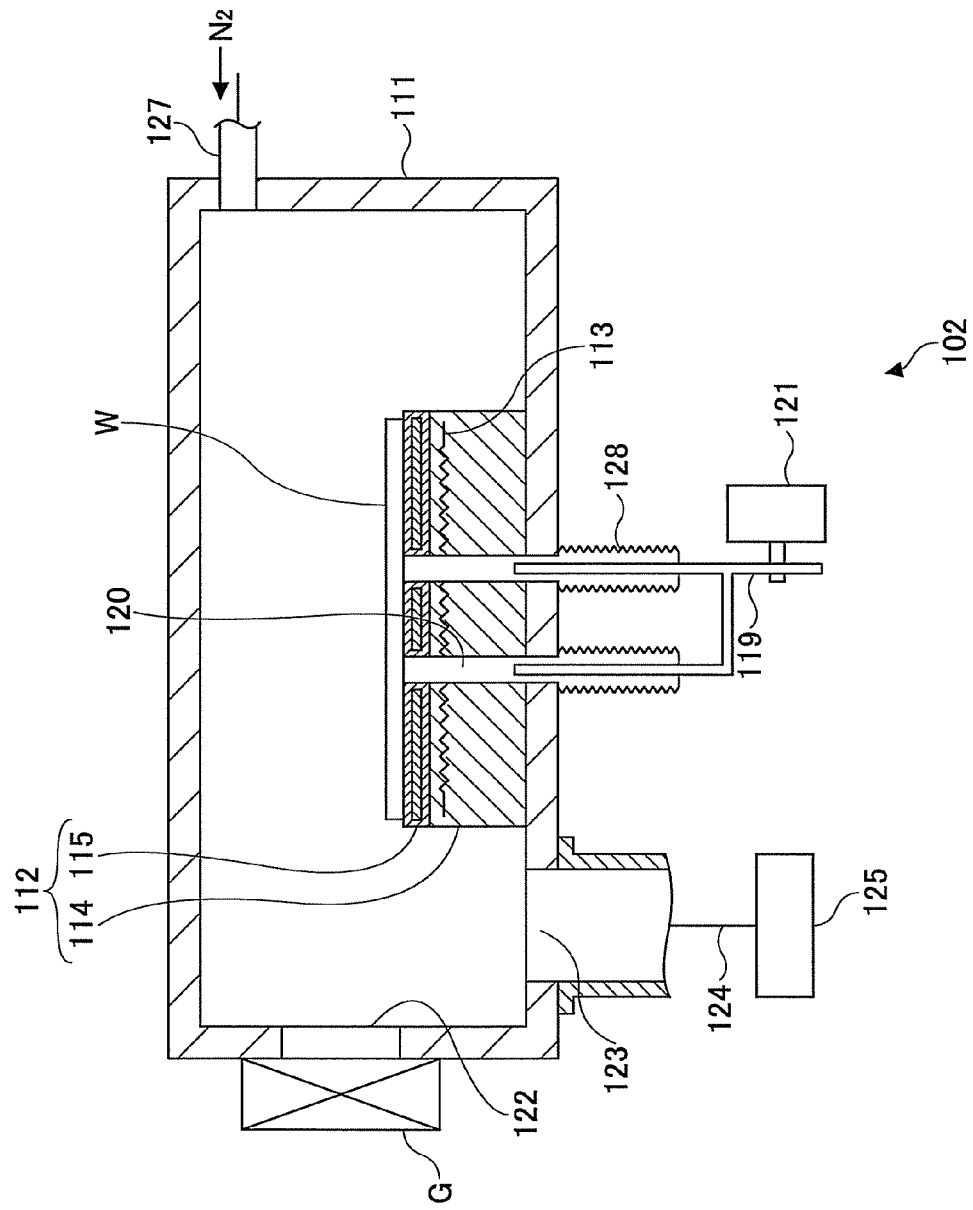
FIG. 3 is a cross-sectional view illustrating the composition of a heat processing device which is connected to the substrate processing apparatus of the present embodiment.

As illustrated in FIG. 3, the heat processing device 102 includes a processing container 111 and a substrate mounting base 112 arranged in the processing container 111. The substrate mounting base 112 includes a supporting base 114 in which a heating unit 113 (for example, a heater) for heating the wafer W in a range of 100 degrees C.-450 degrees C. (preferably, at 350 degrees C.), and an electrostatic chuck 115 disposed on the supporting base 114. In the inside of the substrate mounting base 112, a lifting unit 119 (for example, three lifting pins) for lifting the back surface of the wafer W is arranged. A lifting actuator 121 which supports the lower part of the lifting pins 119 and drives the movement of the lifting pins 119 is connected to the lifting pins 119. Through holes 120 which the lifting pins 119 pass through are formed in the inside of the mounting base 112. When the lifting pins 119 are lifted by the lifting actuator 121, the wafer W may be delivered through the vacuum conveyance arm 104 and the lifting pins 119. In FIG. 3, reference numeral 128 indicate bellows which are attached to connect the lifting pin 119 to the bottom of the processing container 111 airtightly.

An exhaust port 123 is formed in the floor surface in the circumference of the mounting base 112. An evacuation unit 125 (such as a vacuum pump) is connected to an exhaust pipe 124 extended from the exhaust port 123 through a pressure regulation unit (not illustrated), such as a butterfly valve. A gas supplying passage 127 for supplying inert gas (for example, N2 (nitrogen) gas) to the processing container 111 is connected to the sidewall of the processing container 111. The inert gas may be supplied to the processing container 111 when performing heat processing of the wafer W (which will be described later). In FIG. 3, reference numeral 122 indicates a conveyance opening.

Next, the composition of the film deposition device 101 will be described.

Figure 4:
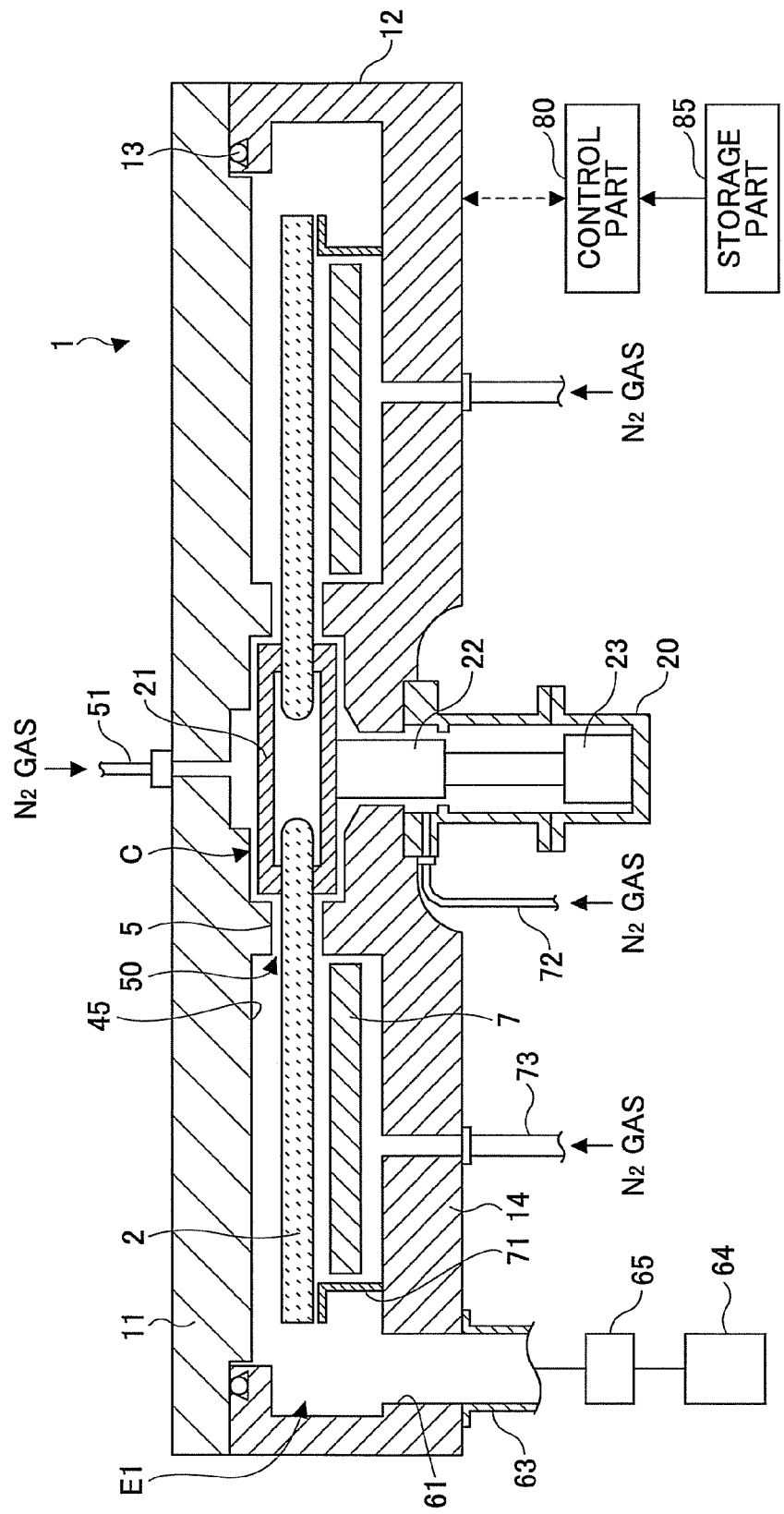
FIG. 4 is a cross-sectional view illustrating the composition of a film deposition device in the substrate processing apparatus of the present embodiment.
Figure 5:
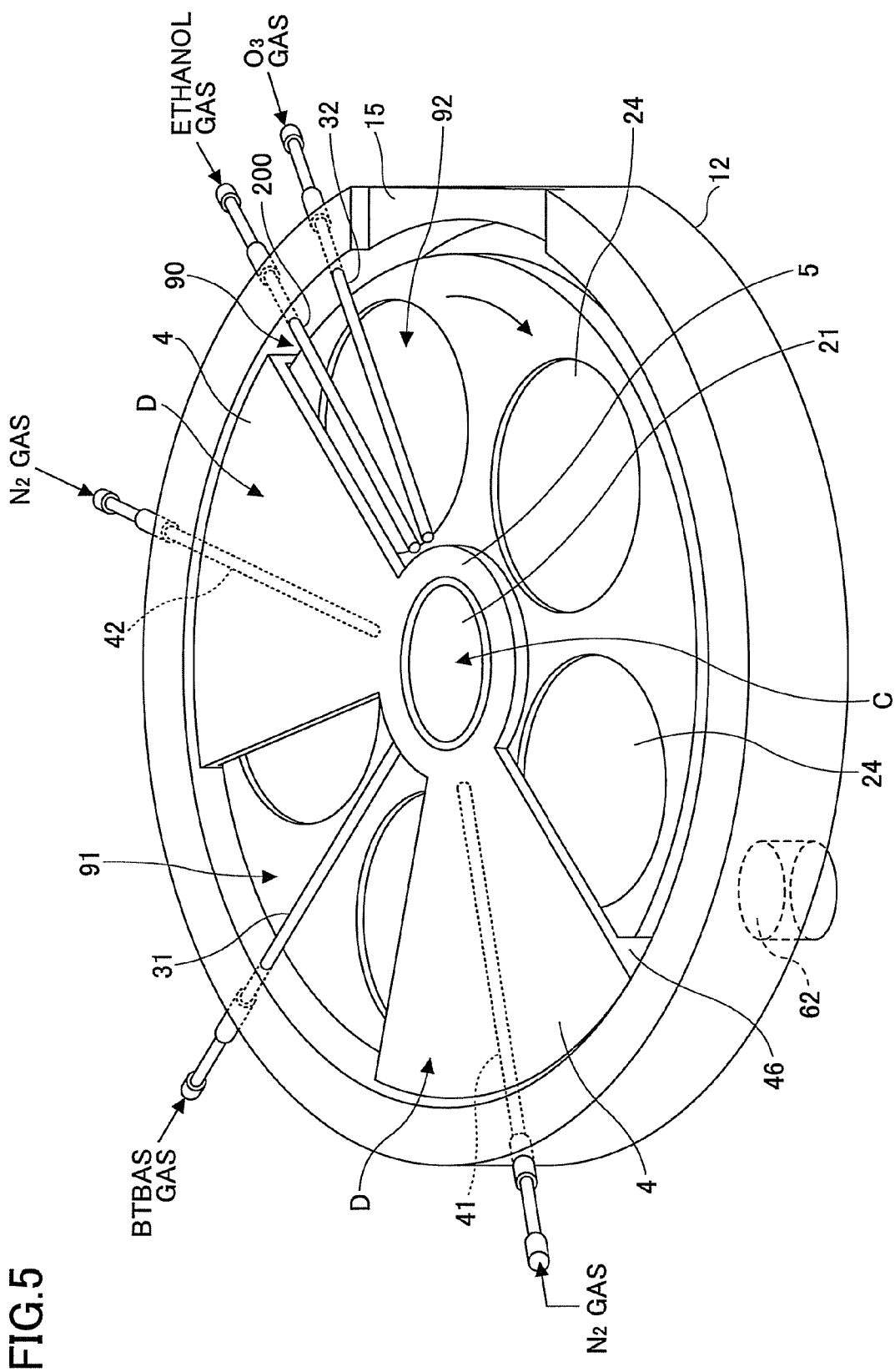
FIG. 5 is a perspective view illustrating the internal composition of the film deposition device.
Figure 6:
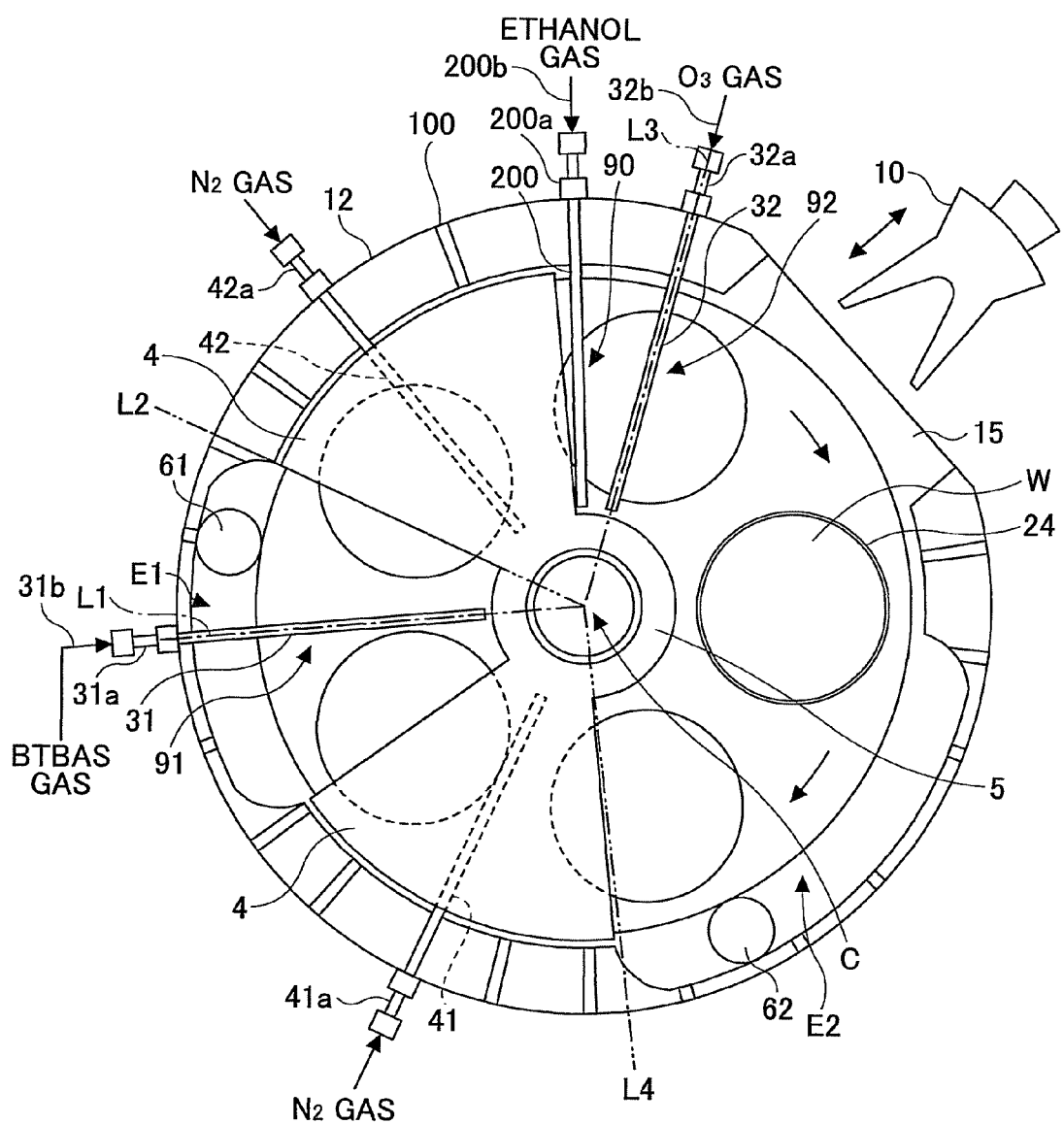
FIG. 6 is a horizontal cross-sectional view of the film deposition device.

As illustrated in FIGS. 4 to 6, the film deposition device 101 includes a flat, circular vacuum chamber 1 (having a generally circular horizontal cross-section), and a turntable 2 disposed in the vacuum chamber 1 and having its rotational axis at the center of the vacuum chamber 1.

The vacuum chamber 1 includes a cup-like container body 12 which accommodates the turntable 2, and a disc-shaped top plate 11 which fills the opening of the top surface of the container body 12 airtightly. The top plate 11 is airtightly connected to the container body 12 via a ring-like sealing member 13 (for example, an O ring). The sealing member 13 is disposed to seal the peripheral edge of the top surface of the container body 12. The top plate 11 is arranged so that the top plate 11 may be lifted vertically by an opening/closing device (not illustrated) to open or close the opening of the top surface of the container body 12.

The turntable 2 is fixed to a cylindrical core part 21 at its central part. The core part 21 is fixed to the upper end of a rotating shaft 22 which extends in a vertical direction. The rotating shaft 22 passes through the base part 14 of the vacuum chamber 1. The lower end of the rotating shaft 22 is attached to the actuator 23 which is a rotation device which rotates the rotating shaft 22 clockwise around a vertical axis in this embodiment.

The rotating shaft 22 and the actuator 23 are accommodated in the cylindrical case body 20 in which the upper surface of the case body 20 is open. The flange part formed in the upper surface of a case body 20 is airtightly attached to the underside of the base part 14 of the vacuum chamber 1, and the airtight state of the internal atmosphere of the case body 20 is maintained to the external atmosphere.

As illustrated in FIGS. 5 and 6, plural circular recesses 24 for placing plural wafers W which are plural substrates (five substrates in the illustrated example) are formed in the surface part of the turntable 2 along the direction of rotation (the circumferential direction). Each recess 24 is arranged so that it is rotated around a vertical axis on the center of rotation of the turntable 2 by the rotation of the turntable 2. For the sake of convenience, only one wafer W placed in one recess 24 is illustrated in FIG. 6.

FIGS. 7A and 7B are diagrams illustrating processing areas and isolation areas in the film deposition device of the present embodiment. As illustrated in FIG. 7A, the recess 24 is formed so that, when the wafer W is placed into the recess 24, the surface of the wafer is flush with the surface of the turntable 2 (the area where the wafer is not arranged). The pressure fluctuations produced due to the difference in the height between the surface of the wafer W and the surface of the turntable 2 can be suppressed and the uniformity of thickness within the surface of the deposited film can be attained. On the base part of the recess 24, through holes (not illustrated) are formed through which three lifting pins (refer to FIG. 9) penetrate. These lifting pins are used to support the bottom surface of the wafer W and move the wafer W up and down.

The recess 24 is provided to position the wafer W and prevent the wafer W from jumping out due to the centrifugal force produced by the rotation of the turntable 2. The recess 24 corresponds to the substrate mounting area in the claims. Alternatively, the substrate mounting area (wafer mounting area) may be a set of guide members disposed along the circumferential direction of the wafer W to guide the periphery of the wafer W to the surface of the turntable 2. As another alternative, when a chuck device, such as an electrostatic chuck, is provided on the turntable 2 to attract the wafer W, the area in which the wafer W is placed by the attraction may correspond to the substrate mounting area in the claims.

Figure 8:
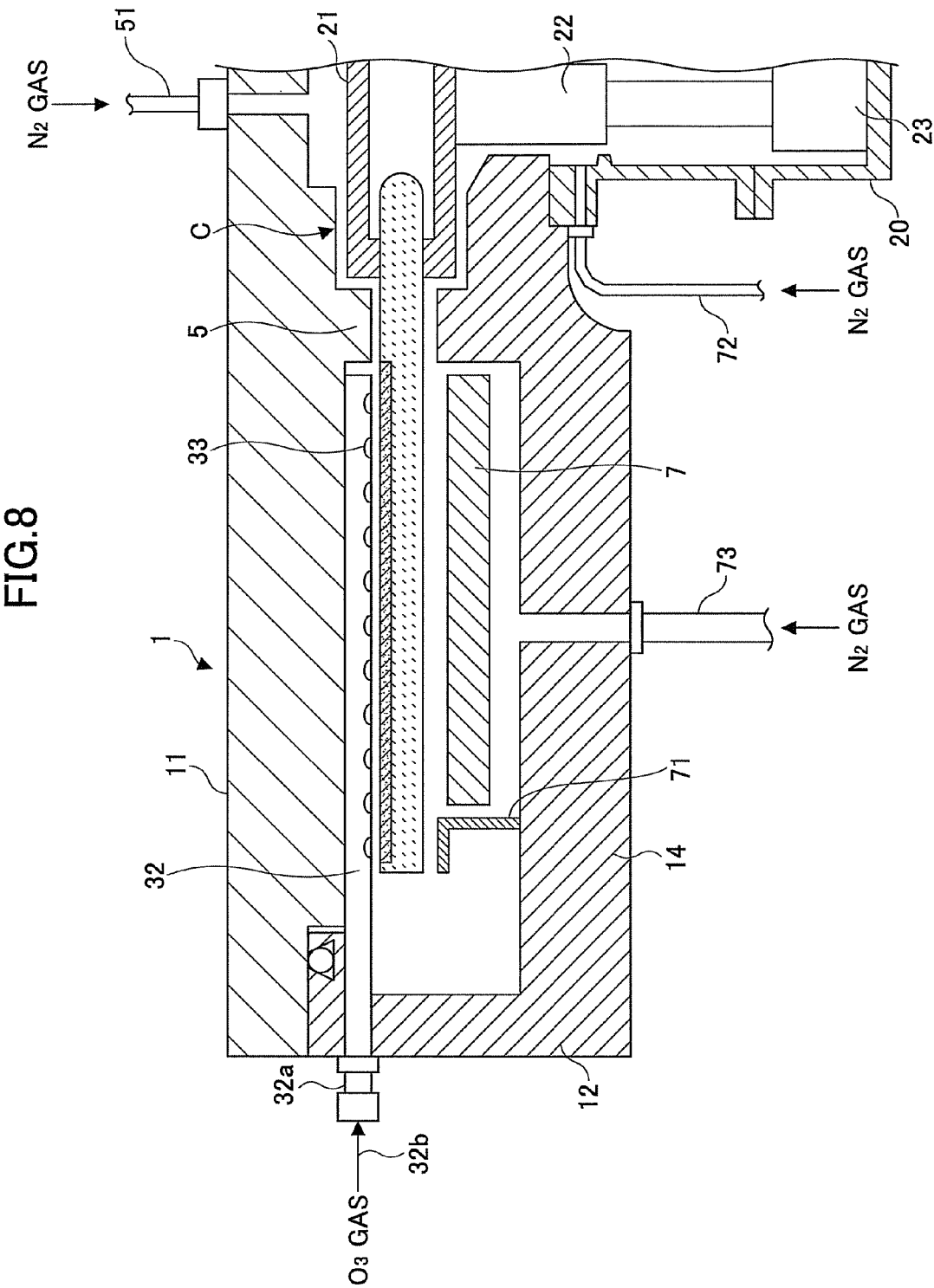
FIG. 8 is an enlarged cross-sectional view of the film deposition device.

As illustrated in FIGS. 5, 6 and 8, in order to respectively supply the first reactive gas (BTBAS gas), the second reactive gas ($O_3$ gas), the separating gas ($N_2$ gas), and the auxiliary gas (ethanol gas) to the substrate mounting area of the recess 24 in the turntable 2, a first reactive gas nozzle 31 (a first reactive gas supplying unit) and a second reactive gas nozzle 32 (a second reactive gas supplying unit), which are each made of quartz, two separating gas nozzles 41 and 42 (separating gas supplying units), and an auxiliary gas nozzle 200 are arranged in the vacuum container 1 to respectively extend from mutually different positions of the circumference of the vacuum container 1 (or the circumference of the turntable 2) to the center of rotation of the turntable.

Each of the first reactive gas supplying unit 31, the second reactive gas supplying unit 32, the auxiliary gas supplying unit 200, and the first separating gas supplying units 41 and 42 is constituted by a nozzle in which plural discharge holes for discharging the reactive gas, the auxiliary gas or the separating gas are perforated on the bottom side of the nozzle and arranged at given intervals in the longitudinal direction of the nozzle.

In this embodiment, the first reactive gas supplying unit 31, the second reactive gas supplying unit 32, and the first separating gas supplying units 41 and 42 are attached to the sidewall of the vacuum container 1, and gas inlet ports 31a, 32a, 200a, 41a and 42a which are provided in the base end parts of the units 31, 32, 200, 41 and 42 respectively are arranged to penetrate the sidewall of the vacuum container 1.

The reactive gas nozzles 31 and 32 and the auxiliary gas nozzle 200 correspond to the first reactive gas supplying unit, the second reactive gas supplying unit, and the auxiliary gas supplying unit, and the separating gas nozzles 41 and 42 correspond to the separating gas supplying unit, respectively. These nozzles 31, 32, 200, 41 and 42 are attached to the container body 12 at the through holes 100 formed in the sidewall of the vacuum chamber 1. The through holes 100 at which these nozzles 31, 32, 200, 41 and 42 are not attached are airtightly sealed by the covering member (not illustrated).

The BTBAS (bis(tertiary-butylamino)silane) gas which is the first reactive gas and the O3 (ozone) gas which is the second reactive gas are supplied to the reactive gas nozzles 31 and 32 by the gas supply lines 31b and 32b in which the valve and the flow rate adjustment part (both not illustrated) are arranged. The auxiliary gas, for example, an alcohol with a hydroxyl group (OH group) for silanol processing (R—OH, R: alkyl group), pure water (H2O), or oxygenated water (H2O2) (in this example, ethanol (C2H5OH) gas) is supplied to the auxiliary gas nozzle 200 by the gas supply line 200b in which the valve and the flow rate adjustment part (both not illustrated) are arranged. The N2 gas (nitrogen gas) which is the separating gas is supplied to the separating gas nozzles 41 and 42 by the gas supply line in which the valve and the flow rate adjustment part (both not illustrated) are arranged.

In the reactive gas nozzles 31 and 32, discharge holes 33 whose diameter is 0.5 mm are arranged at equal intervals (10 mm) along the longitudinal direction of the nozzle (or in the radial direction of the turntable 2) to discharge the reactive gas downward. In the auxiliary gas nozzle 200, discharge holes 201 whose diameter is 0.5 mm are arranged at equal intervals (10 mm) along the longitudinal direction of the nozzle (or in the radial direction of the turntable 2) to discharge the auxiliary gas downward. In the separating gas nozzles 41 and 42, discharge holes 40 whose diameter is 0.5 mm are arranged at equal intervals (10 mm) along the longitudinal direction of the nozzle to discharge the separating gas downward.

The distance between the discharge hole 33 of the reactive gas nozzles 31 and 32 and the wafer W is, for example, in a range of 1-4 mm (preferably, 2 mm). The distance between the discharge hole 201 of the auxiliary gas nozzle 200 and the wafer W is, for example, in a range of 1-4 mm (preferably, 2 mm). The distance between the discharge hole 40 of the separating gas nozzles 41 and 42 and the wafer W is, for example, in a range of 1-4 mm (preferably, 3 mm).

The area located below the reactive gas nozzle 31 is a first processing area 91 for supplying the BTBAS gas to the wafer, and the area located below the reactive gas nozzle 32 is a second processing area 92 for supplying the O3 gas to the wafer. The area located below the auxiliary gas nozzle 200 is an auxiliary area 90 for generating an intermediate product of the ethanol gas reacting with the BTBAS gas adsorbed by the wafer.

The separating gas nozzles 41 and 42 are arranged to form isolation areas D for separating the first processing area 91, the auxiliary area 90, and the second processing area 92. As illustrated in FIGS. 5-7B, the top plate 11 of the vacuum container 1 in each isolation area D is provided with sector-form projecting portions 4 centering on the center of rotation of the turntable 2. The separating gas supplying units 41 and 42 are disposed in the grooves 43 which are formed in the projecting portions 4 to extend in a radial direction from the center of rotation of the turntable 2. The distance from the centerline of the separating gas supplying unit 41 (42) and both side ends of the sector-form projecting portion 4 (both the upstream side end and the downstream side end thereof in the rotational direction) is set as being the same length.

In this embodiment, the grooves 43 are formed to bisect the projecting portion 4. Alternatively, in another embodiment, the grooves 43 may be formed so that the upstream portion of the projecting portion 4 in the rotational direction of the turntable 2 is larger than the downstream portion of the projecting portion 4.

Therefore, a flat, low undersurface portion 44 (the first undersurface portion) which is an undersurface portion of the projecting portion 4 exists on both sides of each of the separating gas supplying units 41 and 42 in the rotational direction, and an undersurface portion 45 (the second undersurface portion) which is higher than the undersurface portion 44 exists on both sides of the undersurface portion 44 in the rotational direction. The projecting portion 4 acts to form the separating space which is a narrow space for preventing entry of the first reactive gas and the second reactive gas into the space between the projecting portion 4 and the turntable 2, and for preventing mixing of these reactive gases.

For example, the separating gas supplying unit 41 prevents entry of the O3 gas sent from the upstream side in the rotational direction of the turntable 2 and prevents entry of the BTBAS gas sent from the downstream side in the rotational direction of the turntable 2. The "prevention of entry of gas" means that N2 gas, which is the separating gas discharged from the separating gas supplying unit 41, is spread between the first undersurface portion 44 and the surface of the turntable 2, and blown off, in this example, to the space below the second undersurface portion 45 adjacent to the first undersurface portion 44, thereby preventing entry of the gas from the adjoining space. The state in which entry of the gas is prevented does not mean the state in which all the gases from the first processing area 91 and the second processing area 91 do not enter the isolation area D at all, but means the state in which some of the gases enter the isolation area D, but the first reactive gas and the second reactive gas respectively entering from the left side and the right side are not mixed together in the isolation area D. As long as these states are maintained, the operation of separating the atmosphere of the first processing area 91 and the atmosphere of the second processing area 91 by the isolation area D is maintained. Because the gas which is absorbed into the wafer can pass through the inside of the isolation area D, the gas entering from the adjoining space means the gas in the gaseous phase.

On the undersurface of the top plate 11, the annular projection 5 is formed along with the periphery of the core part 21 so that it faces the portion of the turntable 2 which is located outside the core part 21. This projection 5 is continuously formed with the central part of the projecting portion 4, and the undersurface of the projection 5 is formed to be the same height as the undersurface portion (the first undersurface portion 44) of the projecting portion 4. The cross sections of FIGS. 2 and 3 are illustrated by cutting the top plate 11 in the location that is lower than the undersurface portion 45 and higher than the separating gas supplying units 41 and 42. The projection 5 and the projecting portion 4 may not necessarily be restricted to be a single integral part, and they may be formed as separate parts.

The combined structure of the projecting portion 4 and the separating gas supplying unit 41 (42) may not necessarily be restricted to the illustrated embodiment. Alternatively, the projecting portion 4 and the separating gas supplying unit 41 (42) may be arranged using two sector-form plates such that the groove 43 and the projecting portion 4 are formed on each of the sector-form plates and the sector-form plates are secured to the undersurface portion of the top plate by bolts on both sides of the separating gas supplying unit 41 (42).

In the present embodiment, the wafer W with a diameter of 300 mm is used as the substrate being processed, and the circumferential length (the length of the arc of the circle coaxial to the circle of the turntable 2) of the first undersurface portion 44 at the projection 5 which is 140 mm distant from the center of rotation is set to 146 mm, and the circumferential length of the first undersurface portion 44 at the position of the outermost part of the recess 24 (substrate mounting area) is set to 502 mm. As illustrated in FIG. 7A, the circumferential length L of the first undersurface portion 44 of the top plate 11 located at the end of the first separating gas supplying unit 41 (42) in the position of this outermost part is set to 246 mm.

As illustrated in FIG. 7A, the height h of the undersurface portion 44 of the projecting portion 4 from the surface of the turntable 2 is, for example, in a range between 0.5 mm and 10 mm. It is preferred that the height h is set to about 4 mm. In this case, the rotational speed of the turntable 2 is set in a range between 1 rpm and 500 rpm. In order to secure the separating function of the isolation area D, the dimensions of the projecting portion 4 and the height h of the first undersurface portion 44 of the projecting portion 4 from the surface of the turntable 2 have to be set based on the experimental results according to the applicable rotational speed of the turntable 2.

The separating gas is not restricted to N2 gas. Any inert gas, such as Ar gas, may be used instead. Moreover, not only inert gas but also hydrogen gas may be used. The separating gas is not limited to a specific kind of gas, and if the gas does not affect the film deposition processing, the gas may be used suitably.

Figure 10:
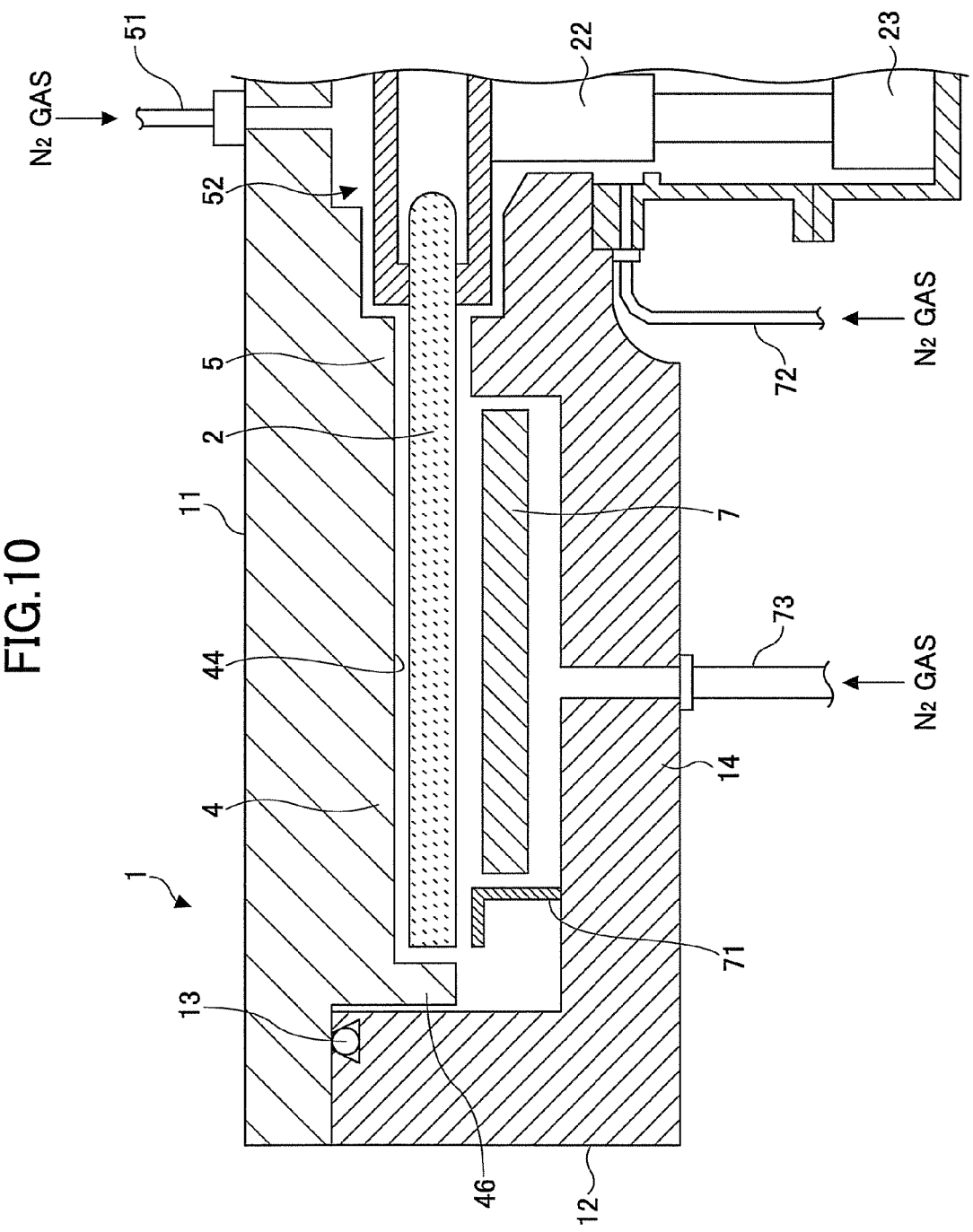
FIG. 10 is an enlarged cross-sectional view of the film deposition device.

As described above, in the undersurface of the top plate 11 of the vacuum container 1, when viewed from the substrate mounting area (the recess 24) of the turntable 2, both the first undersurface portion 44 and the second undersurface portion 45 higher than the undersurface portion 44 exist in the rotational direction of the turntable. FIG. 4 illustrates the cross section of the film deposition device vertically cut in the area where the high undersurface portion 45 is arranged. FIG. 10 illustrates the cross section of the film deposition device vertically cut in the area where the low undersurface portion 44 is arranged. As illustrated in FIGS. 5 and 10, the peripheral part of the sector-form projecting portion 4 (at the outer peripheral edge of the vacuum container 1) is bent into an L-shaped formation, and forms a curved portion 46 which faces the outer peripheral edge of the turntable 2. The sector-form projecting portion 4 is formed in the top plate 11 and is removable from the container body 12. There is a slight gap between the peripheral surface of the curved portion 46 and the container body 12. Similar to the projecting portion 4, the curved portion 46 is disposed to prevent entry of the reactive gas sent from the gas supplying unit and to prevent mixing of the first and second reactive gases. The gap between the inner peripheral surface of the curved portion 46 and the outer peripheral edge of the turntable 2 and the gap between the outer peripheral surface of the curved portion 46 and the container body 12 are set to be the same dimension as the height h of the undersurface portion 44 from the surface of the turntable 2. In this example, the inner peripheral surface of the curved portion 46 constitutes the inner peripheral wall of the vacuum container 1 when viewed from the area of the upper surface of the turntable 2.

As illustrated in FIG. 10, the inner peripheral wall of the container body 12 in the isolation area D is formed into a vertical surface adjacent to the outer peripheral surface of the curved portion 46. However, in the area other than the isolation area D, the inner peripheral wall of the container body 12 has a depressed configuration extending from the portion facing the outer periphery of the turntable 2 to the base part 14, as illustrated in FIG. 4. An area of the hollow portion communicating with the first processing area 91 and an area of the hollow portion communicating with the second processing area 92 will be referred to as the exhaust area E1 and the exhaust area E2, respectively. As illustrated in FIGS. 4 and 6, on the bottom of the exhaust areas E1 and E2, two exhaust ports 61 and 62 are disposed. These exhaust ports 61 and 62 are respectively connected to a common vacuum pump 64 via an exhaust pipe 63. The vacuum pump 64 is an evacuation unit. As illustrated in FIG. 4, reference numeral 65 denotes a pressure regulation unit. The pressure regulation unit 65 may be provided for each of the exhaust ports 61 and 62.

The exhaust ports 61 and 62 are disposed on both sides of the isolation area D in the rotational direction to ensure the separating function of the isolation area D. The exhaust ports 61 and 62 are provided to exhaust the first and second reactive gases (BTBAS gas and O3 gas) individually. In this example, the exhaust port 61 is disposed between the first reactive gas supplying unit 31 and the isolation area D located on the downstream side of the reactive gas supplying unit 31 in the rotational direction. The exhaust port 62 is disposed between the second reactive gas supplying unit 32 and the isolation area D located on the downstream side of the reactive gas supplying unit 32 in the rotational direction.

Specifically, the first exhaust port 61 is disposed between a straight line L1 passing through the center of the turntable 2 and the first processing area 91 and a straight line L2 passing through the center of the turntable 2 and the upstream end of the isolation area D adjacent to the downstream end of the first processing area 91 (both indicated by the dotted chain line in FIG. 6). The second exhaust port 62 is disposed between a straight line L3 passing through the center of the turntable 2 and the second processing area 92 and a straight line L4 passing through the center of the turntable 2 and the upstream end of the isolation area D adjacent to the downstream end of the second processing area 92 (both indicated by the dotted chain line in FIG. 6).

The number of exhaust ports installed is not restricted to two. Additionally, a third exhaust port may be installed between the separating area D, including the first separating gas supplying unit 42, and the second reactive gas supplying unit 32 located on the downstream side of the separating area D in the rotational direction. Alternatively, four or more exhaust ports may be installed.

Figure 11:
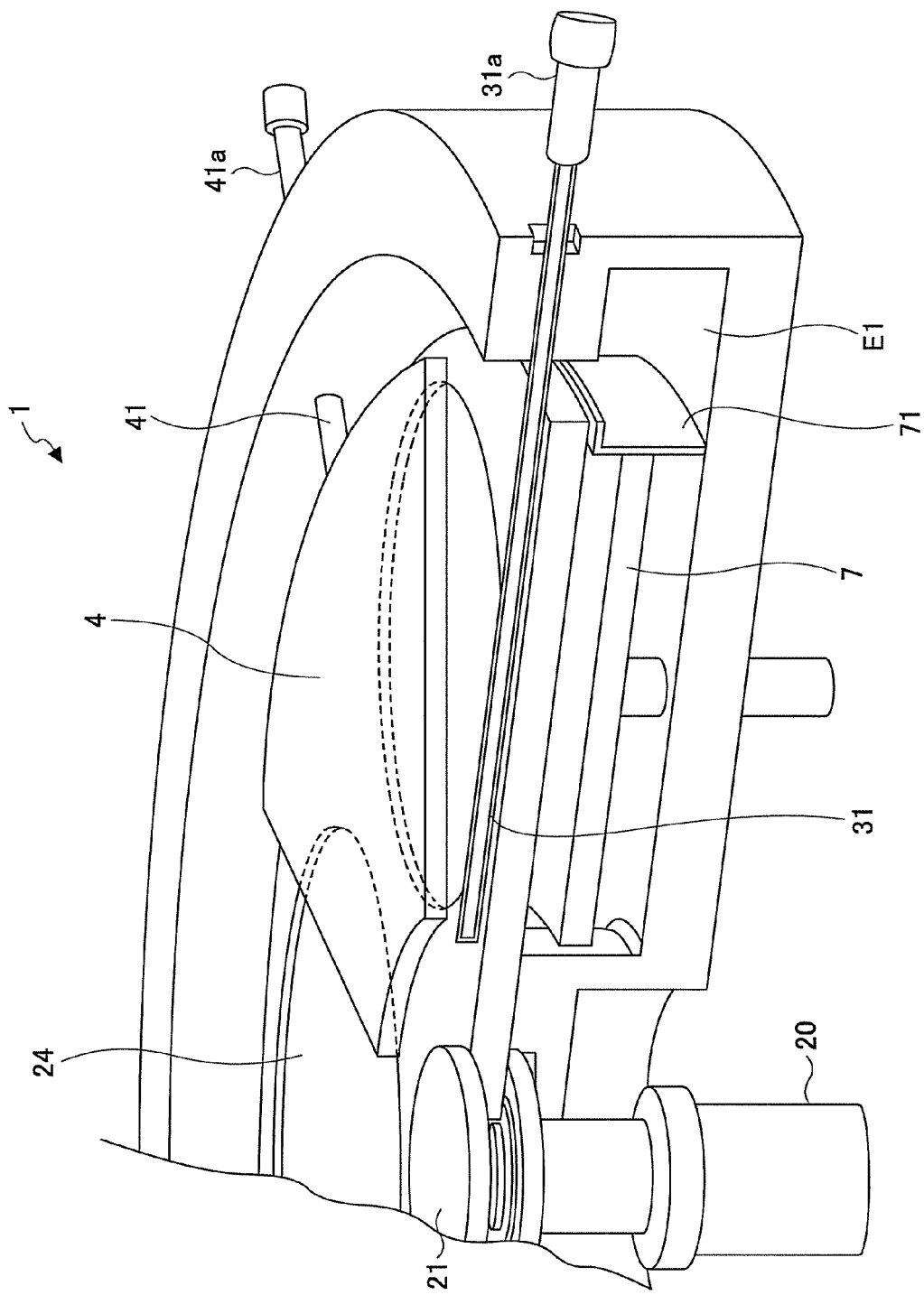
FIG. 11 is a perspective view illustrating a portion of the film deposition device.

As illustrated in FIGS. 4 and 11, a heating unit 7 which is a substrate heating unit is disposed in the space between the turntable 2 and the base part 14 of the vacuum container 1. The heating unit 7 is provided for heating the wafer (the substrate) on the turntable 2 through the turntable 2 to a predetermined temperature in accordance with the process parameters. A cover member 71 is disposed near the lower part side of the periphery of the turntable 2 to surround the overall periphery of the heating unit 7. The cover member 71 is provided to divide the atmosphere from the upper space of the turntable 2 to the exhaust area 6 and the atmosphere where the heating unit 7 is disposed. The upper end of the cover member 71 is outwardly bent in a flanged formation. By reducing the gap between the bent portion and the undersurface portion of the turntable 2, the bent portion of the cover member 71 prevents inclusion of the gas from the outside to the inside of the cover member 71.

The inner portion of the base part 14, located near the center of rotation and apart from the space where the heating unit 7 is disposed, is formed to approach the core part 21 of the turntable 2, and a narrow space is formed between the base part 14 and the core part 21. A narrow space is also formed between the base part 14 and the inner circumference side of the bore part for the rotary shaft 22 in which the base part 14 is penetrated. These narrow spaces are formed to communicate with the case body 20. In the case body 20, a purge gas supplying unit 72 is disposed and the purge gas supplying unit 72 supplies N2 gas (which is the purge gas) to the narrow space. In the base part of the vacuum container 1, purge gas supplying units 73 are disposed at two or more positions below the heating unit 7 along the rotational direction, and these purge gas supplying units 7 supply N2 gas (which is the purge gas) to the space where the heating unit 7 is arranged.

Figure 12:
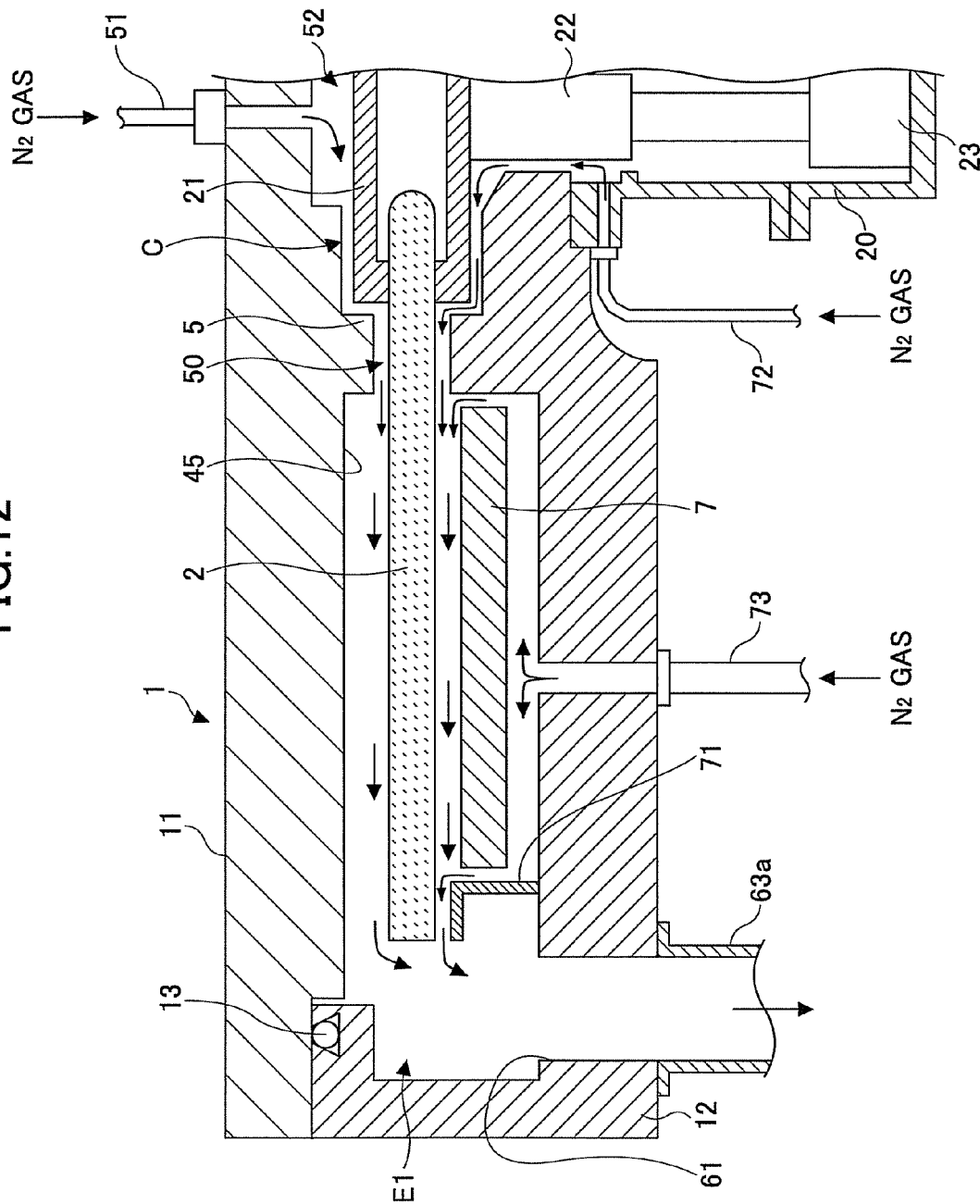
FIG. 12 is a diagram for explaining the flow of a purge gas in the film deposition device.

FIG. 12 is a diagram for explaining the flow of purge gas in the film deposition device as indicated by the arrows in FIG. 12. By forming the purge gas feed pipes 72 and 73, $N_2$ gas is supplied from the internal space of the case body 20 to the accommodating space of the heating unit 7, and $N_2$ gas from the space between the turntable 2 and the cover member 71 is discharged to the exhaust ports 61 and 62 via the exhaust space E. Because the flow of the first reactive gas (BTBAS gas) or the second reactive gas ($O_3$ gas) from one of the first processing area 91 and the second processing area 91 back to the other via the lower part of the turntable 2 is prevented, the purge gas functions as the separating gas to separate the first reactive gas and the second reactive gas.

A second separating gas supplying unit 51 penetrates the top plate 11 of the vacuum container 1, and is connected to the core of the vacuum container 1. The second separating gas supplying unit 51 supplies the separating gas ($N_2$ gas) to the central area C which is the space 52 between the top plate 11 and the core part 21.

The separating gas supplied to the central area C is discharged to the circumference along the surface on the side of the substrate mounting area of the turntable 2 through the narrow space 50 between the projection 5 and the turntable 2. Because the space surrounded by the projection 5 is filled with the separating gas, mixing of the first reactive gas (BTBAS gas) and the second reactive gas ($O_3$ gas) is prevented through the core of the turntable 2 between the first processing area 91 and the second processing area 91. Namely, the film deposition device is provided with the central area C which is surrounded by the center-of-rotation portion of the turntable 2 and the vacuum container 1 in order to separate the atmosphere of the first processing area 91 and the atmosphere of the second processing area 91, the separating gas is supplied to the central area C, and, in the central area C, the discharge hole which discharges the separating gas to the upper surface of the turntable 2 is disposed along the rotational direction. The discharge hole is equivalent to the narrow space 50 between the projection 5 and the turntable 2.

Figure 9:
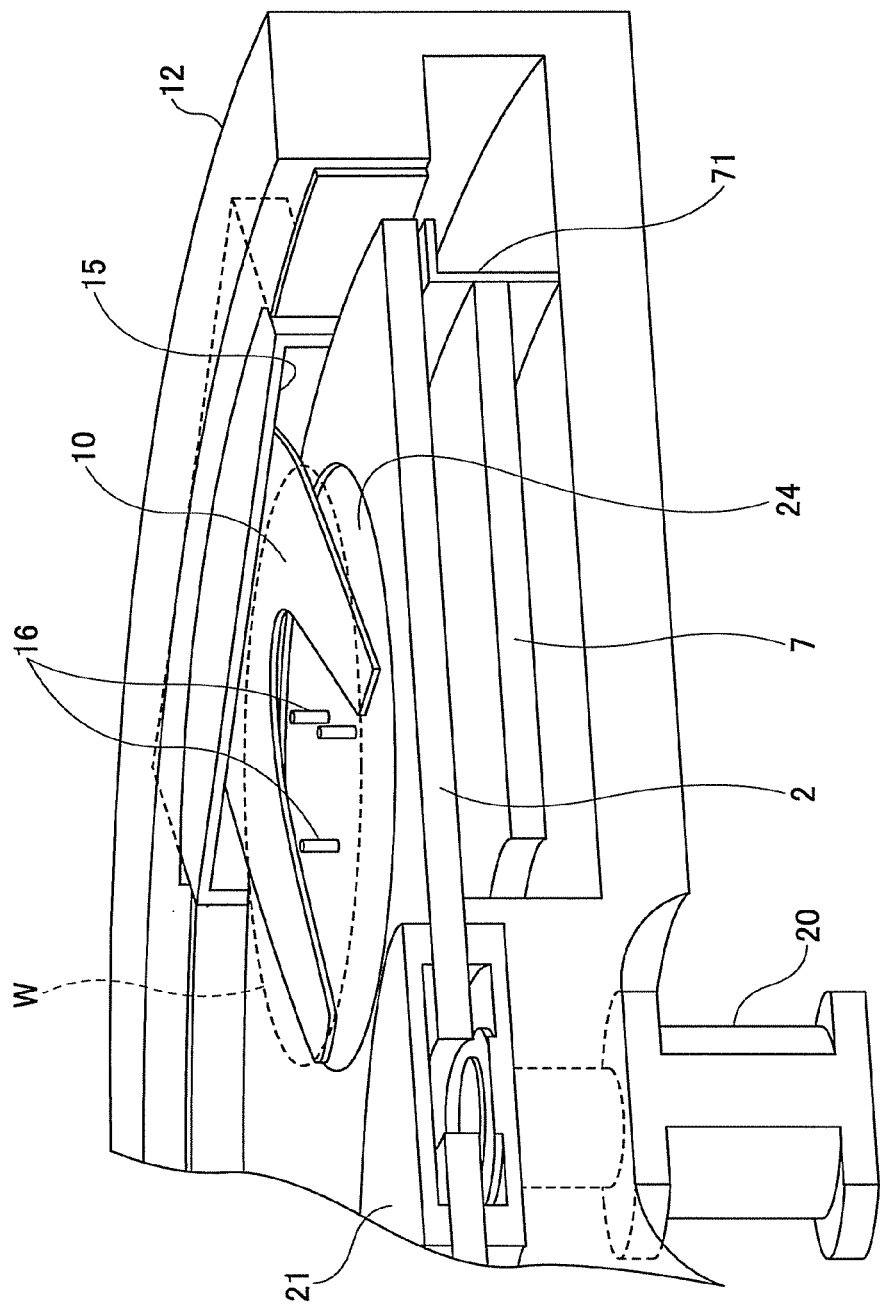
FIG. 9 is an enlarged perspective view illustrating a portion of the film deposition device.

As illustrated in FIGS. 5, 6 and 9, a conveyance opening 15 for delivering the wafer W between the external conveyance arm 10 (the vacuum conveyance arm 104) and the turntable 2 is formed in the sidewall of the vacuum chamber 1. The conveyance opening 15 is opened and closed by a gate valve G. The wafer W is delivered between the recess 24 (which forms the substrate mounting area of the turntable 2) and the conveyance arm 10 at the location which confronts the conveyance opening 15. The mechanism (not illustrated) for raising and lowering the lifting pins 16 (penetrating the recess 24) which lift the wafer from the rear surface thereof is disposed at the location corresponding to the delivery location on the side of the undersurface of the turntable 2.

As illustrated in FIG. 4, the film deposition device of the present embodiment includes a control part 80 which is constituted by a computer for controlling operation of the whole film deposition device. A program which, when executed by the computer, causes the computer to perform the film deposition process according to the invention is stored beforehand in a storage part 85 of the control part 80. The storage part 85 is constituted by any of several computer-readable storage media, such as a hard disk, a compact disc, a magnetic optical disk, a memory card, and a flexible disk. Alternatively, the program may be downloaded from an external device to the control part 80 at any time through a wired or wireless communication network.

Moreover, the process parameters, including the flow rate of each of the BTBAS gas, the O3 gas, the ethanol gas and the N2 gas supplied from the nozzles 31, 32, 200, 41 and 42 respectively, the processing pressure of the vacuum chamber 1, the power value supplied to the heater unit 7 and the heating unit 113 (the wafer heating temperature), the processing conditions, including the rotation angle of the substrate rotating unit 132, the number of times of rotation of the film deposition process of the wafer W, the target thickness T of a thin silicon oxide film being formed on the wafer W, etc., are stored beforehand in the storage part 85 of the control part 80 for every process specification. The program, when executed by the computer, causes the computer to read the process specification from the storage part 85, and output a control signal so that the component parts of the film deposition device are controlled according to the process specification, in order to perform the film deposition process of the wafer W.

Next, the film deposition process performed by the substrate processing apparatus of a first embodiment of the invention will be described with reference to FIGS. 13 to 19.

Figure 13:
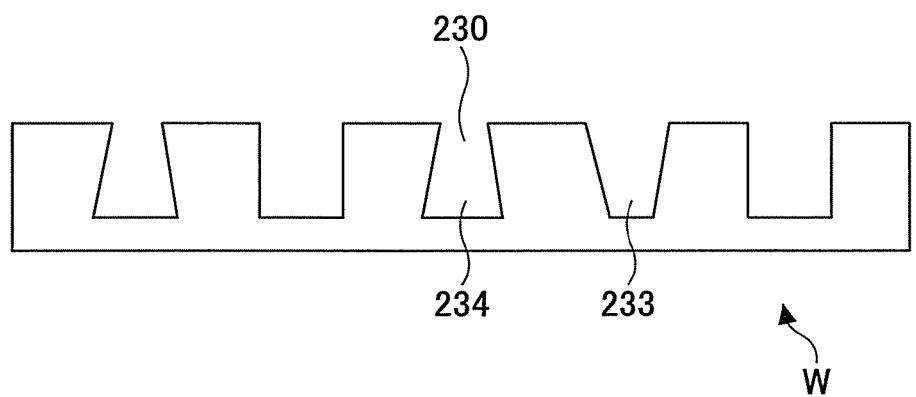
FIG. 13 is a diagram illustrating the structure of a substrate to which a film deposition process is performed by the substrate processing apparatus.

FIG. 13 illustrates the structure of a wafer W on which a thin film is formed by the substrate processing apparatus. As illustrated in FIG. 13, two or more parallel grooved recesses 230 are formed in the surface of the wafer W, for example. A vertical cross-section of a part of the surface of the wafer W in which the recesses 230 are formed is illustrated in FIG. 13. The aspect ratio of the recesses 230 is, for example, in a range of 3 to 50. The recesses (pattern) 230 are provided to form an STI (shallow trench Isolation) structure. Actually, the recesses 230 are formed on the silicon substrate. This pattern is formed through the known photolithographic process by using a mask layer laminated on the upper layer of the wafer W. Due to the processing error in the photolithographic process, a tapered part 233 (in which the opening dimension on the top surface side is larger than the opening dimension on the bottom surface side) or a reverse tapered part 234 (in which the opening dimension on the top surface side is smaller than the opening dimension on the bottom surface side) may be formed in the recess 230. For the sake of description, the cross-section of the recesses 230 illustrated in FIG. 13 is slightly exaggerated.

Next, the film deposition process of the wafer W performed by the substrate processing apparatus of the present embodiment will be described with reference to FIG. 14.

It is assumed in this embodiment that a thin silicon oxide film is deposited on the surface of the wafer W to a target film thickness T (for example, T=80 nm).

Upon start of the film deposition process of FIG. 14, the substrate processing apparatus as illustrated in FIG. 1 is controlled so that the conveying container (FOUP) 108 is conveyed from the outside to the delivery port having a mounting base (not illustrated). The conveying container 108 is connected to the air conveying chamber 107. The lid of the conveying container 108 is opened by the opening/closing device (not illustrated), and the wafer W is taken out from the inside of the conveying container 108 by using the air conveyance arm 106 (step S1).

Subsequently, the wafer W is conveyed to the load lock chamber 105 by the air conveyance arm 106, and the atmosphere in the load lock chamber 105 is changed from the air atmosphere to the vacuum pressure atmosphere. Then, the gate valve G is opened and the wafer W is sent to the vacuum conveying chamber 103 by the vacuum conveyance arm 104 (the conveyance arm 10), so that the wafer W is conveyed to the film deposition device 101 via the conveyance opening 15 and set in the recess 24 of the turntable 2 (step S2).

This operation is performed as follows. When the recess 24 stays in the position facing the conveyance opening 15, the wafer W is conveyed to the upper position of the lifting pins 16 by the conveyance arm 10, and the lifting pins 16 are moved up and the wafer W is received in the recess 24. The conveyance arm 10 is evacuated to the outside of the vacuum chamber 1, and the lifting pins 16 are lowered so that the wafer W is stored in the recess 24. The delivery of the wafer W is repeated while the turntable 2 is rotated intermittently, and five wafers W are placed in the five recesses 24 of the turntable 2 respectively.

Subsequently, the turntable 2 is rotated clockwise at a predetermined rotational speed (for example, 240 rpm), the valve 65 is fully opened and the pressure inside the vacuum chamber 1 is reduced to the vacuum pressure. The wafer W is heated to a predetermined temperature (for example, 350 degrees C.) by the heater unit 7.

Subsequently, the opening of the valve 65 is adjusted to set the pressure inside the vacuum chamber 1 at a predetermined vacuum pressure, and the BTBAS gas from the first reactive gas nozzle 31 and the O3 gas from the second reactive gas nozzle 32 are supplied at 200 sccm and at 10000 sccm to the vacuum chamber 1 respectively. Moreover, the ethanol gas from the auxiliary gas nozzle 200 is supplied at a predetermined flow rate (for example, 100 sccm) to the vacuum chamber 1. Furthermore, the N2 gas from the separating gas nozzles 41 and 42 is supplied at 10000 sccm and at 10000 sccm to the vacuum chamber 1, respectively, and also the N2 gas from the separating gas feed pipe 51 and the purge gas feed pipe 72 is supplied to the central part area C and the narrow space 50 at a predetermined flow rate.

Figure 15A:
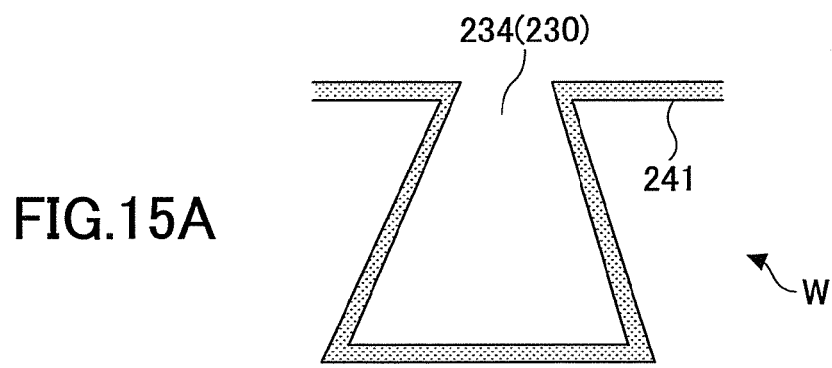
FIG. 15A, FIG. 15B, FIG. 15C and FIG. 15D are diagrams for explaining the way the film deposition process is performed to the substrate in the film deposition device.

By rotation of the turntable 2, the wafer W passes through the first processing area 91, the auxiliary area 90 and the second processing area 92 sequentially in this order. When the wafer W passes through the first processing area 91, one or more molecular layers of the BTBAS gas are adsorbed by the surface of the wafer W. FIGS. 15A to 15D are diagrams for explaining the way a film of silicon oxide is deposited on a reverse tapered recess 230. For the sake of description, the thickness of a molecular layer 241 of the BTBAS gas illustrated in FIG. 15A is slightly exaggerated.

Subsequently, the wafer W passes through the auxiliary area 90. The molecular layer 241 adsorbed by the surface of the wafer W reacts with the ethanol gas in accordance with the following formula (1) to generate a t-butyl amine(CH3C—NH2) and a siloxane polymer (—(Si—O)n-) which is an intermediate product (silanol processing).

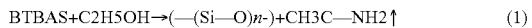

$$BTBAS+C2H5OH \rightarrow (-(Si-O)n-)+CH3C-NH2 \uparrow \quad (1)$$

Figure 15B:
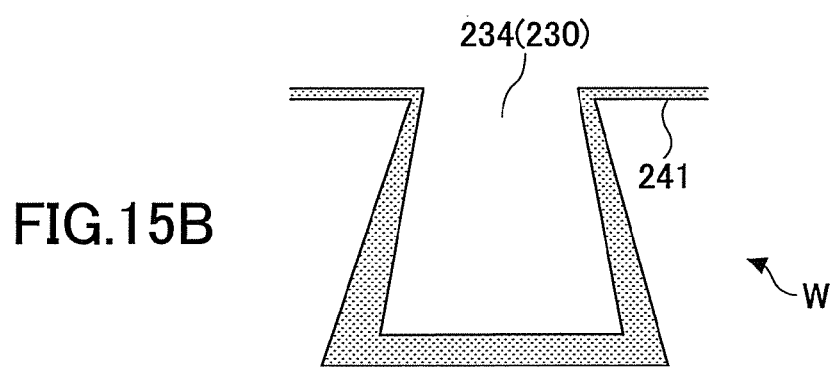

This siloxane polymer is a cluster-like product, and does not stick to the wafer W strongly. The siloxane polymer has a flowability and is in a high viscosity state on the surface (inside of a pattern) of the wafer W. Therefore, as illustrated in FIG. 15B, the laminated portion of the siloxane polymer flows downward by the action of gravity so that the thickness of the film gradually increases toward the bottom thereof. For example, in the reverse tapered recess 230, the inside surface of the film approaches a vertical line. The organic substance generated simultaneously with the siloxane polymer is vaporized and discharged upward from the wafer W.

Subsequently, the wafer W passes through the second processing area 92. The siloxane polymer on the surface of the wafer W oxidizes and a silicon oxide (SiO2) film 242 (which is a resultant containing silicon and oxygen and whose thickness is for example about 0.1 nm) is formed. The impurities, such as the organic substance generated together with the silicon oxide film 242, are vaporized and discharged upward from the wafer W. At this time, the siloxane polymer before the reaction has a flowability. Similarly, the laminated portion of the silicon oxide film 242 formed in this step has a flowability.

In this way, the rotation of the turntable 2 and the reaction of each of the areas 91, 90 and 92 are carried out repeatedly at a predetermined number of times (for example, 100 times). The silicon oxide film 242 is deposited on the surface of the wafer W by 1/N of the target thickness T (N≥2). In this example, the silicon oxide film 242 is deposited by one eighth of the target thickness T (N=8, 80/8=10 nm) (step S3).

Figure 16:
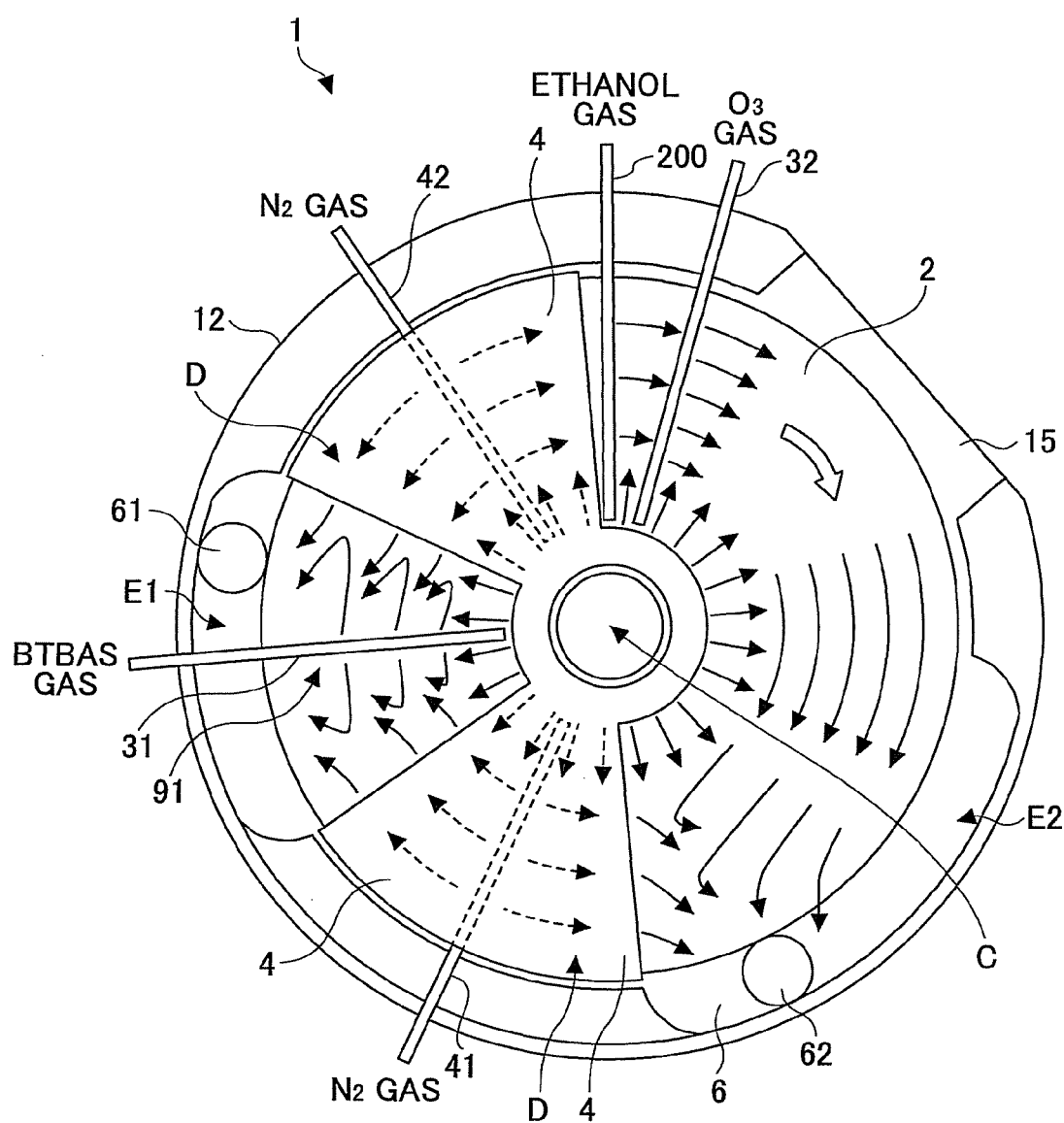
FIG. 16 is a diagram illustrating the flow of the gas in the film deposition device.

At this time, the N2 gas which is the separating gas is supplied to the spaces between the first processing area 91, the second processing area 92 and the auxiliary area 90, and also the N2 gas is supplied to the central part area C. As illustrated in FIG. 16, the respective gases are discharged so that the BTBAS gas, the O3 gas, and the ethanol gas may not be mixed.

In the isolation area D, the gap between the curved part 46 and the outer end of the turntable 2 is narrow as mentioned above. The BTBAS gas, the O3 gas and the ethanol gas are not mixed when passing by the outside of the turntable 2. Therefore, the atmosphere of the first processing area 91, the atmosphere of the second processing area 92, and the atmosphere of the auxiliary area 90 are separated completely, the BTBAS gas is discharged from the exhaust port 61, and the O3 gas and the ethanol gas are discharged from the exhaust port 62, respectively. As a result, the BTBAS gas, the O3 gas, and the ethanol gas are not mixed on the wafer W and in the atmosphere.

In this embodiment, the inner peripheral wall of the container body 12 along the space on the side of the lower part of the second top surface 45 where the reactive gas nozzles 31 and 32 are arranged is cut out and the space is wide, and the exhaust ports 61 and 62 are located beneath this wide space. The pressure of the space on the side of the lower part of the second top surface 45 is lower than the pressure of the narrow space on the side of the lower part of the first top surface 44 and the pressure of the central part area C. The N2 gas is supplied to the lower part side of the turntable 2, and the other gases may not enter the exhaust area E and may not enter the lower part side of the turntable 2. The BTBAS gas may not flow into the supply area of the O3 gas or the ethanol gas.

Subsequently, the supply of the BTBAS gas is stopped, or the supply of each gas (the O3 gas, the ethanol gas, and the separating gas) is stopped concurrently with the BTBAS gas. The rotation of the turntable 2 is stopped to place the recess 24 at the upper position of the lifting pins 16. At this time, the supply of the BTBAS gas is stopped. The BTBAS gas within the vacuum chamber 1 is discharged promptly. Even if the rotation of the turntable 2 is stopped, each wafer W is not influenced by the BTBAS gas.

After the supply of the BTBAS gas is stopped, the opening of the valve 65 is adjusted so that the vacuum pressure in the vacuum chamber 1 is equal to the vacuum pressure in the vacuum conveying chamber 103. The gate valve G is opened, and the vacuum conveyance arm 104 is moved to enter the vacuum chamber 1, and the wafer W is conveyed to the vacuum conveyance arm 104 in accordance with the action of the lifting pins 16.

Figure 17A:
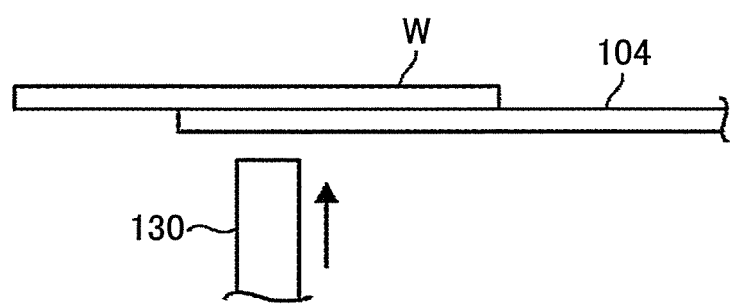
FIG. 17A and FIG. 17B are diagrams illustrating the condition in which the substrate is caused to rotate around its axis in the substrate processing apparatus.
Figure 17B:
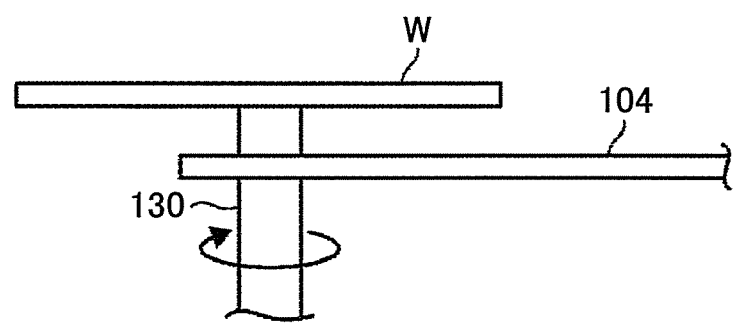

Subsequently, as illustrated in FIG. 17A, the wafer W on the vacuum conveyance arm 104 is moved to the upper position of the substrate rotating unit 132, and the lifting shaft 130 is raised from the lower position so that the wafer W is lifted by the lifting shaft 130. Then, the lifting shaft 130 is rotated around a vertical axis by the actuator 131, as illustrated in FIG. 17B, and the wafer W is caused to rotate around a vertical axis clockwise by 1/N of 360 degrees (in this example, 360/8=45 degrees), so that the direction of the wafer W is changed (step S4).

The lifting shaft 130 is lowered and the wafer W is placed on the vacuum conveyance arm 104, and the wafer W is conveyed to the heat processing device 102. The wafer W is placed on the mounting base 112 and electro-statically attracted.

Subsequently, the opening of the pressure regulation unit (not illustrated), such as a butterfly valve, arranged in the exhaust pipe 124, is adjusted so that the vacuum pressure in the processing container 111 is set to a predetermined value, and the N2 gas is supplied at a predetermined flow rate to the processing container 111. Moreover, the heating unit 113 is operated to heat the wafer W on the mounting base 112 to a predetermined temperature in a range of 100 degrees C.-450 degrees C. (preferably, 350 degrees C.). The wafer W on the mounting base 112 is heated to the predetermined temperature (step S5).

The silicon oxide film 242 formed on the wafer W is heated to the predetermined temperature. By the heat processing, many Si—O bonds are formed in the silicon oxide film and the amount of SiOH bonds in the silicon oxide film 242 is decreased, so that the silicon oxide film 242 is closely packed and solidified.

The wafer W is heated by the heating unit 113. If the impurities, such as the organic substance, remain in the silicon oxide film 242, they are vaporized and discharged upward from the silicon oxide film 242. At this time, even if the impurities enter the silicon oxide film 242, the silicon oxide film 242 is very thin as mentioned above. Such impurities will be discharged promptly.

Subsequently, the wafer W is taken out from the heat processing device 102 by the vacuum conveyance arm 104. It is detected whether the target thickness T is reached (or it is detected whether the number of times N of the film deposition process is reached) (step S6). When it is detected in step S6 that the target thickness T is not reached, the steps S2 to S6 are repeated. Namely, the wafer W is conveyed to the vacuum chamber 1 and stored in the recess 24 again.

The turntable 2 is rotated intermittently and the direction changing operation and the heat processing are similarly performed for the remaining wafers W on the turntable 2. When the target thickness T is not reached, the wafer W is conveyed to the vacuum chamber 1 and stored in the recess 24. At this time, the wafers W are arranged on the turntable 2 in the circumferential direction. When there is a wafer W for which the silanol processing using the ethanol gas and the oxidation processing have not been performed yet to the surface molecular layer 241, the gate valve G is closed and then the wafer W is taken out through the conveyance opening 15. The supply of the respective gases (the BTBAS gas, the ethanol gas, the O3 gas, and the N2 gas) is restarted, the wafer W is caused to pass through the areas 90 and 92 sequentially in this order by the rotation of the turntable, and the silicon oxide film 242 is formed. Before taking out the wafer W, the supply of BTBAS gas or other gases is stopped.

Alternatively, the detection in the step S6 as to whether the target thickness T is reached may be performed for the first taken out wafer W only, and the substrate processing which is the same as that of the first taken out wafer W may be performed for the four remaining wafers W.

Subsequently, these wafers W are placed in the vacuum chamber 1 and the turntable 2 is rotated. The opening of the valve 65 is adjusted so that the atmosphere in the vacuum chamber 1 is set to a predetermined vacuum pressure. Then, the supply of the BTBAS gas and other gases is started, and the silicon oxide film 242 with a thickness of 10 nm (thickness: T/N=80/8=10 nm) is formed, similar to the film deposition process of the step S3. At this time, each wafer W is caused to rotate around a vertical axis by 45 degrees clockwise as described above. The position of the wafer W is rotated by 45 degrees clockwise relative to a horizontal position when the previous film deposition process of the wafer W was performed. The wafer W in such a shifted position is caused to pass through the areas 91, 90, and 92 which are the lower part positions of the nozzles 31, 200, and 32. As a result, the silicon oxide film 242 with a total thickness of 20 nm (thickness: T/N×2=80/8×2) is formed on the wafer W.

The above-mentioned steps are repeated until the silicon oxide film 242 with the target thickness T is formed on each wafer W. Every time the 10-nm thick silicon oxide film 242 is formed, the direction of each wafer W is changed (the 45-degree clockwise rotation) in the middle of the film deposition process. Therefore, when compared with the wafers W before the film deposition (at the time they are conveyed to the vacuum chamber 1), the wafers W after the film deposition rotate by 315 degrees clockwise, and a thin film including a 80-nm thick silicon oxide film 242 is formed.

Figure 18:
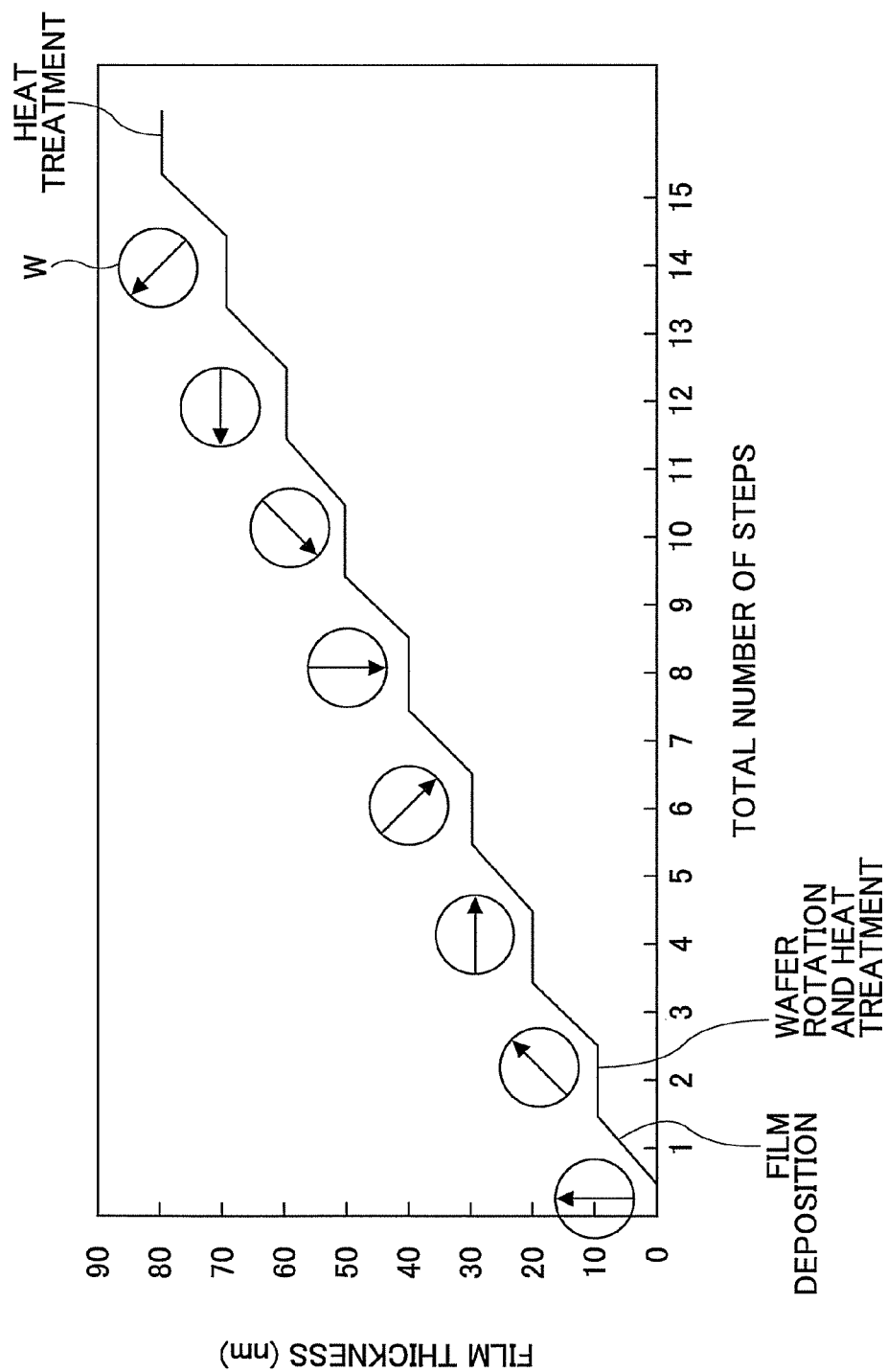
FIG. 18 is a diagram for explaining the relationship between the thickness of a film deposited on the substrate and the total number of the film deposition and substrate rotation steps performed by the substrate processing apparatus.

FIG. 18 is a diagram for explaining the relationship between the thickness of a film deposited on the wafer W and the total number of the film deposition and substrate rotation steps performed by the substrate processing apparatus. The arrows on the wafer W in FIG. 18 indicate how the rotational angle of the wafer W is changed from the initial position before the film deposition process. The horizontal axis in FIG. 18 indicates the total number of the film deposition and substrate rotation steps performed.

Figure 15C:
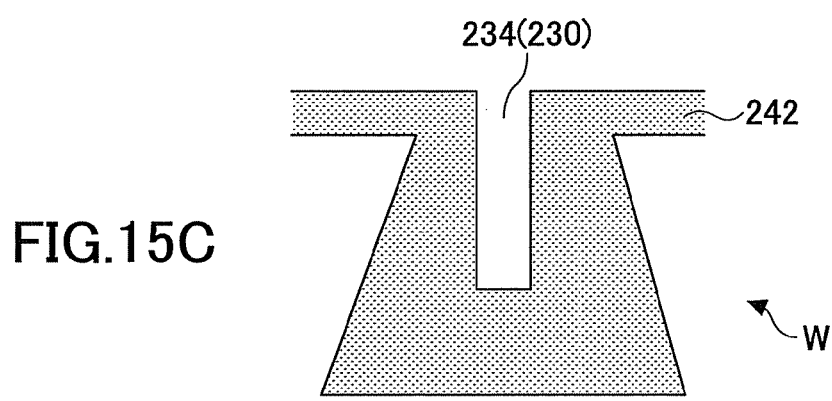

As described above, each time the film deposition process is performed, the silanol processing is performed and the silicon oxide film 242 is made to flow. Each time the silanol processing is performed in the recess 230, the shape of the reverse tapered recess is reduced gradually as illustrated in FIG. 15C.

Figure 15D:
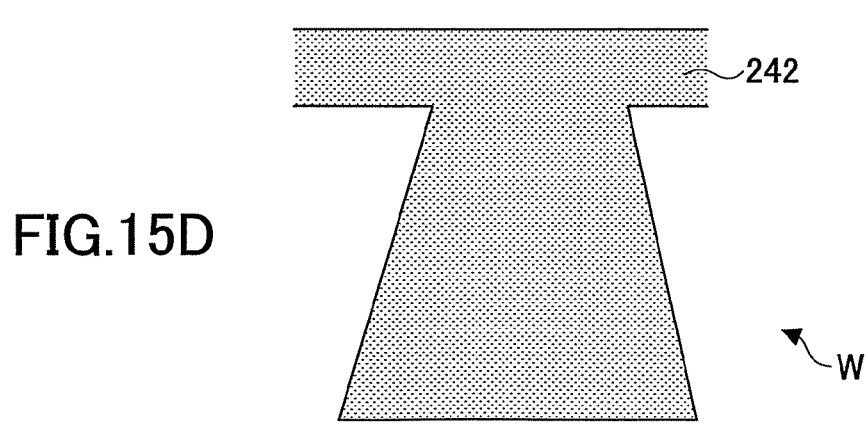
Figure 19:
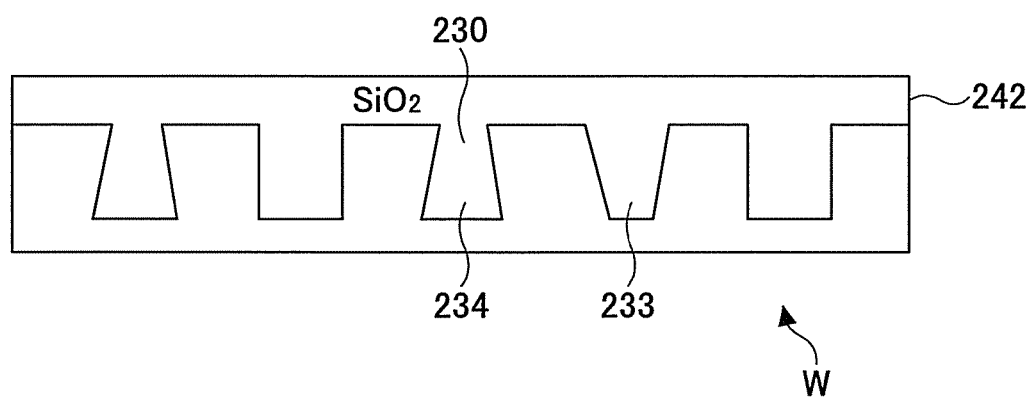
FIG. 19 is a diagram illustrating the structure of a substrate to which the film deposition process is performed by the substrate processing apparatus.

As illustrated in FIG. 15D and FIG. 19, embedding is completed in the state where there is no void. When the wafer W passes through the areas 91, 90, and 92 sequentially, the wafer W is placed at the five recesses 24 along the direction of rotation of the turntable 2. Before the molecular layer 241 is formed, the ethanol gas and the O3 gas may be supplied to the wafer W. However, this does not affect the film deposition.

Upon completion of the film deposition process (the target thickness is reached), the wafers W are taken out from the substrate processing apparatus by the conveyance atm 10 one by one by the reverse operation opposite to the previously described operation (step S7). As described above, the wafers W are caused to rotate by 315 degrees clockwise from the initial position before the film deposition. Before taking out from the substrate processing apparatus, the wafers W may be caused to further rotate by 45 degrees clockwise by the substrate rotating unit 132 so that they are returned to the initial position.

Here, an example of the process parameters will be described. When a wafer W with a diameter of 300 mm is used as the substrate to be processed, the rotational speed of the turntable 2 is in a range of 1 rpm to 500 rpm, the flow rate of the N2 gas from the separating gas feed pipe 51 at the central part of the vacuum chamber 1 is for example, 5000 sccm.

According to the above-described embodiment, the reactive gases (the BTBAS gas and the O3 gas) are supplied to the surface of the wafer W, and the wafer W passes through the processing areas 91, 90 and 92 and the isolation areas D between the processing areas 91 (90) and 92 while the turntable 2 is rotated around a vertical axis, so that the silicon oxide film 242 is formed on the wafer W. In the middle of the film deposition process, the wafer W is taken out from the vacuum chamber 1 and caused to rotate around a vertical axis by the substrate rotating unit 132. Subsequently the layer of the resultant is laminated again, and the thin film is formed. Therefore, even if the thickness of the initially formed silicon oxide film 242 is uneven, the wafer W is caused to rotate around a vertical axis, the direction of the wafer W is changed (and the uneven-thickness portion is shifted), and the subsequently formed silicon oxide film 242 may be formed with a uniform thickness. According to the above-described embodiment, the film deposition process can be performed with excellent uniformity of the film thickness in the surface.

In the above-described embodiment, the wafers W are caused to rotate by 45 degrees clockwise multiple times (for example, 8 times) until the target thickness T for the film deposition process is reached. Deviations in the film thickness within the surface in the film deposition process can be leveled, and the uniformity within the surface can be raised to 1% or less as in the simulation result which will be described below.

The operation to cause the substrate (the wafer W) to rotate around its axis is performed inside the substrate processing apparatus. For example, when compared with the case in which this operation is performed under the external environment of the air atmosphere outside the substrate processing apparatus, the time for the substrate rotating operation by the substrate processing apparatus of the present embodiment can be shortened. Accordingly, the uniformity of the film thickness in the surface can be raised and lowering of the throughput can be suppressed.

In the above-described embodiment, after the BTBAS gas is adsorbed by the wafer W and before the O3 gas is supplied, the ethanol gas is supplied to the wafer W. The molecular layer 241 in a high fluidity state (siloxane polymer) is acquired. Therefore, the siloxane polymer is made to flow and the silicon oxide film 242 generated by the oxidation processing with the O3 gas is also made to flow. Because the silicon oxide film 242 easily enters the recess 230, even in the case where the recess 230 is formed in the reverse tapered shape, the silicon oxide film 242 can be embedded in the recess 230 without a void therebetween. Therefore, the silicon oxide film 242 can be obtained with good film quality, which enables good insulation properties to be acquired when fabricating the STI structure devices, for example.

In the above-described embodiment, the silanol processing to make the silicon oxide film 242 have a flowability is performed each time one step of the film deposition process is performed, rather than performing it after completion of the deposition of a thin film on the wafer. In the silanol processing, the layer of the siloxane polymer laminated one by one is made to flow sequentially. Because the amount of siloxane polymer which is made to flow in the silanol processing is very small, the silicon oxide film 242 can be made to flow promptly. The silanol processing is performed in each cycle in which the turntable 2 is rotated to perform the ALD. There is no time loss to perform the silanol processing, and high throughput can be maintained.

In the above-described embodiment, after the silicon oxide film 242 is made to flow, the heat processing of the wafer is performed by the heat processing device 102. Even if the impurities are contained in the silicon oxide film 242, these impurities can be reduced by the heat processing. The silicon oxide film 242 can be closely packed and the thin film with good quality can be obtained.

As described above, two or more wafers W are arrayed on the turntable 2 along the direction of rotation of the turntable 2 and the turntable 2 is rotated. Each wafer W passes through the processing areas 91, 90 and 92 sequentially to perform the ALD (or MLD). Hence, the film deposition process can be performed with high throughput. The isolation area D which has a low top surface between the first processing area 91 and the auxiliary area 90, and the second processing area 92 in the direction of rotation is arranged. The separating gas from the central part area C partitioned between the center-of-rotation part of the turntable 2 and the vacuum chamber 1 is discharged to the periphery of the turntable 2. The reactive gases are discharged via the gap between the periphery of the turntable 2 and the inner peripheral wall of the vacuum chamber together with the separating gas diffused on both sides of the isolation area D, and the separating gas discharged from the central part area C. Hence, mixing of the two kinds of reactive gases can be prevented and the film deposition process can be performed with good film quality. Generation of a resultant on the turntable 2 is suppressed as much as possible, and development of particles is suppressed. This invention is also applicable the case in which a single wafer W is placed in the turntable 2.

The above-described substrate processing apparatus is provided with the film deposition device for five-wafer processing, the ALD method (or the MLD method) can be carried out with high throughput. Two sets of the above-described film deposition device 101 may be connected airtightly to the vacuum conveying chamber 103, and the film deposition process may be performed in parallel in these film deposition devices 101 and 101. In that case, the ALD method (or the MLD method) can be performed with higher throughput.

In the above-mentioned example, the wafer W is caused to rotate and the heat processing is performed after the turntable 2 is rotated 100 times in the film deposition process. Alternatively, each time the turntable 2 is rotated one time, the wafer W may be taken out from the vacuum chamber 1, the wafer W may be caused to rotate and the heat processing may be performed.

Figure 20:
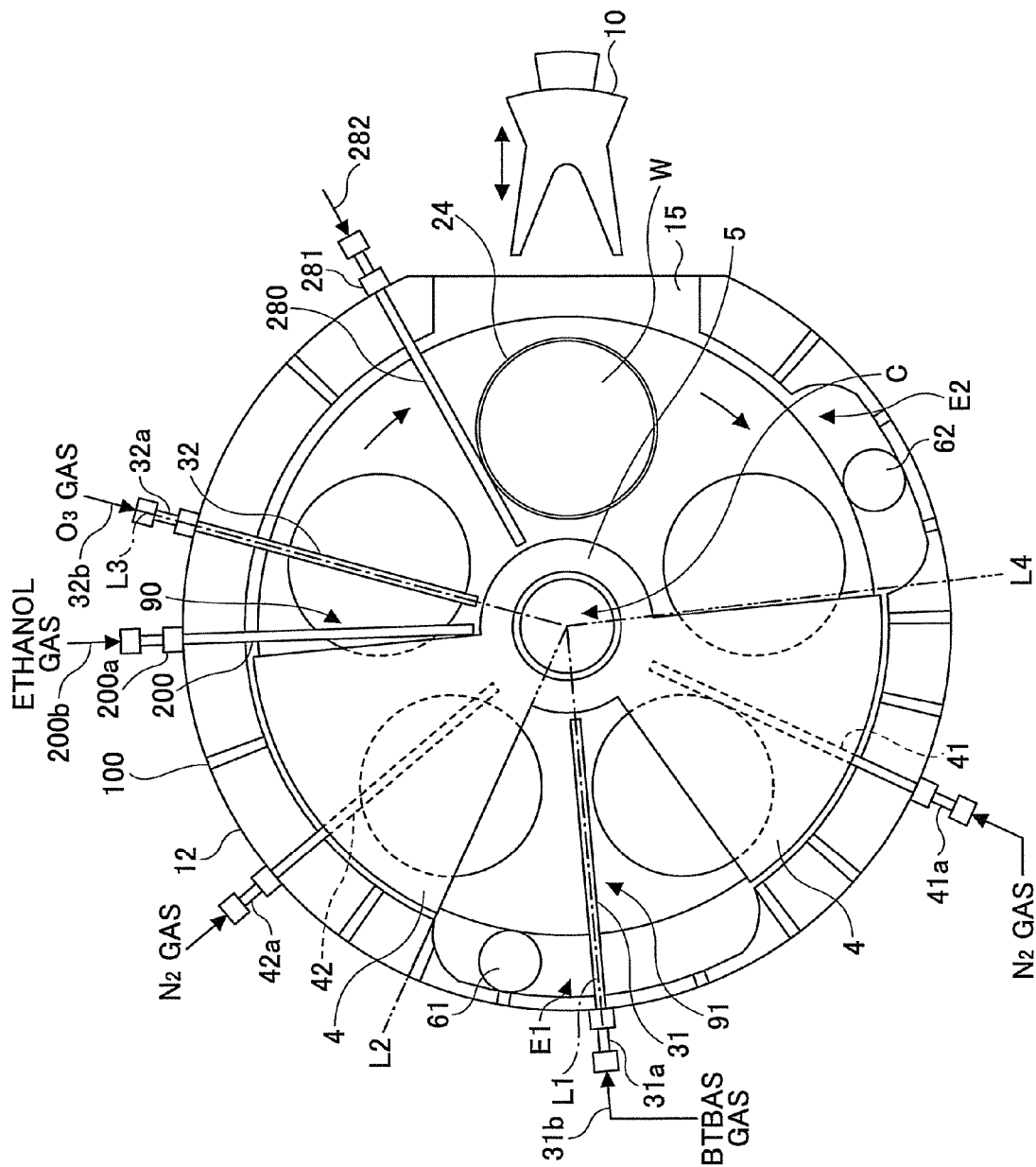
FIG. 20 is a plan view illustrating the composition of another embodiment of the film deposition device.

Next, the second embodiment of the invention will be described with reference to FIG. 20.

In this embodiment, at least one of boron (B) and phosphorus (P) is contained in the silicon oxide film 242 and mixed therewith so that the silicon oxide film 242 is made to reflow promptly.

The composition of a film deposition device of this embodiment will be described. In this film deposition device, the compound which contains one of boron and phosphorus (for example, the compound containing phosphorus, or $PH_3$ (phosphine) gas) is supplied to the wafer as the third reactive gas. The third gas nozzle 280 which is made of, for example, quartz is arranged as a third reactive gas supplying unit, and the nozzle 280 is disposed between the second reactive gas nozzle 32 and the conveyance opening 15 in the direction of rotation of the turntable 2.

The nozzle 280 is constructed similar to each of the nozzles 31, 32, 200, 41 and 42 described above. The nozzle 280 is attached to face the wafer W so that the nozzle 280 horizontally extends from the peripheral wall of the vacuum chamber 1 to the center of rotation of the turntable 2. The gas introducing port 281 which is located at the base end of the nozzle 280 is formed to penetrate the peripheral wall of the vacuum chamber 1.

The third reactive gas is supplied to the nozzle 280 by the gas supply line 282 in which the valve and the flow rate adjustment part (both not illustrated) are arranged. On the bottom side face of the nozzle 280, the gas discharge holes (not illustrated) which have a diameter of 0.5 mm are formed and arranged at equal intervals (for example, 10 mm) along the longitudinal direction of the nozzle to discharge the reactive gas downward to the wafer W. The distance between the gas discharge holes of the nozzle 280 and the wafer W is in a range of 1 mm to 4 mm (preferably, 2 mm).

In this example, the heating temperature of the wafer W in the heat processing device 102 is set to a predetermined temperature in a range of 700 degrees C. and 800 degrees C.

Operation of the film deposition device including the nozzle 280 will be described below.

As previously described, the five wafers W are placed on the turntable 2, and the turntable 2 is rotated. Each of the reactive gases and the separating gas are supplied from the respective nozzles 31, 32, 200, 280, 41 and 42, and the purge gas is supplied to the central part area C and the lower part area of the turntable 2.

The third reactive gas is supplied to the wafer W in which the silicon oxide film 242 is formed on the surface after having passed through the second processing area 92. The third reactive gas supplied is adsorbed by the silicon oxide film 242.

Subsequently, after the wafer W is caused to rotate, the silicon oxide film 242 which has adsorbed the third reactive gas is heated at the temperature in a range of 700 degrees C.-800 degrees C. in the heat processing device 102. For example, the organic substance contained in the third reactive gas is vaporized and discharged upward from this film, and phosphorus is adsorbed by the silicon oxide film 242. At this time, the tendency of glass transition of the silicon oxide film 242 is increased by the presence of phosphorus. The silicon oxide film 242 is made to reflow, and the amount of the end breadth of the reverse tapered recess 230 will be reduced. Then, the multilayered silicon oxide film 242 is deposited similar to the previously described embodiment.

The arrangement position of the nozzle 280 may be between the first reactive gas nozzle 31 and the conveyance opening 15 in the direction of rotation of the turntable 2. For example, the gas supply line 282 may be arranged in the gas supply line 31b of the first reactive gas nozzle 31, so that the mixed gas of the third reactive gas and the BTBAS gas may be supplied to the wafer. The third reactive gas may be the compound containing boron (for example, TMB (tri-methyl boron) gas), instead of the above-mentioned gas. This also allows at least one of phosphorus and boron to be contained in the silicon oxide film 242 and mixed therewith.

In the above-mentioned example, the ethanol gas is used as the auxiliary gas supplied from the auxiliary gas nozzle 200. Alternatively, another alcohol (for example, methanol (CH3OH)) may be used. Alternatively, pure water (H2O), oxygenated water (H2O2), etc. may be used instead. That is, the compound containing a hydroxyl group (OH) may be used as the auxiliary gas. When pure water is used as the auxiliary gas, the gas of pure water and the BTBAS gas adsorbed by the surface of the wafer W react with each other in accordance with the following formula (2).

$$BTBAS+H2O \rightarrow (-SiO-)n+CH3C-NH2\uparrow \qquad (2)$$

The intermediate product (—SiO)n generated by this reaction has a flowability similar to the siloxane polymer. The silicon oxide film 242 generated by the reaction of the (—SiO-)n and the O3 gas also has a flowability. The silicon oxide film 242 can be embedded in the recess 230 suitably.

Figure 21:
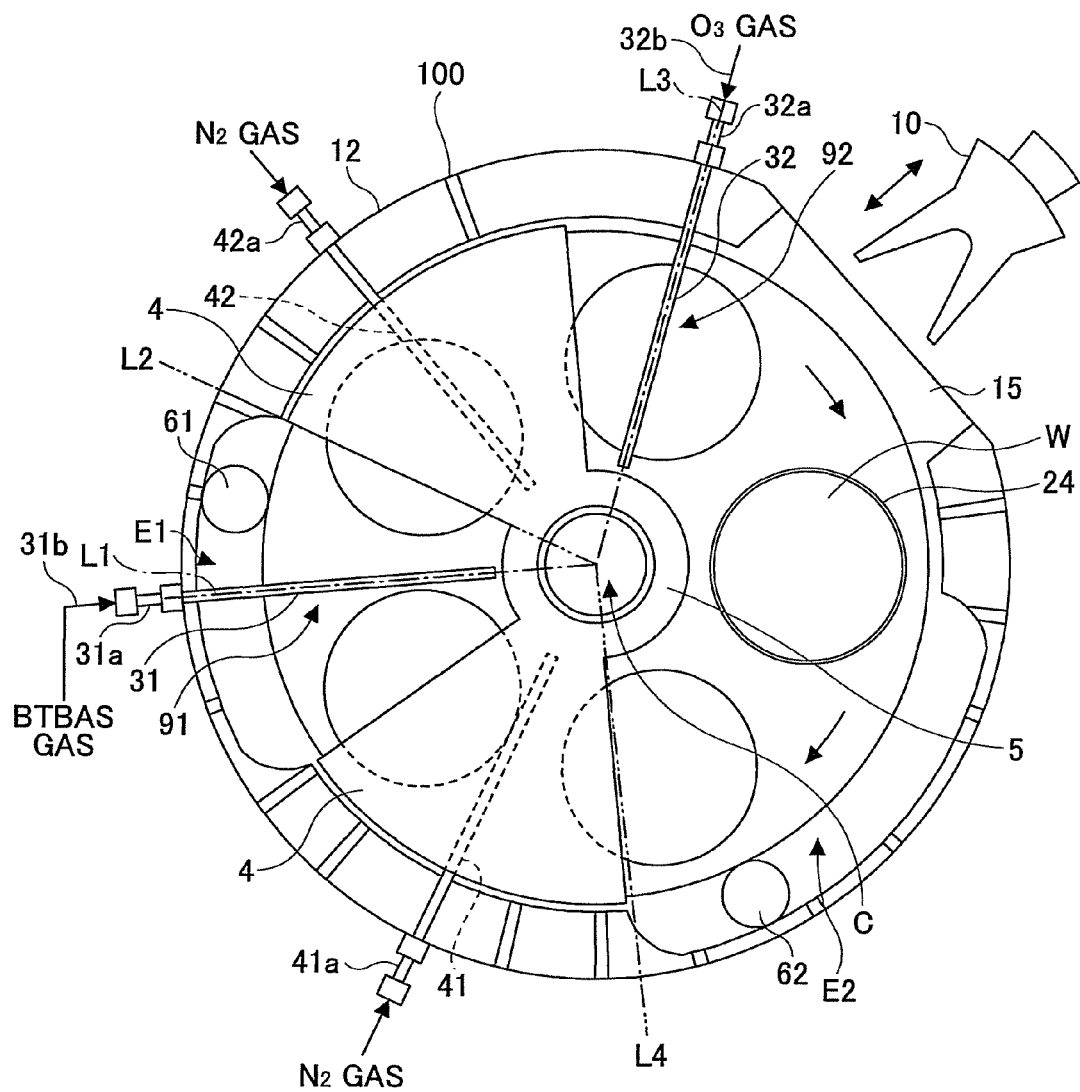
FIG. 21 is a plan view illustrating the composition of another embodiment of the film deposition device.

In the above-mentioned embodiments, when performing the film deposition process of the silicon oxide film 242 to the wafer W on which the pattern 232 is formed, the ethanol gas is supplied from the auxiliary gas nozzle 200, and the silicon oxide film 242 is made to have a flowability. The ethanol gas may be supplied also to a wafer W on which the pattern 232 is not formed. Alternatively, supplying the ethanol gas to the wafer W on which the pattern 232 is not formed may be omitted. In such a case, the film deposition process is performed by the film deposition device 101 in which the auxiliary gas nozzle 200 is not formed as illustrated in FIG. 21.

Similar to the above-mentioned first embodiment, the film deposition process, the rotation of the wafer W, and the heat processing are repeated in this order to each wafer W multiple times, and a thin film containing a multi-layered silicon oxide film 242 is formed.

In this embodiment, the heat processing is performed for every step of the film deposition process so that the impurities, such as carbon, captured in the silicon oxide film 242 are easily vaporized and discharged. The silicon oxide film 242 is closely packed and hardened. The content of the impurities can be reduced and a thin film can be obtained with a good hardness. In order to make the impurities be easily vaporized and discharged at this time, it is necessary to move the impurities in, for example, the thickness direction of the silicon oxide film 242.

In this embodiment, each time one step of the film deposition process is performed, the heat-processing of the wafer is performed. The heat processing is performed when the silicon oxide film 242 is set to a small thickness. Compared with the case in which the heat processing is performed after the end of the film deposition, the impurities in the silicon oxide film 242 can be eliminated promptly, and the thin film with good quality can be obtained.

Next, the third embodiment of the invention will be described. This embodiment is suitably applicable when forming a high derivative (high-k) film, such as a STO film. In this embodiment, the reactive gases supplied from the nozzles 31 and 32 are, for example, a Ti(MPD)(THD) 2 gas and a Sr(THD)2 gas, respectively. In this case, the heating temperature of the wafer W in the heat processing device 102 is set to a temperature in a range of 300 degrees C.-400 degrees C.

Next, the fourth embodiment of the invention will be described with reference to FIGS. 22-24.

This embodiment will be described by referring to the film deposition device 101 of the first embodiment as an example. As illustrated in FIG. 22, in the direction of rotation of the turntable 2, the plasma injector 250 which is a plasma supplying unit is arranged between the second reactive gas nozzle 32 and the conveyance opening 15. The plasma injector 250 includes an injector body 251 containing a housing.

Figure 23:
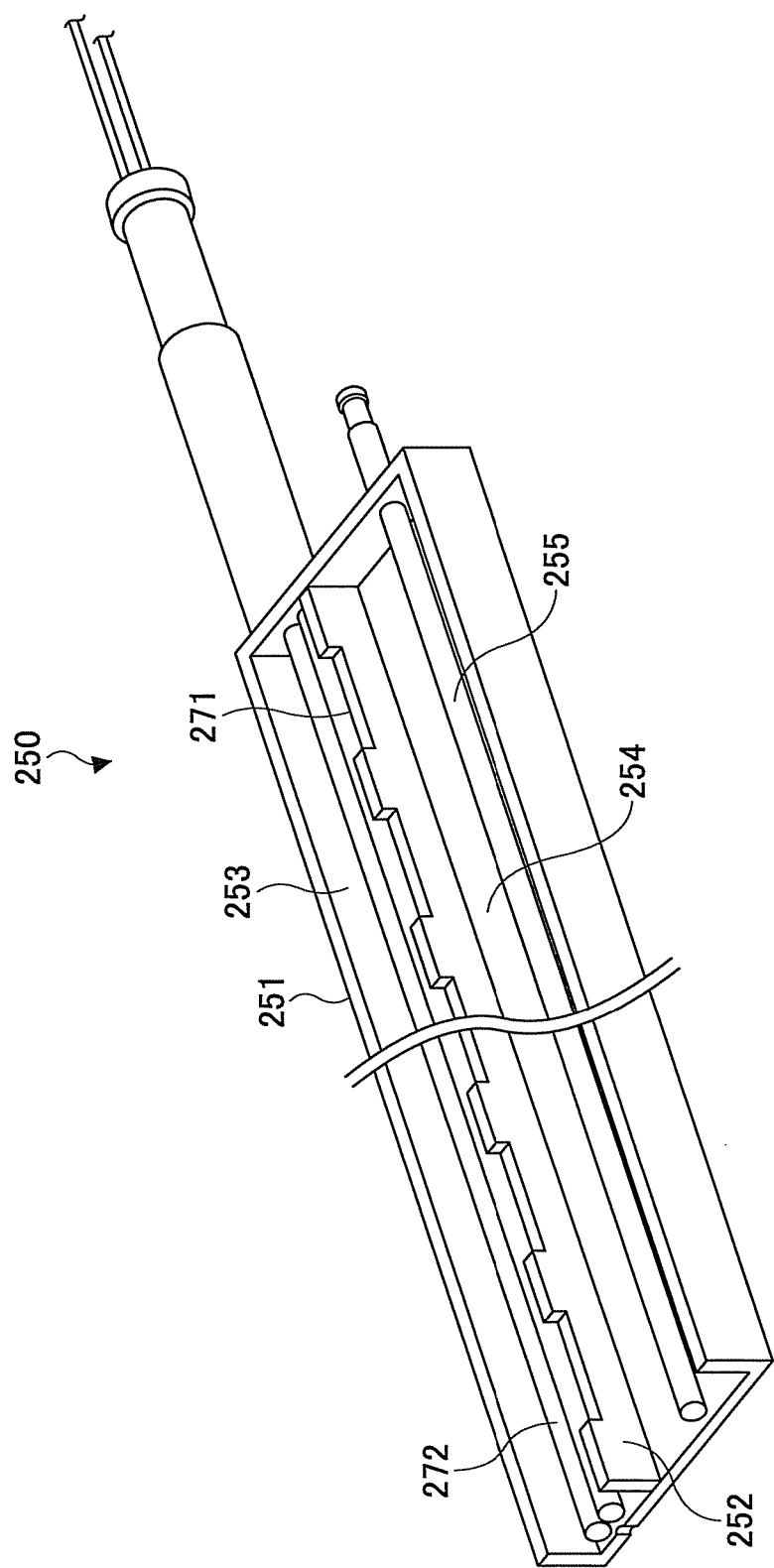
FIG. 23 is a perspective view illustrating the composition of a plasma injector in the film deposition device.
Figure 24:
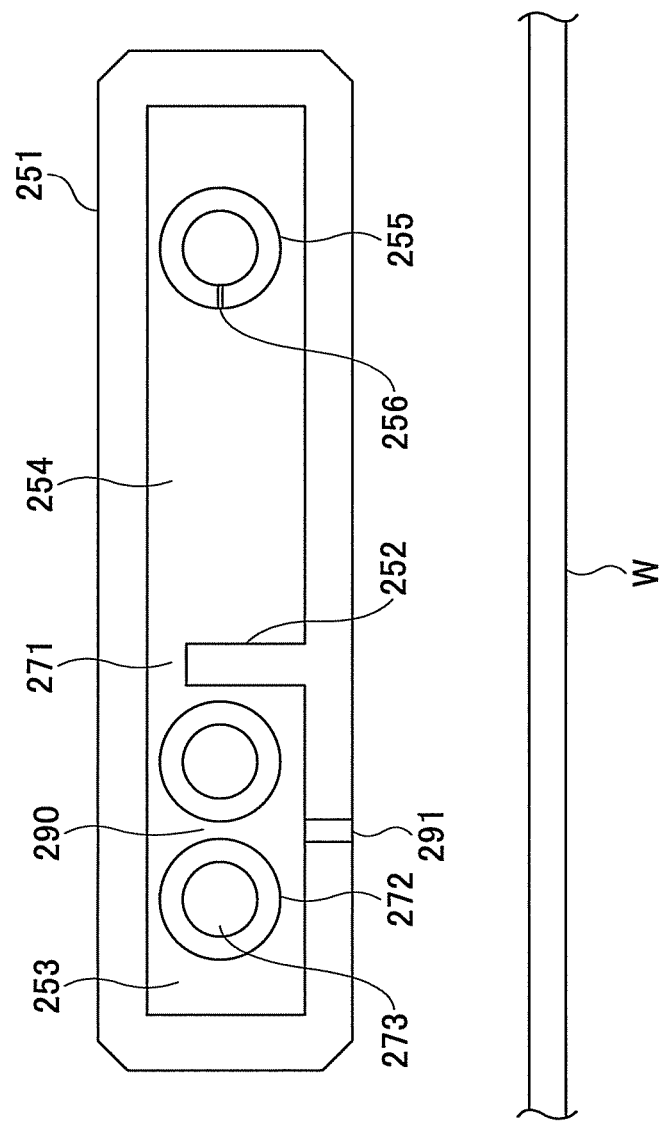
FIG. 24 is a cross-sectional view illustrating the composition of the plasma injector.

As illustrated in FIG. 23 and FIG. 24, in the injector body 251, two spaces with different widths divided in the longitudinal direction by the separating wall 252 are formed. One space is the gas activation chamber 253 which is a gas activation passage to generate a plasma from the plasma generating gas, and the other space is the gas introduction chamber 254 which is a gas introduction passage to supply the plasma generating gas to the gas activation chamber 253.

Figure 22:
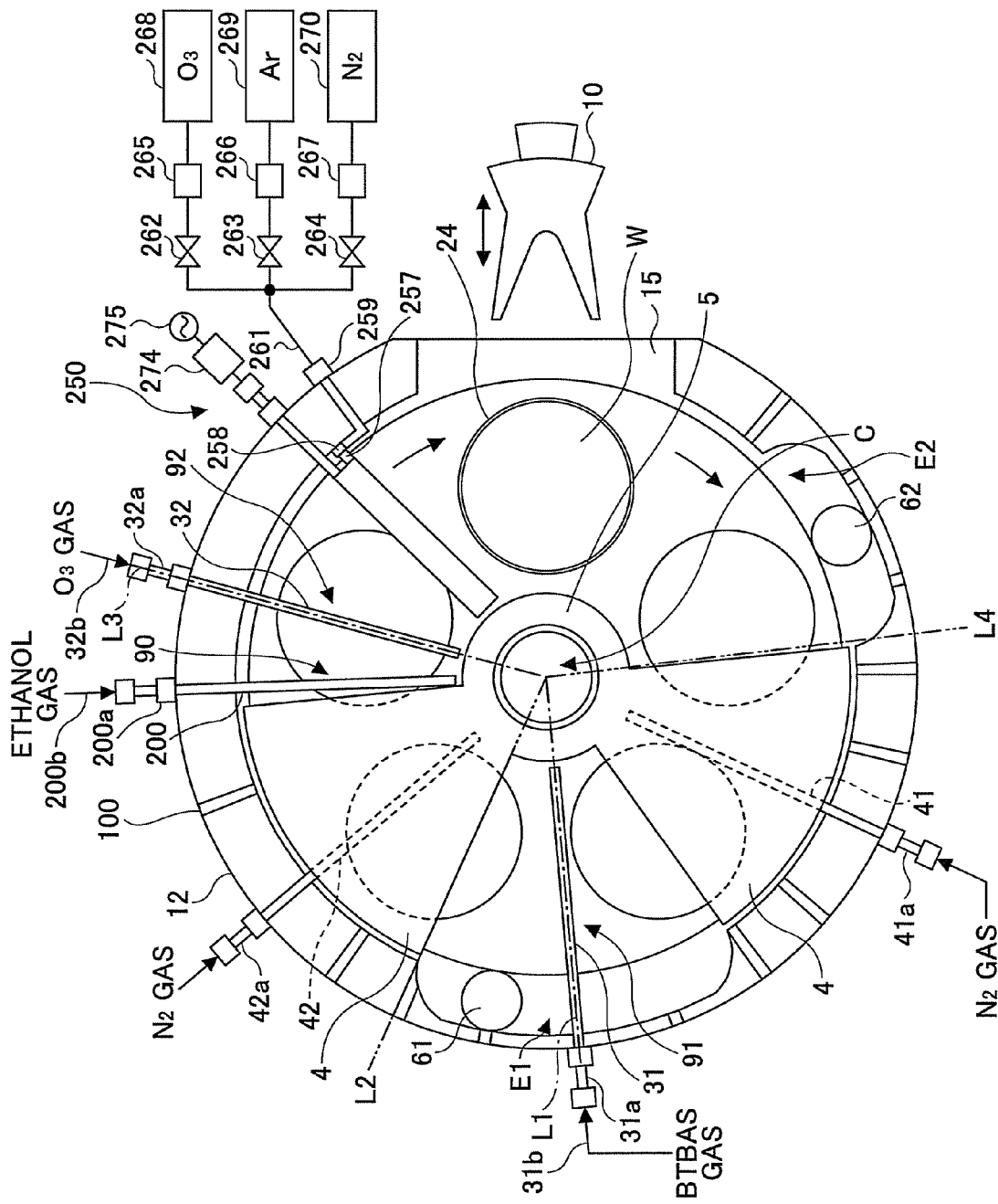
FIG. 22 is a plan view illustrating the composition of another embodiment of the film deposition device.

In FIGS. 22-24, reference numeral 255 indicates a gas introduction nozzle, reference numeral 256 indicates a gas pore, reference numeral 257 indicates a gas introducing port, reference numeral 258 indicates a joint part, and reference numeral 259 indicates a gas supply port. The gas for generating the plasma from the gas introduction nozzle 255 is discharged from the gas pore 256, and the gas is supplied to the gas introduction chamber 254, and the gas from the gas introduction chamber 254 is supplied, through the cut-out portion 271 which is formed in the upper part of the separating wall 252, to the gas activation chamber 253.

In the gas activation chamber 253, the two sheath pipes 272 made of an dielectric material (for example, ceramics) are disposed to extend along the separating wall 252 from the base end to the head end of the activation chamber 253. In the sheath pipes 272, the cylindrical electrodes 273 are inserted. The base ends of these electrodes 273 are pulled out to the outside of the injector body 251 and connected in the outside of the vacuum chamber 1 to the RF power supply 275 via the matching unit 274. On the bottom of the injector body 251, the gas discharge holes 291 for discharging the plasma, generated and activated by the plasma generating part 290 located at the gap between the electrodes 273, to the lower part side are arrayed in the longitudinal direction of the injector body 251.

The injector body 251 is arranged so that the head end of the injector body 251 projects to the central part of the turntable 2. In FIG. 22, reference numerals 262 to 264 indicate the valves, reference numerals 265 to 267 indicate the flow rate adjustment parts, and reference numerals 268 to 270 indicate the gas sources storing oxygen (O2) gas, argon (Ar) gas and nitrogen (N2) gas as the plasma generating gases, respectively.

Next, operation of the substrate processing apparatus of this embodiment will be described. In this embodiment, five wafers W are placed on the turntable 2, the turntable 2 is rotated, and the BTBAS gas, the O3 gas, the ethanol gas and the nitrogen gas from the gas nozzles 31, 32, 200, 41 and 42 are supplied to the wafers W, respectively, and the purge gas is supplied to the central part area C and the lower part area of the turntable 2 as described above. The heater unit 7 is operated to supply the plasma generating gas (for example, Ar gas) to the plasma injector 250, and the RF power supply 275 is operated to supply to the plasma generating part 290 (the electrodes 273) the RF power in a range of 10 W-200 W (for example, 10 W) at 13.56 MHz.

The inside of the vacuum chamber 1 is changed to a vacuum pressure atmosphere. The plasma generating gas entering the upper portion of the gas activation chamber 253 is in the activated state where the plasma is generated by the supplied power (activation), and it is supplied to each wafer W through the gas discharge holes 291.

The plasma passes through the second processing area 92 and reaches the wafer W on which the silicon oxide film 242 is formed. The carbon and the moisture remaining in the silicon oxide film 242 are vaporized and discharged, or the bond between silicon and oxygen in the silicon oxide film 242 is strengthened. In this way, the supply of the plasma is performed each time the turntable 2 is rotated until the film deposition process is completed. Subsequently, after the wafer W is taken out from the vacuum chamber 1 and the direction of the wafer W is changed, the heat processing is performed in the heat processing device 102 as described above.

Therefore, by arranging the plasma injector 250, it is possible to form the silicon oxide film 242 with a good bonding strength and the reduced impurities.

In this example, the Ar gas is used as the plasma generating gas. Alternatively, O2 gas or N2 gas may be used in addition to the Ar gas. When the Ar gas is used, the effects of increasing the Si—O bonding strength in the film and reducing the SiOH bonding strength may be acquired. When the O2 gas is used, the effects of promoting the oxidation of the non-reacted portion in the film, reducing the C (carbon) component in the film, and improving the electrical properties may be acquired.

The plasma injector 250 of this embodiment may be applied to the film deposition device 101 of the second embodiment or the third embodiment.

In the above-mentioned embodiment, the heat processing device 102 which performs heat processing of one wafer at a time is used. Alternatively, a heat processing device which performs heat processing of two or more wafers (for example, five wafers) simultaneously may be used.

Figure 25:
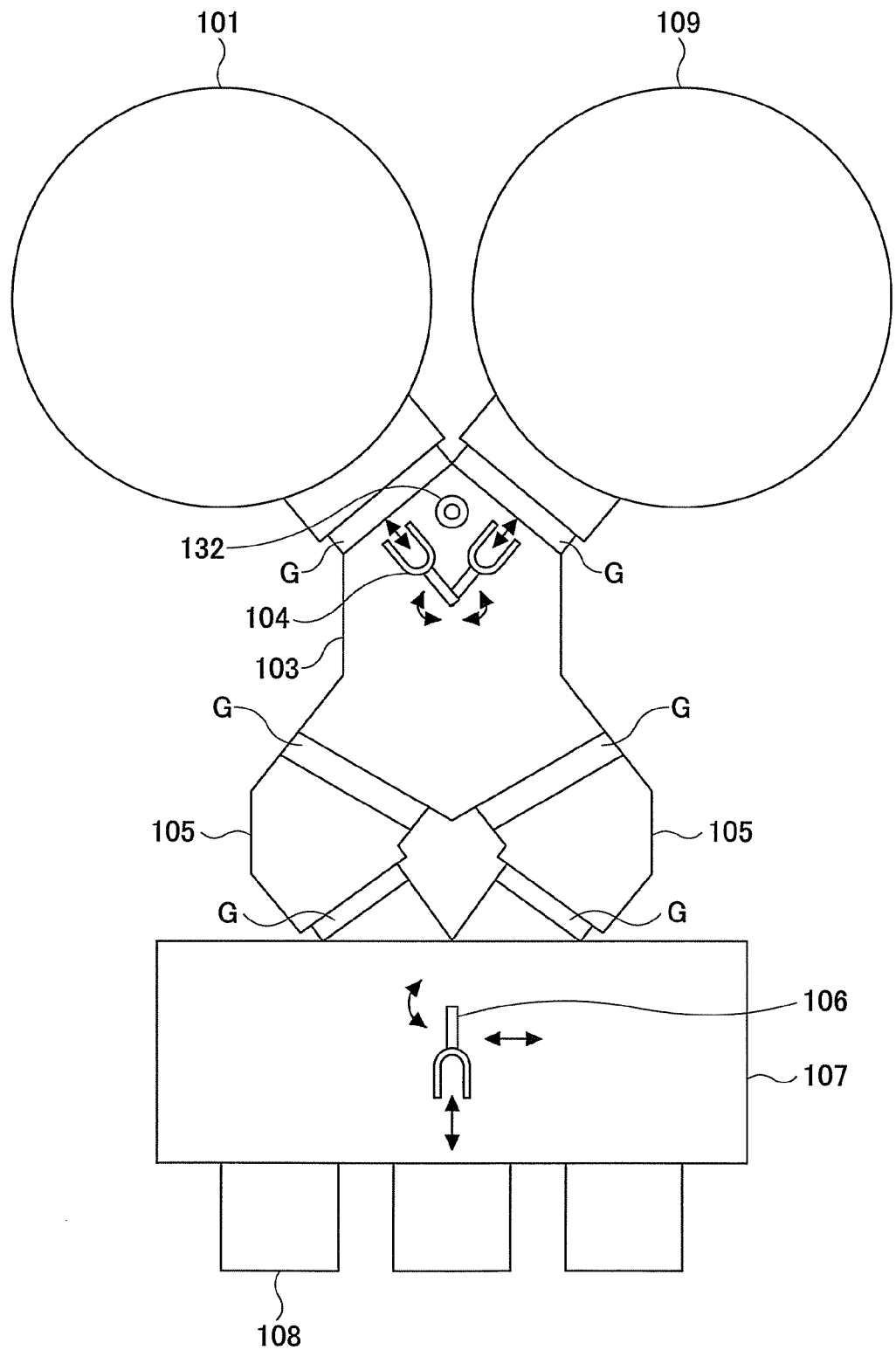
FIG. 25 is a plan view illustrating the composition of a substrate processing apparatus of another embodiment of the invention.

The substrate processing apparatus of the fifth embodiment is provided with a heat processing device 109 as illustrated in FIG. 25. Specifically, the heat processing device 109 is airtightly connected to the vacuum conveying chamber 103. This heat processing device 109 has the same composition as the film deposition device 101 described above. For example, in the heat processing device 109, instead of the nozzles 31, 32 and 200, the nozzles to supply the inert gas (for example, N2 gas) are arranged. In the heat processing device 109, the heater unit 7 is arranged so that the wafers W on the turntable 2 can be heated to the same heating temperature as in the heating unit 113 in the heat processing device 102.

When the film deposition process is performed in the substrate processing apparatus of this embodiment, the wafer W for which the film deposition process has been performed is taken out from the film deposition device 101, conveyed to the vacuum conveying chamber 103 and caused to rotate around a vertical axis. Subsequently, the wafer W is placed on the turntable 2 of the heat processing device 109. Similarly, the wafers W are taken out from the film deposition device 101 sequentially and each wafer W is caused to rotate, and the respective wafers W are conveyed and placed on the turntable 2 of the heat processing device 109 by rotating the turntable 2 of the heat processing device 109 intermittently. Subsequently, the inert gas is supplied to the vacuum chamber 1 in the heat processing device 109 while the turntable 2 is rotated, and the pressure within the vacuum chamber 1 is adjusted to the predetermined vacuum pressure, and the wafers W are heated to the above-mentioned heating temperature.

By performing the heat processing, the silicon oxide films 242 of the wafers W are closely packed simultaneously. Subsequently, the wafers W are taken out from the film deposition device 109 and returned to the film deposition device 10 sequentially, and the subsequent steps of the film deposition process are performed for the wafers W in the film deposition device 101.

In this embodiment, the advantageous effects of the above-described embodiments can be acquired, and the heat processing of the wafers W can be performed one at a time, which makes it possible to raise throughput.

Alternatively, the above-described substrate processing apparatus may be arranged so that the heat processing device 102 is airtightly connected to the vacuum conveying chamber 103, and the heat processing device 102 is arranged to perform the heat processing. Any of the film deposition devices in the above-described embodiments may be applied to the film deposition device 101 of this embodiment.

In the above-described embodiment, the substrate rotating process to cause the wafer W to rotate is performed between the film deposition process and the heat processing. Alternatively, the substrate rotating process may be performed after the heat processing. That is, changing the direction of the wafer W may be performed between the preceding film deposition process and the following film deposition process. The above-described substrate rotating unit 132 may be arranged in the heat processing device 102 (109). Also in such a case, the vacuum conveyance arm 104 is moved to the upper position of the substrate rotating unit 132, and the rotation of the wafer W is performed similarly.

Alternatively, not only the device to lift the lifting pin 119 but also the device to cause the lifting pin 119 to rotate around a vertical axis may be added to the lifting actuator 121 in the heat processing device 102. The rotation of the wafer W may be performed in the heat processing device 102 before or after the heat processing is performed or at the same time as the heat processing is performed. The substrate rotating unit 132 may be arranged in the air conveying chamber 107 so that the wafer W may be caused to rotate in the air conveying chamber 107.

Figure 26A:
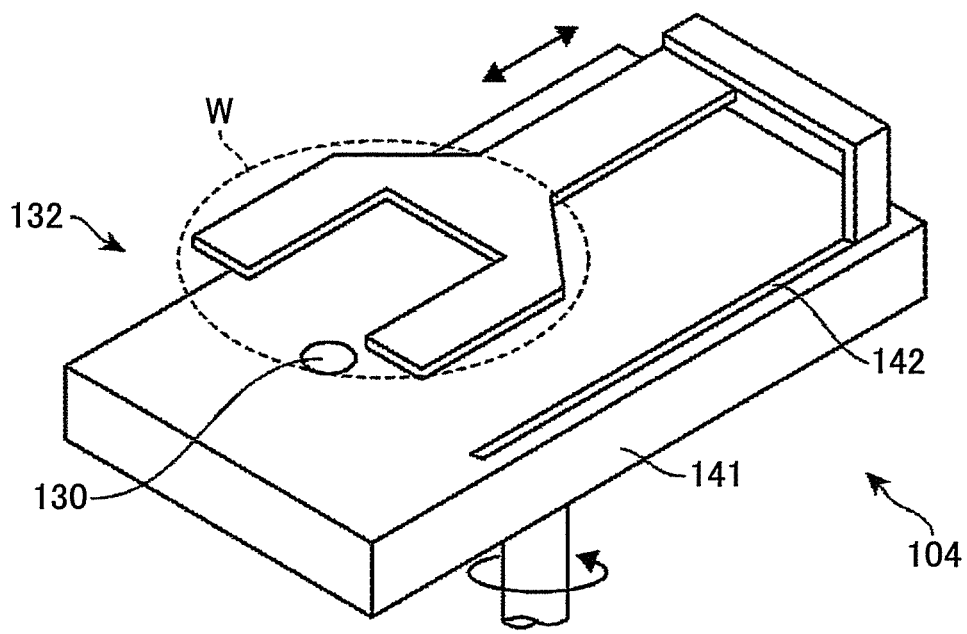
FIG. 26A and FIG. 26B are diagrams illustrating a device which causes a substrate to rotate around its axis in the substrate processing apparatus.
Figure 26B:
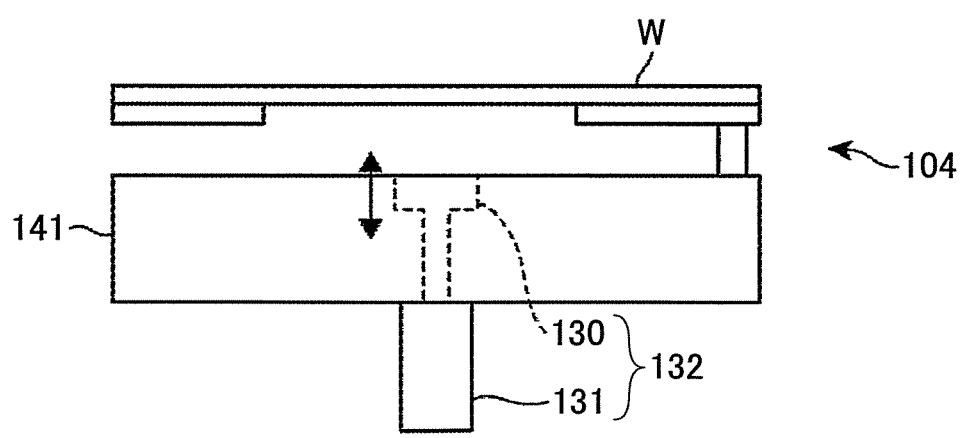

In order to cause the wafer W to rotate, the substrate rotating unit 132 is arranged in the vacuum conveying chamber 103 in the above-described embodiment. Alternatively, the substrate rotating unit 132 may be coupled with the vacuum conveyance arm 104. As an example, the vacuum conveyance arm 104 may be arranged as illustrated in FIGS. 26A and 26B. In this example, the slide arm which is movable along the rail 142 formed on the support plate 141 is arranged. The substrate rotating unit 132 is arranged in each vacuum conveyance arm 104 and held in each support plate 141, and, when the conveyance arm 104 is moved back to the base end, the wafer W held on the conveyance arm 104 may be lifted and caused to rotate around a vertical axis.

Alternatively, instead of the above-described air conveyance arm 106, the vacuum conveyance arm 104 may be arranged in the air conveying chamber 107, so that the wafer W may be caused to rotate in the air conveying chamber 107. Alternatively, the substrate rotating unit in the above-mentioned embodiment may be arranged to clamp the wafer W at its diametrical positions from the upper part, lift the wafer W and cause it to rotate around a vertical axis.

Besides the above-mentioned example (BTBAS), the reactive gases that may be used as the first reactive gas in the substrate processing apparatus according to the invention are dichlorosilane (DCS), hexachlorodisilane (HCD), trimethyl aluminum (TMA), tetrakis-ethyl-methyl-amino-zirconium (TEMAZr), tris(dimethyl amino) silane (3DMAS), tetrakis-ethyl-methyl-amino-hafnium (TEMHf), bis(tetra methyl heptandionate) strontium $(Sr(THD)_2)$, (methyl-pentadionate)(bis-tetra-methyl-heptandionate) titanium (Ti(MPD) (THD)), monoamino-silane, or the like.

It is preferred that the width of the upstream part of the top surface 44 of the isolation area D, relative to the separating gas nozzles 41 and 42 in the direction of rotation of the turntable 2 is as large as possible. This is because the flow rate of the gas which goes to the isolation area D from the upstream by the rotation of the turntable 2 is highest at the outer peripheral area. From the viewpoint of increasing the width of the outer peripheral area, the provision of the sector-form projection 4 as described above is desirable.

Figure 27A:
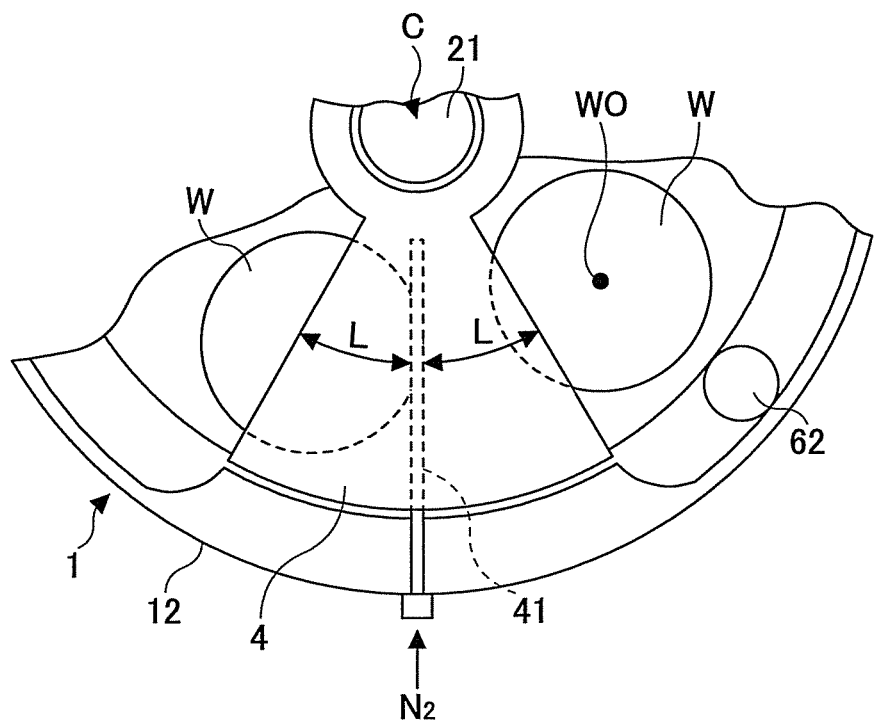
FIG. 27A and FIG. 27B are diagrams illustrating a preferred composition of the film deposition device.
Figure 27B:
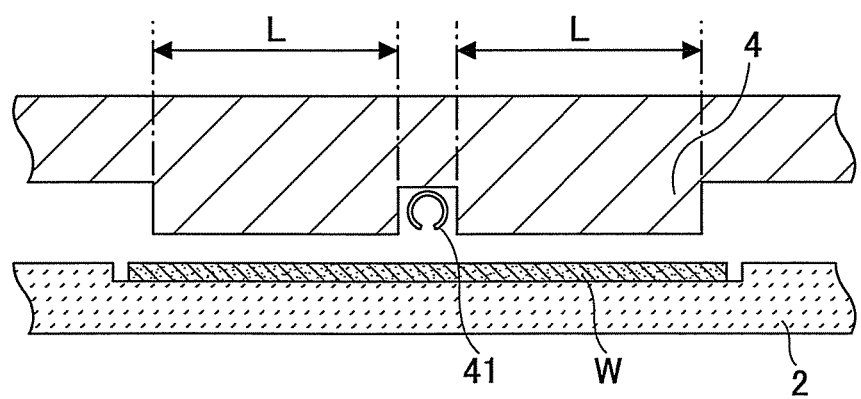

When the wafer W with the diameter of 300 mm is used, it is preferred that the first undersurface portion 44 which forms the narrow space on both sides of the separating gas nozzle 41 (42) has a width dimension L of 50 mm or larger at the portion where the center WO of the wafer W passes along the rotational direction of the turntable 2 as illustrated in FIGS. 27A and 27B (in which the separating gas nozzle 41 is typically illustrated). When the width dimension L is small, it is necessary to make the distance between the first undersurface portion 44 and the turntable 2 small in accordance with the small width dimension L, in order to effectively prevent entry of the reactive gas to the space beneath the projection 4 (the narrow space) from both sides of the projection 4. The rotational speed of the turntable 2 is highest at the outer peripheral end thereof. If the distance between the first undersurface portion 44 and the turntable 2 is set to a certain dimension, the width dimension L of the first undersurface portion 44 needed for the outer peripheral end of the turntable 2 must be large enough to effectively prevent entry of the reactive gas to the space beneath the projection 4.

If the width dimension L of the first undersurface portion 44 at the portion where the center WO of the wafer W passes along the rotational direction of the turntable 2 is smaller than 50 mm, it is necessary to make the distance of the first undersurface portion 44 and the turntable 2 very small. In this case, in order to prevent the collision between the turntable 2 or the wafer W and the undersurface portion 44 when the turntable 2 is rotated, a certain mechanism for reducing the vibrations of the turntable 2 as much as possible must be arranged additionally. When the rotational speed of the turntable 2 is high, the reactive gas from the upstream side of the projection 4 easily enters the space beneath the projection 4. For this reason, if the width dimension L is smaller than 50 mm, the rotational speed of turntable 2 must be made as low as possible, and in such a case, it is difficult to obtain high throughput. Although it is preferred that the width dimension L is 50 mm or larger, the advantageous effect of the invention may be acquired even when the width dimension L is 50 mm or smaller. In other words, it is preferred that the width dimension L is in a range between 1/10 and 1/1 of the diameter of the wafer W, and it is more preferred that it is equal to about 1/6 of the wafer W or larger.

Next, a description will be given of the composition of a film deposition device of another embodiment of the invention which includes a different layout of the processing areas 91 and 92 and the isolation area.

Figure 28:
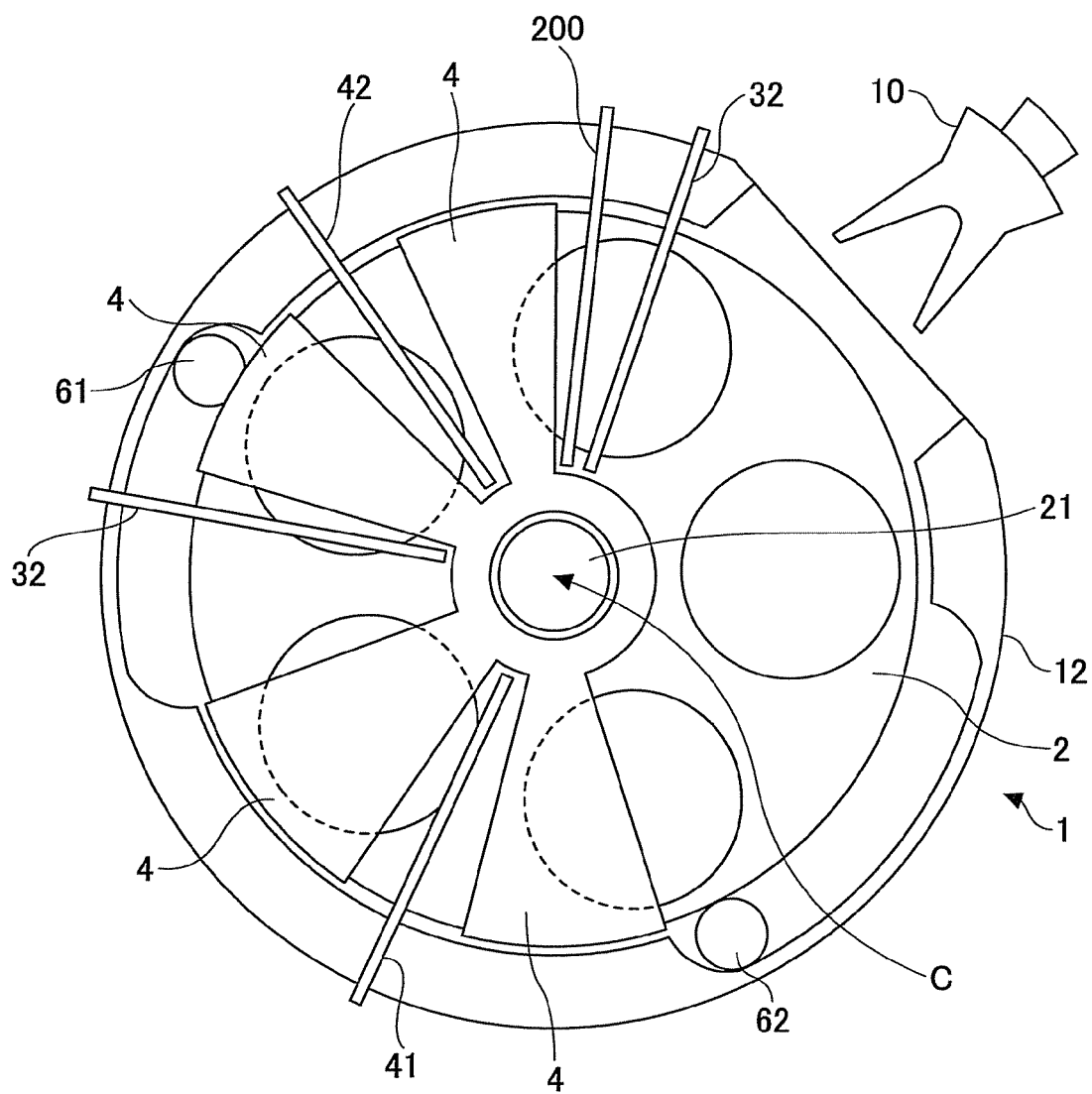
FIG. 28 is a plan view illustrating the composition of another embodiment of the film deposition device.

The isolation area D may be divided into two sector-form projections 4 in the peripheral direction and the separating gas nozzle 41 (42) may be disposed between the projections 4. FIG. 28 is a plan view illustrating the composition of the film deposition apparatus of another embodiment of the invention having such a structure. In this case, the magnitude of the sector-form projection 4 and the distance between the projection 4 and the separating gas nozzle 41 (42) is set by taking into consideration the discharge flow rate of the separating gas, the discharge flow rate of the reactive gas, etc., so that the isolation area D can provide effective segregation.

In the above-mentioned embodiment, the first processing area 91 and the second processing area 92 are equivalent to the areas where the undersurface portion thereof is higher than the undersurface portion of the isolation area D. Alternatively, at least one of the first processing area 91 and the second processing area 92 may be similar to the isolation area D. Namely, at least one of the first processing area 91 and the second processing area 92 may be disposed to face the turntable 2 at the location on both sides of the reactive gas supplying unit in the rotational direction and to form the space for preventing entry of gas into the turntable 2. At least one of the first processing area 91 and the second processing area 92 may have the undersurface portion the height of which is the same as that of the first undersurface portion 44 of the isolation area D, and is lower than the undersurface portion (the second undersurface portion 45) of the isolation area D.

In the above-described embodiments, the composition of the film deposition device in which the turntable 2 is rotated around a vertical axis relative to the gas supplying units (the nozzles 31, 32, 200, 280, 41 and 42) is used. Alternatively, the composition may be modified so that the gas supplying units are rotated around a vertical axis relative to the turntable 2.

Next, a description will be given of the composition of the film deposition device of this type by using the third embodiment (in which the nozzles 200 and 280 are not provided) as a typical example with reference to FIGS. 29 to 32. In FIGS. 29 to 32, the elements which are the same as corresponding elements of the film deposition device 101 described above are designated by the same reference numerals, and a description thereof will be omitted.

In the vacuum chamber 1, a susceptor 300 which is a table is arranged instead of the above-mentioned turntable 2. The upper end of the rotating shaft 22 is connected to the bottom in the center of the susceptor 300, and the susceptor 300 is arranged to be rotatable around a vertical axis when the delivery of the wafer W is performed. The recesses 24 are arranged on the susceptor 300 at a plurality of places (for example, five places) in the circumferential direction thereof.

Figure 29:
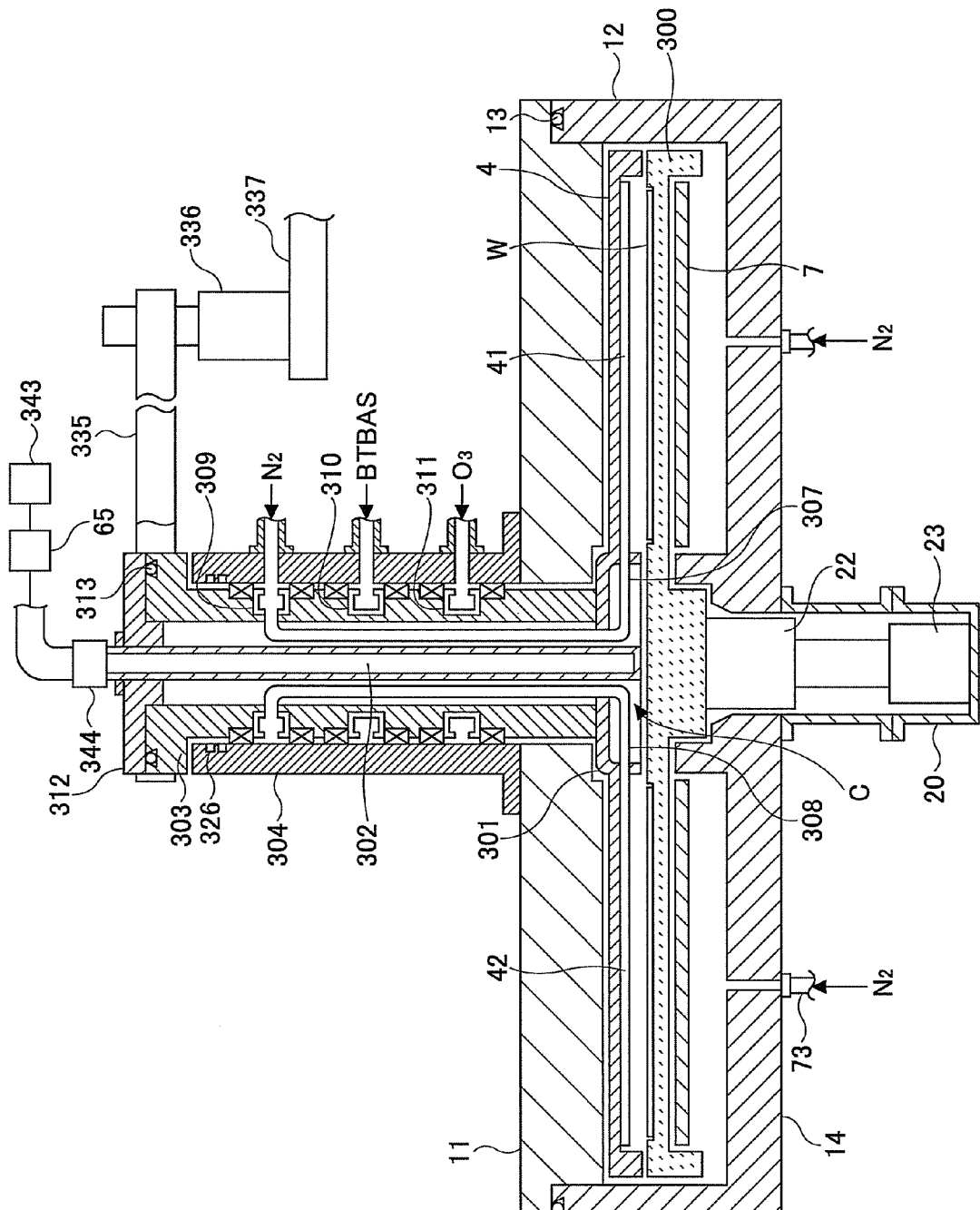
FIG. 29 is a cross-sectional view illustrating the composition of another embodiment of the film deposition device.
Figure 30:
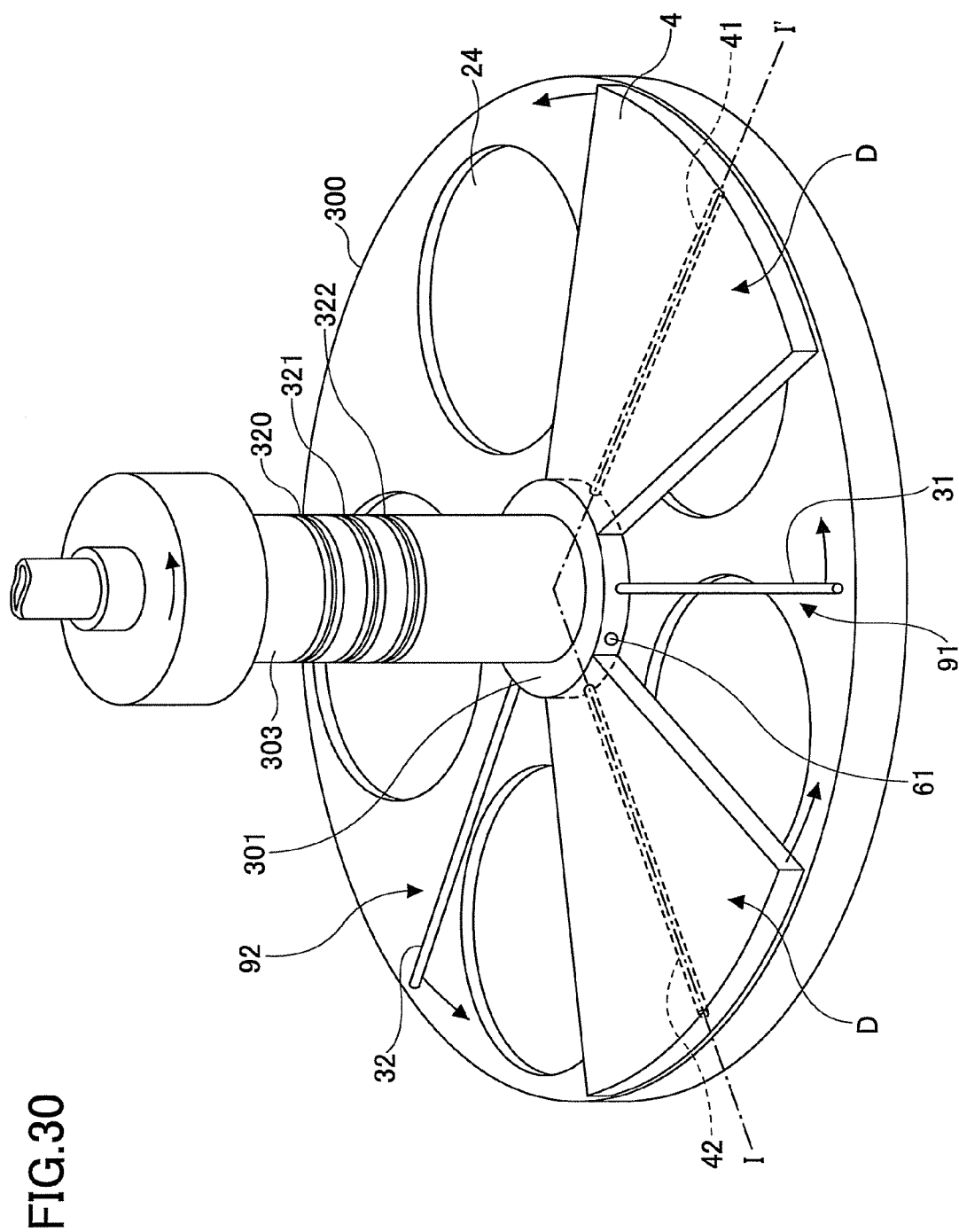
FIG. 30 is a perspective view illustrating the composition of another embodiment of the film deposition device.
Figure 31:
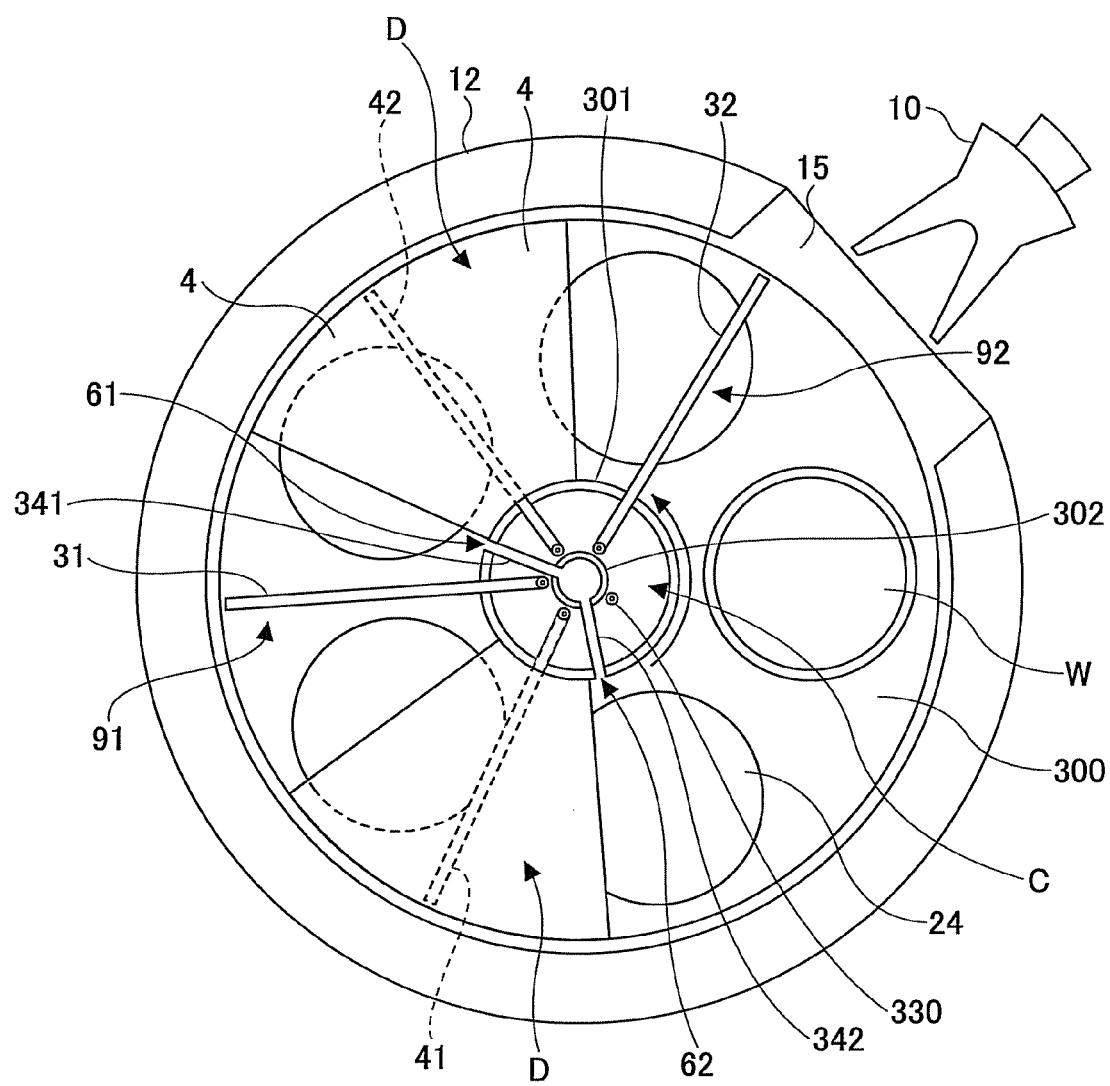
FIG. 31 is a plan view illustrating the composition of another embodiment of the film deposition device.

As illustrated in FIGS. 29 to 31, the nozzles 31, 32, 41 and 42 are attached to a flat, disc-like core part 301 disposed above the center part of the susceptor 300, and the base end of each gas supply nozzle penetrates the sidewall of the core part 301.

The core part 301 is arranged to be rotatable counterclockwise around a vertical axis. Each of the gas supply nozzles 31, 32, 41 and 42 can be rotated around a vertical axis in the upper position of the susceptor 300 by rotating the core part 301. FIG. 30 illustrates the state where the sleeve 304 fixed to the upper surface of the vacuum chamber 1 (with the top plate 11 and the container body 12) and the top plate 11 is removed.

The projections 4 are fixed to the wall part of the core part 301. The projections 4 are arranged to be rotatable above the susceptor 300 together with the gas supply nozzles 31, 32, 41, and 42. As illustrated in FIG. 30 and FIG. 31, two exhaust ports 61 and 62 are arranged at the wall part of the core part 301 in the upstream position of each of the reactive gas feeding nozzles 31 and 32 in the rotational direction. The exhaust ports 61 and 62 are connected to the exhaust pipe 302 respectively, and function to discharge the reactive gases and the separating gas sent from the processing areas 91 and 92.

Similar to the previously described embodiment, the exhaust ports 61 and 62 are arranged on both sides of the isolation area D in the rotational direction to discharge the reactive gases (the BTBAS gas and the O3 gas) for this purpose only.

As illustrated in FIG. 29, the bottom end of the rotating cylinder 303 is connected to the upper surface of the center part of the core part 301. By rotating the rotating cylinder 303 within the sleeve 304 fixed to the top plate 11 of the vacuum chamber 1, the nozzles 31, 32, 41 and 42 and the projections 4 are rotated within the vacuum chamber 1 together with the core part 301. The inside of the core part 301 contains the space in which the underside surface is open, and the reactive gas feeding nozzles 31 and 32 and the separating gas feeding nozzles 41 and 42, passing through the sidewall of the core part 301, are connected in this space to the first reactive gas feed pipe 305 that supplies the BTBAS gas, the second reactive gas feed pipe 306 that supplies the O3 gas, and the separating gas feed pipes 307 and 308 which supply the N2 gas which is the separating gas. For the sake of convenience, in FIG. 29, only the separating gas feed pipes 307 and 308 are illustrated.

Each of the feed pipes 305 to 308 is arranged so that the pipe is curved into an L-shape near the center of rotation of the core part 301 around the exhaust pipe 302, extended upward to pass through the top surface of the core part 301, and further extended in the inside of the rotating cylinder 303 to the upper part.

As illustrated in FIGS. 29, 30 and 31, the rotating cylinder 303 is arranged in a formation in which two cylinders with different outside diameters are stacked together. The bottom of the upper cylinder with the large diameter in the rotating cylinder 303 is disposed on the upper end surface of the sleeve 304, and the rotating cylinder 303 is inserted in the sleeve 304 in the state in which the cylinder 303 is rotatable in the circumferential direction. The bottom end of the rotating cylinder 303 penetrates the top plate 11 and is connected to the upper surface of the core part 301.

The peripheral surface of the rotating cylinder 303 at the upper position of the top plate 11 is formed with gas diffusion passages which are annular passages extending fully in the circumferential direction of the peripheral surface and spaced apart from each other in a vertical direction.

In the present embodiment, a separating gas diffusion passage 309 for diffusing the separating gas (N2 gas) is arranged at the upper position, a first reactive gas diffusion passage 310 for diffusing the BTBAS gas is arranged at the middle position, and a second reactive gas diffusion passage 311 for diffusing the O3 gas is arranged at the lower position. In FIG. 29, reference numeral 312 indicates a lid part of the rotating cylinder 303, and reference numeral 313 indicates an O ring to fit the lid part 312 and the rotating cylinder 303 closely.

In the gas diffusion passages 309-311, the slits 320, 321 and 322 which provide an opening to the external surface of the rotating cylinder 303 respectively are formed to cover the whole periphery of the rotating cylinder 303. The respective gases are supplied to the gas diffusion passage 309-311 through these slits 320, 321 and 322.

On the other hand, in the sleeve 304 enclosing the rotating cylinder 303, the gas supply ports 323, 324, and 325 which are gas supply openings are arranged at the height positions corresponding to the slits 320, 321 and 322 respectively. The gases supplied to the gas supply ports 323, 324 and 325 from the gas supply sources (not illustrated) are supplied to the gas diffusion passages 309, 310 and 311 through the slits 320, 321 and 322 which are open to the ports 323, 324 and 325 respectively.

The rotating cylinder 303 inserted in the sleeve 304 is formed with an outside diameter that is nearly equal to the inside diameter of the sleeve 304, such that the rotating cylinder 303 is rotatable to the sleeve 304. The slits 320, 321 and 322 in the areas other than the opening areas of the ports 323, 324 and 325 are closed by the inner circumferential surface of the sleeve 304. As a result, the gases introduced to the gas diffusion passages 309, 310 and 311 are diffused only in the inside of the gas diffusion passages 309, 310 and 311. Leaking of the gases from the other areas of the gas diffusion passages 309, 310 and 311 or the vacuum chamber 1 to the outside of the film deposition device can be prevented. In FIG. 29, reference numeral 326 indicates a magnetic seal for preventing the leaking of the gas from the gap between the rotating cylinder 303 and the sleeve 304. The magnetic seal 326 is disposed at each of the upper and lower sides of the gas diffusion passages 309, 310 and 311, so that the gases in the gas diffusion passages 309, 310 and 311 are sealed safely. In FIG. 29, the illustration of these magnetic seals 326 is omitted for the sake of convenience. Also in FIG. 32, the illustration of the magnetic seals 326 is omitted.

Figure 32:
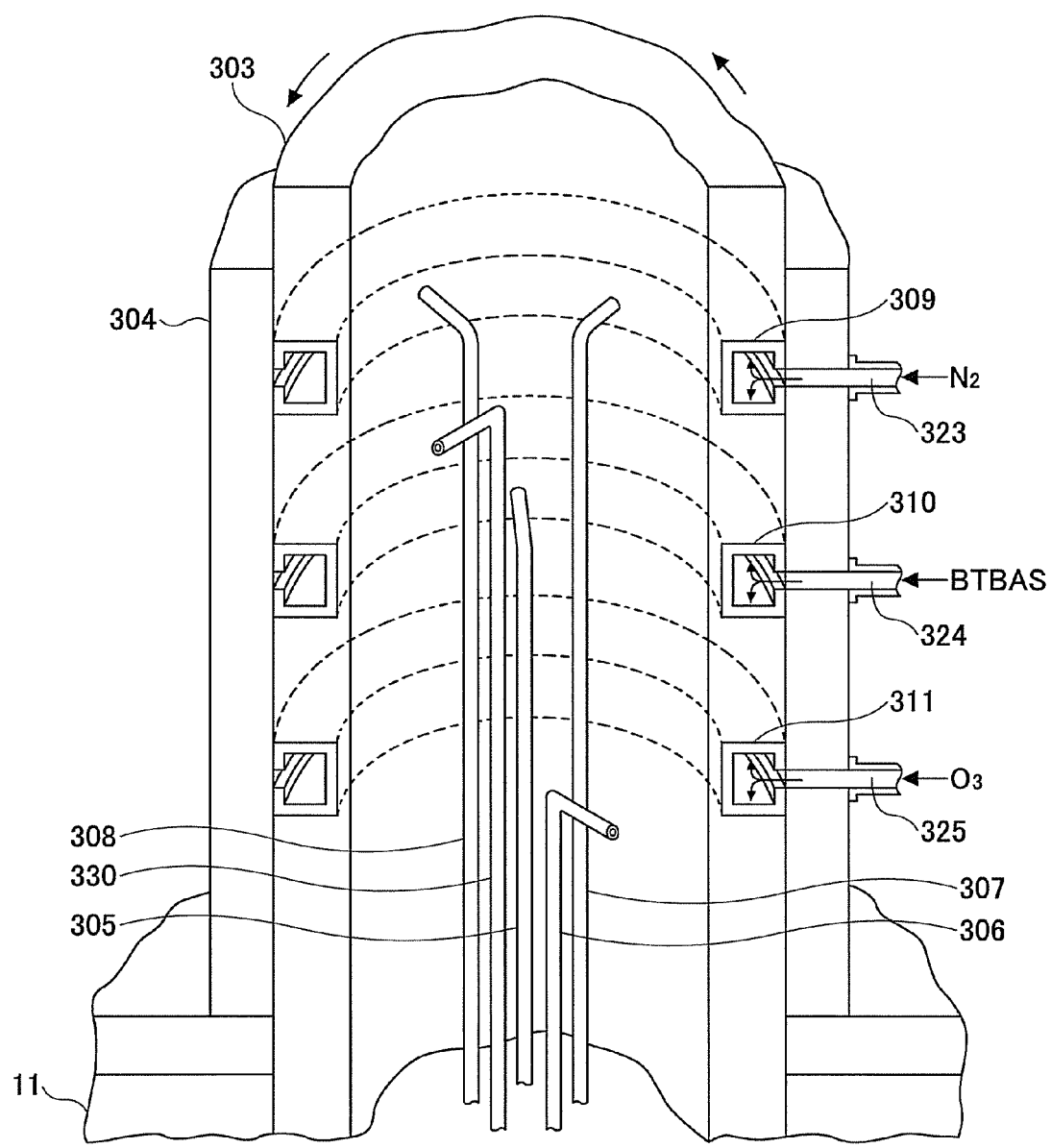
FIG. 32 is a perspective view illustrating the composition of another embodiment of the film deposition device.

As illustrated in FIG. 32, on the inner circumferential surface of the rotating cylinder 303, the gas supply lines 307 and 308 are connected to the gas diffusion passage 309, and the gas supply lines 305 and 306 are connected to the gas diffusion passages 310 and 311, respectively. The separating gas supplied from the gas supply port 323 is diffused in the gas diffusion passage 309 and supplied to the nozzles 41 and 42 through the gas supply lines 307 and 308, and the reactive gases supplied from the gas supply ports 324 and 325 are diffused in the gas diffusion passages 310 and 311 respectively and supplied to the nozzles 31 and 32 through the gas supply lines 305 and 306 respectively and supplied to the inside of the vacuum chamber 1. In FIG. 32, the illustration of the exhaust pipe 302 is omitted for the sake of convenience.

As illustrated in FIG. 32, the purge gas feed pipe 330 is further connected to the separating gas diffusion passage 309. The purge gas feed pipe 330 is extended downward in the inside of the rotating cylinder 303, and, as illustrated in FIG. 31, the purge gas feed pipe 330 is open to the space in the core part 301, so that the N2 gas can be supplied to the space.

For example, as illustrated in FIG. 29, the core part 301 is supported by the rotating cylinder 303 in the floated state where a certain gap between the core part 301 and the susceptor 300 is provided. The core part 301 is not secured to the susceptor 300 and it is freely rotatable to the susceptor 300. However, if the gap between the susceptor 300 and the core part 301 is open, there is a possibility that the BTBAS gas or the O3 gas may flow from one of the processing areas 91 and 92 to the other via the lower part of the core part 301.

To avoid the problem, the inside of the core part 301 is formed into a cavity, the underside side of the cavity is open to the susceptor 300. The purge gas (N2 gas) from the purge gas feed pipe 330 is supplied to the cavity of the core part 301, and the purge gas is caused to flow into each of the processing areas 91 and 92 through the gap between the core part 301 and the susceptor 300. Hence, the flowing-in problem of the reactive gas can be prevented.

The film deposition device of this embodiment is partitioned into the central part of the susceptor 300 and the vacuum chamber 1, in order to separate the atmospheres of the processing areas 91 and 92 from each other, and the film deposition device is provided with the central part area C in which the discharge holes for discharging the purge gas to the surface of the susceptor 300 are arranged along the rotational direction of the core part 301. In this case, the purge gas plays the role of the separating gas for preventing the flowing of the BTBAS gas or the O3 gas via the lower part of the core part 301 into the processing areas 91 and 92. The discharge holes are equivalent to the gap between the sidewall of the core part 301 and the susceptor 300.

As illustrated in FIG. 29, the driving belt 335 is wound around the side circumference of the cylinder with the large outside diameter of the rotating cylinder 303. The driving belt 335 transmits a driving force of the actuator 336 (which is a rotation device arranged above the vacuum chamber 1) to the core part 301, so that the rotating cylinder 303 is rotated within the sleeve 304 by the driving force. In FIG. 29, reference numeral 337 indicates a holding part for holding the actuator 336 in the upper position of the vacuum chamber 1.

In the rotating cylinder 303, the exhaust pipe 302 is arranged along the center of rotation of the cylinder 303. The bottom end of the exhaust pipe 302 penetrates the upper surface of the core part 301, and extends to the space in the core part 301, and the lower end surface is sealed. In the side circumference of the exhaust pipe 302 extending in the core part 301, the exhaust receiving tubes 341 and 342 connected to the exhaust ports 61 and 62 are arranged, as illustrated in FIG. 31. The exhaust gases from the processing areas 91 and 92 can be flowed into the exhaust pipe 302 while they are isolated from the atmosphere in the core part 301 filled with the purge gas.

In FIG. 32, the illustration of the exhaust pipe 302 is omitted for the sake of convenience as mentioned above. However, the gas supply lines 305, 306, 307 and 308 and the purge gas feed pipe 330 illustrated in FIG. 32 are arranged around the periphery of the exhaust pipe 302.

As illustrated in FIG. 29, the top end of the exhaust pipe 302 penetrates the lid part 312 of the rotating cylinder 303, and is connected to the vacuum pump 343 which is an evacuation unit. In FIG. 29, reference numeral 344 indicates a rotary joint which connects the exhaust pipe 302 rotatably to the downstream piping.

A description will be given of the film deposition process performed by the film deposition device 101 of this embodiment only with respect to the points that differ from the operation of the previously described embodiment.

First, when conveying the wafers W to the vacuum chamber 1, the susceptor 300 is rotated intermittently and the wafers W are respectively placed in the five recesses 24 in accordance with the action of the conveyance arm 10 and the lifting pins 16. When heating the wafers W in the film deposition device 101, the rotating cylinder 303 is rotated counterclockwise. The gas diffusion passages 309-312 arranged in the rotating cylinder 303 are rotated in accordance with the rotation of the rotating cylinder 303 as illustrated in FIG. 32. The parts of the slits 320-322 formed in the gas diffusion passages 309-311 are normally open to the corresponding openings of the gas supply ports 323-325 respectively, and the respective gases are continuously supplied to the gas diffusion passages 309-312.

The respective gases supplied to the gas diffusion passages 309-312 are supplied from the reactive gas feeding nozzles 31 and 32 and the separating gas feeding nozzles 41 and 42 to each of the processing areas 91 and 92 and the isolation area D through the gas supply lines 305-308 connected to the gas diffusion passages 309-312. The gas supply lines 305-308 are fixed to the rotating cylinder 303, and the reactive gas feeding nozzles 31 and 32 and the separating gas feeding nozzles 41 and 42 are fixed to the rotating cylinder 303 through the core part 301. In accordance with the rotation of the rotating cylinder 303, the gas supply lines 305-308 and the gas supply nozzles 31, 32, 41 and 42 are rotated and the respective gases are supplied to the vacuum chamber 1.

At this time, the N2 gas which is the separating gas is supplied from the purge gas feed pipe 330 which is rotated integrally with the rotating cylinder 303, and the N2 gas is discharged to the surface of the susceptor 300 from the central part area C (the area between the sidewall part of the core part 301 and the central part area of the susceptor 300).

The exhaust ports 61 and 62 are located in the sidewall part of the core part 301 along the space on the side of the lower part of the second top surface 45 where the reactive gas feeding nozzles 31 and 32 are arranged. The pressure in the space on the side of the lower part of the second top surface 45 is lower than the pressure in the narrow space on the side of the lower part of the first top surface 44 and in the central part area C. Therefore, the BTBAS gas and the O3 gas are discharged independently without being mixed, similar to the previously described film deposition device.

Therefore, each wafer W on the susceptor 300 sequentially passes through each of the processing areas 91 and 92 and the isolation area D, so that the film deposition process of the wafer W is performed as mentioned above.

After the silicon oxide film 242 of a predetermined thickness is deposited on the wafer W, the wafer W is taken out from the vacuum chamber 1 at a predetermined timing and caused to rotate around a vertical axis.

Similarly, in this embodiment, the film deposition process can be performed with good uniformity of the film thickness in the surface and the same effect is obtained. The film deposition device 101 may be provided with the auxiliary gas nozzle 200 and the third reactive gas nozzle 280. In such a case, the gas supply line contained in the rotating cylinder 303 is connected to the nozzles 200 and 280, similar to the gas nozzles 31, 32, 41 and 42 in this embodiment and each gas is supplied through the slits formed in the sleeve 304. In addition, the above-described plasma injector 250 may be formed in the film deposition device 101.

Next, a simulation which has been performed to evaluate the improvement of the uniformity of the film thickness in the surface when the above-described film deposition method is used will be described.

The simulation has been performed on the following conditions.

The Simulation Conditions:
the rotational speeds of the turntable 2: 120 rpm, 240 rpm
the target thickness T: approximately 155 nm
the number of times of rotation of the wafer: None (a comparative example), 1 time (rotation angle: 180 degrees), 8 times (rotation angle: 45 degrees), 4 times (rotation angle: 90 degrees)

When each wafer W is caused to rotate on its axis, the rotation is made by the same rotational angle for each of the simulation conditions. The measurement (calculation) of a film thickness is performed at 49 points along the circumferential direction for each wafer W. As for the simulation in which the number of times of rotation of the wafer W is 8 times or 4 times, the film thickness of the wafer W is measured at eight points or four points along the radial direction, and the average of the measured thicknesses is computed respectively.

Figure 33:
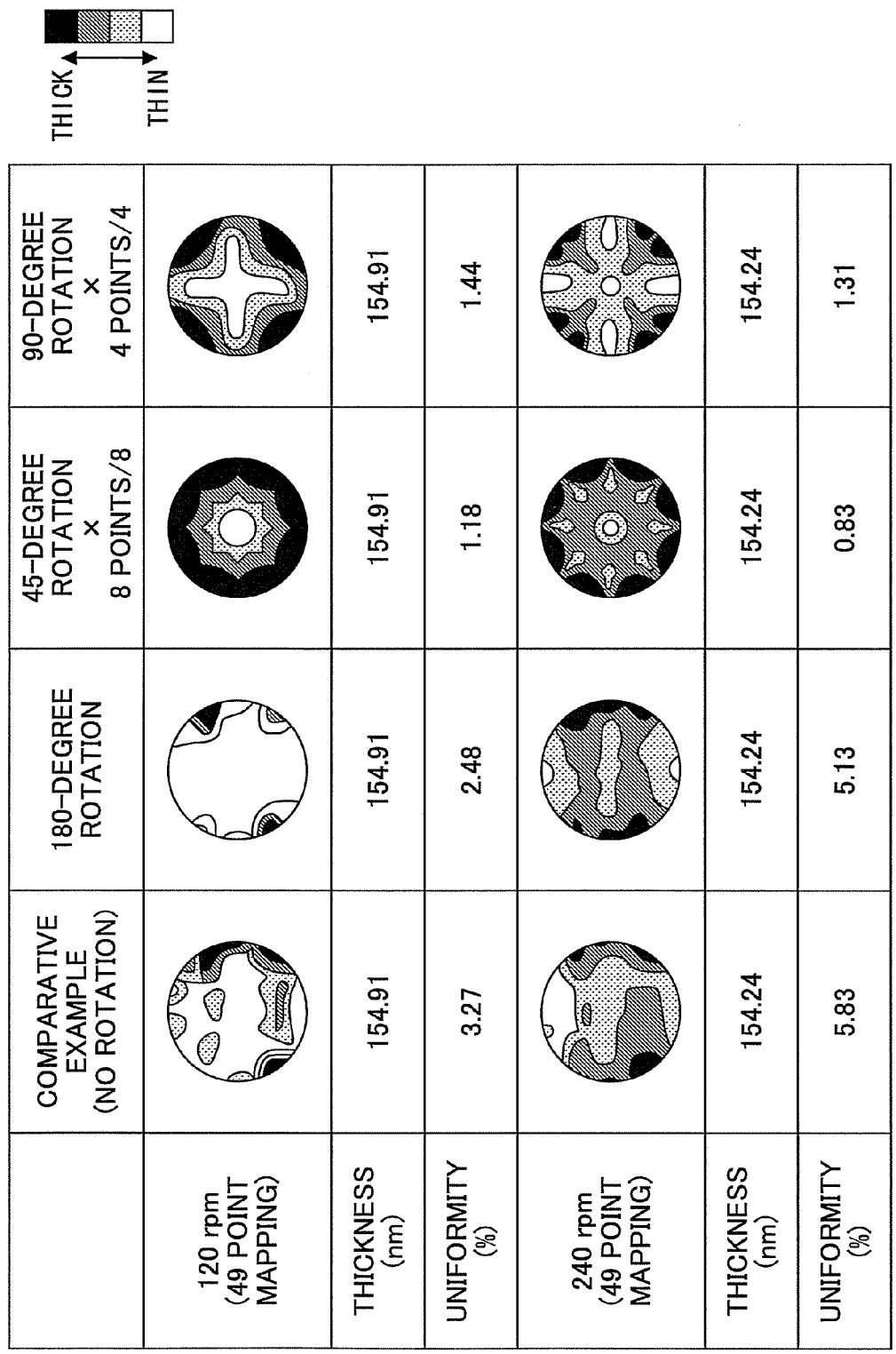
FIG. 33 is a diagram for explaining the simulation result obtained in the substrate processing apparatus of an embodiment of the invention.

The result of the simulation indicates that the uniformity of the film thickness in the surface has improved even when the wafer W is caused to rotate one time, and as the number of times of rotation of the wafer increases, the uniformity improves more greatly as illustrated in FIG. 33. It has been confirmed that when the wafer W is caused to rotate 8 times, the amount of variation in the film thickness in the surface on the conditions that the rotational speed of the turntable 2 is 240 rpm improves greatly to 1% or less.

As described in the foregoing, according to the substrate processing apparatus of the invention, in the middle of the film deposition process performed to the substrate in the film deposition device, the substrate is taken out from the film deposition device into the vacuum conveying chamber which is airtightly connected to the film deposition device. The substrate is caused to rotate around a vertical axis, the direction of the substrate is changed, and the heat-processing of the substrate is performed.

The non-uniformity of the gas flow in the surface of the substrate in the film deposition device is reduced, and as a result, the film deposition processing can be performed with excellent uniformity of the film thickness in the surface and good quality of the film. Because the silanol processing and the heat processing are performed in the middle of the film deposition process, the thin film with good quality (or good embedding characteristics to the recess and a low concentration of the impurities in the thin film) can be obtained.

The present invention is not limited to the above-described embodiments, and variations and modifications may be made without departing from the scope of the present invention.

What is claimed is:

1. A substrate processing apparatus which laminates layers of resultants of at least two kinds of mutually reactive gases and forms a thin film on a surface of a substrate by performing a gas supply cycle to supply sequentially the reactive gases to the surface of the substrate in a vacuum chamber, the substrate processing apparatus comprising:
 a film deposition device to perform a film deposition process of the substrate;
 a vacuum conveying chamber airtightly connected to the film deposition device;
 a conveying unit disposed in the vacuum conveying chamber to convey the substrate between the film deposition device and the vacuum conveying chamber;
 a heat processing device including a processing container airtightly connected to the vacuum conveying chamber and including a substrate mounting base provided therein and a unit to perform heat processing of the substrate on the mounting base;
 a substrate rotating unit arranged in the vacuum conveying chamber or the heat processing device to cause the substrate on the conveying unit to rotate around a vertical axis of the substrate and to rotate with respect to the conveying unit; and
 a control unit to output a control signal so that a film deposition process of the substrate is carried out,
the film deposition device comprising:
a table arranged in the vacuum chamber;
a plurality of reactive gas supplying units arranged to face an upper surface of the table and mutually separated in a circumferential direction of the table to supply the reactive gases to the surface of the substrate respectively;
a separating gas supplying unit to supply a separating gas;
an isolation area disposed between a plurality of processing areas to which the reactive gases are respectively supplied from the plurality of reactive gas supplying units, the separating gas being supplied from the separating gas supplying unit to the isolation area so that atmospheres of the plurality of processing areas are divided by the separating gas in the isolation area;
a rotation device that rotates to perform a relative rotation between the plurality of reactive gas supplying units and the separating gas supplying unit with respect to the table around a vertical axis of the table;
a substrate mounting area arranged in the table along a direction of rotation of the table so that the substrate located in the substrate mounting area is moved sequentially to the plurality of processing areas and the isolation area by the rotation of the rotation device; and
an evacuation unit to perform evacuation of the inside of the vacuum chamber,
wherein the control unit is configured to
stop the relative rotation by the rotation device in the middle of the film deposition process,
cause the conveying unit to take out the substrate from the vacuum chamber,
output a control signal that causes the substrate rotating unit to change a direction of the substrate with respect to the conveying unit, and
cause the conveying unit to convey the substrate, after the direction of the substrate has changed with respect to the conveying unit, to the film deposition device so that the film deposition process is continued for the substrate.

2. The substrate processing apparatus according to claim 1, wherein the substrate processing apparatus is arranged so that the substrate sequentially passes through the plurality of processing areas and the isolation area by rotation of the table,
the plurality of reactive gas supplying units comprise:
a first reactive gas supplying unit to supply a first reactive gas to the substrate so that the first reactive gas is adsorbed by the substrate;
an auxiliary gas supplying unit to supply to the substrate an auxiliary gas that reacts with the first reactive gas adsorbed by the substrate to generate an intermediate product having a flowability; and
a second reactive gas supplying unit to supply to the substrate a second reactive gas that reacts with the intermediate product to generate a resultant,
the first reactive gas supplying unit, the auxiliary gas supplying unit, and the second reactive gas supplying unit being sequentially disposed at downstream positions of a conveyance opening in a direction of rotation of the table, the conveyance opening being formed to deliver the substrate between the film deposition device and the vacuum conveying chamber, and
the heat processing device is arranged so that the resultant is closely packed by performing the heat processing of the substrate.

3. The substrate processing apparatus according to claim 2, further comprising a plasma supplying unit disposed between the second reactive gas supplying unit and the conveyance opening in the direction of rotation of the table to supply a plasma to the substrate on the table.

4. The substrate processing apparatus according to claim 2, further comprising a third reactive gas supplying unit disposed between the first reactive gas supplying unit and the conveyance opening to face the substrate on the table to supply a third reactive gas to the surface of the substrate, so that the third reactive gas is adsorbed by the surface of the substrate and at least one of boron and phosphorus in the third reactive gas is mixed with the resultant.

5. The substrate processing apparatus according to claim 1, wherein the isolation area includes a top surface disposed on both sides of the separating gas supplying unit in the direction of rotation of the rotation device to form a narrow space between the top surface and the table to allow the separating gas from the isolation area to flow into the processing areas through the narrow space.

6. The substrate processing apparatus according to claim 1, further comprising a central part area disposed at a central part of the vacuum chamber to divide the atmospheres of the plurality of the processing areas, the central part area including a discharge hole formed therein to discharge the separating gas from the discharge hole to the substrate mounting surface of the table,
wherein the reactive gases are discharged by the evacuation unit together with the separating gas diffused on both sides of the isolation area and the separating gas discharged from the central part area.

7. The substrate processing apparatus according to claim 1, wherein the control unit is configured to cause the conveying unit to, after taking out the substrate from the vacuum chamber and before conveying the substrate back to the film deposition device,
convey the substrate taken out from the film deposition device to the heat processing device so that the heat processing of the substrate is performed by the heat processing device, and
take out the substrate from the heat processing device after the heat processing of the substrate is performed by the heat processing device.

8. The substrate processing apparatus according to claim 1, wherein a plurality of the substrate mounting area are arranged along the direction of rotation of the table so that the substrates located in the substrate mounting areas, respectively, are moved sequentially to the plurality of processing areas and the isolation area by the rotation of the rotation device, and
wherein the control unit is configured to
cause the conveying unit to take out one of the substrates from the vacuum chamber of the film deposition device,
output the control signal that causes the respective substrate rotating unit to change a direction of the substrate with respect to the conveying unit, and
cause the conveying unit to convey the respective substrate, after the direction of the substrate has changed with respect to the conveying unit, to the film deposition device.

9. The substrate processing apparatus according to claim 8, wherein the control unit is configured to, after conveying the one of the substrates back to the film deposition device,
cause the conveying unit to take out another one of the substrates from the vacuum chamber of the film deposition device
output the control signal that causes the respective substrate rotating unit to change a direction of the substrate with respect to the conveying unit, and
cause the conveying unit to convey the respective substrate, after the direction of the substrate has changed with respect to the conveying unit, to the film deposition device, to repeat these operations for all of the substrates and continue the film deposition process for the substrates after the last one of the substrates is conveyed back to the film deposition device.

10. The substrate processing apparatus according to claim 1,
wherein the substrate rotating unit is arranged in the vacuum conveying chamber.

11. The substrate processing apparatus according to claim 10,
   wherein the control unit is configured to detect whether the thickness of the film becomes the predetermined thickness, before conveying the substrate back to the film deposition device.

12. The substrate processing apparatus according to claim 1,
   wherein the control unit is configured to repeat
      stopping the relative rotation by the rotation device in the middle of the film deposition process,
      causing the conveying unit to take out the substrate from the vacuum chamber,
      output the control signal that causes the substrate rotating unit to change a direction of the substrate with respect to the conveying unit, and
      causing the conveying unit to convey the substrate, after the direction of the substrate has changed with respect to the conveying unit, until the thickness of the film becomes a predetermined thickness.

13. The substrate processing apparatus according to claim 1,
   wherein the control unit is configured to output the control signal that causes the substrate rotating unit to change a direction of the substrate with respect to the conveying unit such that the substrate is caused to rotate by a predetermined degree.

14. The substrate processing apparatus according to claim 1,
   wherein the control is configured to, every time the thickness of the film increases T/N, where T is a predetermined thickness,
      stop the relative rotation by the rotation device in the middle of the film deposition process
      cause the conveying unit to take out the substrate from the vacuum chamber,
      output the control signal that causes the substrate rotating unit to change a direction of the substrate with respect to the conveying unit such that the substrate is caused to rotate by 1/N of 360 degrees, and
      cause the conveying unit to convey the substrate, after the direction of the substrate has changed with respect to the conveying unit, to the film deposition device, to repeat these operations for N times and form the film with the thickness T.

15. The substrate processing apparatus according to claim 1,
   wherein the control unit includes a storage unit storing instructions to control the substrate processing apparatus.

* * * * *